US007052941B2

(12) United States Patent
Lee

(10) Patent No.: US 7,052,941 B2
(45) Date of Patent: May 30, 2006

(54) METHOD FOR MAKING A THREE-DIMENSIONAL INTEGRATED CIRCUIT STRUCTURE

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 23 days.

(21) Appl. No.: 10/873,969

(22) Filed: Jun. 21, 2004

(65) Prior Publication Data
US 2004/0262635 A1     Dec. 30, 2004

(30) Foreign Application Priority Data
Jun. 24, 2003   (KR) ..................... 10-2003-0040920
Jul. 12, 2003    (KR) ..................... 10-2003-0047515

(51) Int. Cl.
H01L 21/84     (2006.01)

(52) U.S. Cl. ..................... 438/152; 438/153

(58) Field of Classification Search ............... 438/152, 438/153; 257/199, 118
See application file for complete search history.

(56) References Cited
U.S. PATENT DOCUMENTS
6,943,067 B1 *   9/2005   Greenlaw .................... 438/152

* cited by examiner

Primary Examiner—David Nelms
Assistant Examiner—Thinh T Nguyen
(74) Attorney, Agent, or Firm—Werner & Axenfeld, PC

(57) ABSTRACT

Vertically oriented semiconductor devices may be added to a separately fabricated substrate that includes electrical devices and/or interconnect. The plurality of vertically oriented semiconductor devices are physically separated from each other, and are not disposed within the same semiconductor body, or semiconductor substrate. The plurality of vertically oriented semiconductor devices may be added to the separately fabricated substrate as a thin layer including several doped semiconductor regions which, subsequent to attachment, are etched to produce individual doped stack structures. Alternatively, the plurality of vertically oriented semiconductor devices may be fabricated prior to attachment to the separately fabricated substrate. The doped stack structures may form the basis for diodes, capacitors, n-MOSFETs, p-MOSFETs, bipolar transistors, and floating gate transistors. Ferroelectric memory devices, Ferromagnetic memory devices, chalcogenide phase change devices, may be formed in a stackable add-on layer for use in conjunction with a separately fabricated substrate. Stackable add-on layers may include interconnect lines.

10 Claims, 59 Drawing Sheets

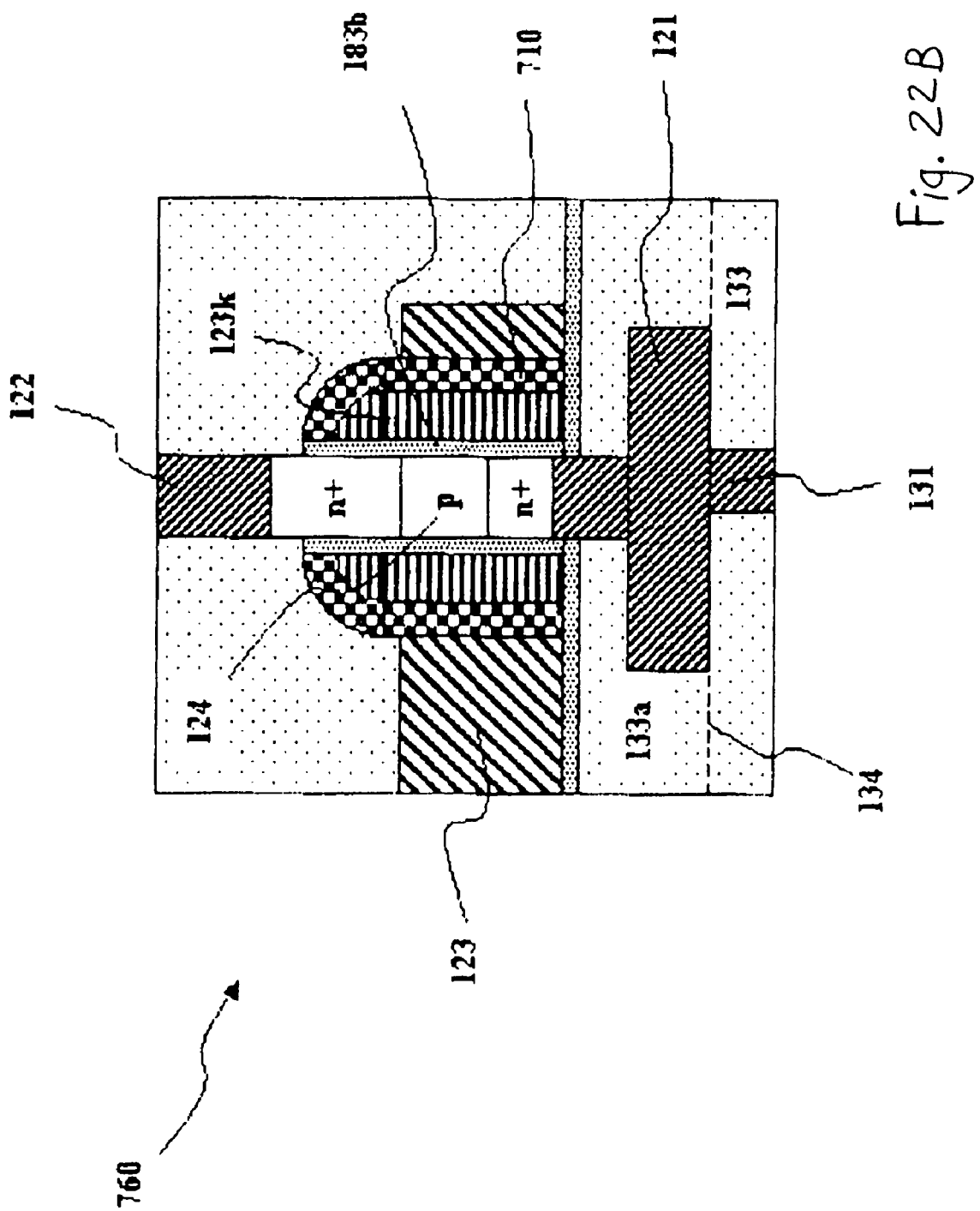

METHOD FOR MAKING A THREE-DIMENSIONAL INTEGRATED CIRCUIT STRUCTURE

FIELD OF THE INVENTION

The present invention relates generally to three dimensional integrated circuit (IC) structures and manufacturing methods therefore, and more particularly relates to combining a semiconductor substrate with a thin add-on semiconductor layer in which various active and/or passive devices have been fabricated.

As shown in FIG. 1, a prior art 3-D IC might be termed a 'Hybrid IC'. A conventional Hybrid IC implementation method typically includes; providing a first IC which consists of a base semiconductor substrate 201 and a dielectric layer 202; providing a second IC that also consists of a base semiconductor substrate 203 and a dielectric layer 204; stacking and bonding these ICs, or individual chips; and implementing a deep via 255 such as shown in U.S. Pat. No. 6,600,173 which penetrates the semiconductor substrate, or providing micro bumps as shown in U.S. Pat. No. 6,355,501.

Still referring to FIG. 1, it is noted that devices in the stacked semiconductor substrate 203 are usually connected by interconnection lines in dielectric layer 204, which is disposed above substrate 203. Similarly, interconnection lines in dielectric layer 202, which is disposed below stacked substrate 203 are used to connect devices in the base substrate 201. It can be seen that the devices in stacked substrate 203 do not have bottom electrodes, but rather have contacts from the top side.

Conventional implementations require wafer or chip alignment marks to be bonded. The wafer alignment marks are different from the alignment marks used in photo processing. Therefore, the 'hybrid IC technology' used in 3-D IC is considered to be another type of Multi-Chip Package (MCP). The main purpose of the 'hybrid IC technology' is to reduce interconnection lines used in package interconnections to facilitate high speed device operation.

Still referring to FIG. 1, prior art 3-D IC implementations are typically characterized as follows: each of the IC layers are implemented by separate processing; each IC is bonded and stacked to become a 3-D IC; each IC layer has a semiconductor substrate (e.g., 201, 203) respectively holding devices (e.g., 211, 212). Also in general the devices share an electrically common substrate 241, 242 or well 243. It is noted that although conventional implementations using SOI do not have an electrically common substrate, such implementations do have a physically common semiconductor substrate. Additionally, conventional implementations stacked ICs have dielectric layers, interconnection lines, and vias only above the devices in each stacked ICs.

In another conventional approach, a single crystalline semiconductor layer is formed by melting polycrystalline or amorphous semiconductor layer disposed on a dielectric layer using, for example, a laser. Devices are then formed using the single crystalline semiconductor layer, which was formed from the polycrystalline or amorphous layer. In still another conventional approach, a single crystalline epitaxial layer is grown on a dielectric layer where the dielectric layer has partially exposed holes therethrough to an underlying single crystalline layer.

However, both the laser recrystallization and the epitaxial processes described above are have drawbacks, such as requiring high temperature operations, which are incompatible with the low temperature processing required for many semiconductor devices; and further, single crystalline semiconductor layers formed in this way may have many defects, and therefore these methods are not widely used.

SUMMARY OF THE INVENTION

Briefly, a plurality of vertically oriented semiconductor devices may be added to a separately fabricated substrate that includes electrical devices and or interconnect. The plurality of vertically oriented semiconductor devices are physically separated from each other, and therefore are not disposed within the same semiconductor body, or semiconductor substrate.

In one aspect of the present invention, the plurality of vertically oriented semiconductor devices is added to the separately fabricated substrate as a thin layer including several doped semiconductor regions which, subsequent to attachment to the substrate, are etched to produce individual doped stack structures. In other embodiments of the present invention, the plurality of vertically oriented semiconductor devices may be fabricated prior to attachment to the separately fabricated substrate.

In another aspect of the present invention, the doped stack structures may form the basis of a wide variety of semiconductor devices, including, but not limited to, diodes, capacitors, n-type MOSFETs, p-type MOSFETs, bipolar transistors, and floating gate transistors.

In another aspect of the present invention, ferroelectric memory devices, ferromagnetic memory devices, chalcogenide phase change devices, and similar structures may be formed in a stackable add-on layer for use in conjunction with the separately fabricated substrate In still further aspects of the present invention, the stackable add-on layers include at least one layer of electrical interconnect lines.

BRIEF DESCRIPTION OF THE DRAWINGS

FIG. 20b illustrates an exemplary memory circuit formed with devices illustrated in FIG. 20a.

FIG. 20c illustrates another exemplary memory circuit formed with devices illustrated in FIG. 20a.

FIG. 21a is a cross-sectional view of an embodiment of the present invention having a vertical NVM cell that includes the structure illustrated in FIG. 20a.

FIG. 21b illustrates an exemplary memory circuit formed from structures shown in FIG. 21a.

FIG. 22b is a cross-sectional view of an embodiment of the present invention that includes a vertical NVM cell with a MOSFET in the SOI layer and uses a ferroelectric material between the floating gate and the control gate.

FIG. 27a is a cross-sectional view of an embodiment of the present invention that includes a vertically oriented NVM cell having a MOSFET connected in series with a floating gate transistor such as the one shown in FIG. 18a.

FIG. 27b is a schematic diagram of an equivalent circuit for the structure shown in FIG. 27a.

DETAILED DESCRIPTION

Figure 2:
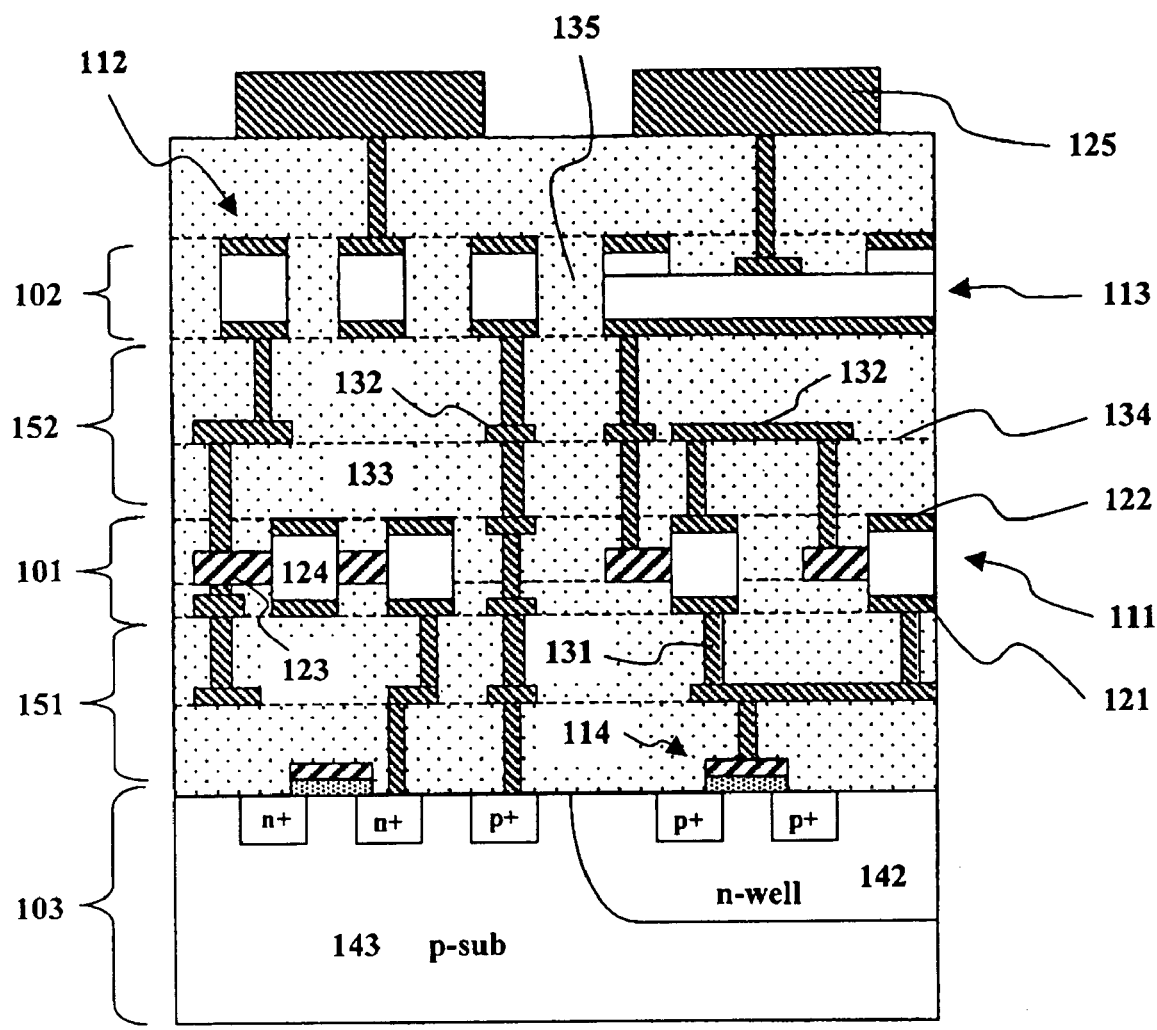
FIG. 2 is a cross-sectional view of an embodiment the present invention that includes a base semiconductor substrate.

A 3-D IC in accordance with the present invention is shown in FIG. 2. Embodiments of the present invention provide a device integration technology.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

"ASIC" refers to Application Specific Integrated Circuit. "SoC" refers to a System on a Chip, with "SoCs" being the plural of SoC. A SoC may be an ASIC but is not required to be. An ASIC may be a SoC but is not required to be.

The expression "back bias", as used herein, refers to a voltage applied to the substrate, or body, of a field effect transistor (FET). Back bias is alternatively referred to as substrate bias, or reverse bias.

The expression "conductivity type" is well known in the semiconductor manufacturing field. Conductivity types are generally referred to as n-type and p-type. Semiconductor regions that are doped with donor type impurities form n-type regions. Semiconductor regions that are doped with acceptor type impurities form p-type regions.

The terms chip, semiconductor device, integrated circuit, LSI device, monolithic integrated circuit, ASIC, SoC, microelectronic device, and similar expressions are sometimes used interchangeably in this field. Microelectronic device may be considered to be the broadest term, encompassing the others. With respect to these microelectronic devices, signals are typically coupled between them and other circuit elements via physical, electrically conductive connections. The point of connection is sometimes referred to as an input, output, terminal, line, pin, pad, port, interface, or similar variants and combinations.

The term "device", as used herein, refers to one or more circuit elements that have characteristics that are voltage variant. "Device" includes, but is not limited to, FETs (n-channel and p-channel), diodes, and varactors.

The expression "vertically oriented device" refers to devices having an orientation with respect to a base substrate such that current through those devices is substantially perpendicular to the base substrate.

FET as used herein, refers to metal-oxide-semiconductor field effect transistors (MOSFETs). These transistors are also known as insulated gate field effect transistors (IGFETs). FETs are generally described as three terminal devices having a gate, a source and a drain. Although FETs may be further described as four terminal devices when the body of the FET is considered.

Source and drain terminals refer to the terminals of a FET, between which conduction occurs under the influence of an electric field, subsequent to the inversion of the semiconductor surface under the influence of an electric field resulting from a voltage applied to the gate terminal.

The acronym "SOI" generally refers to Silicon-on-Insulator. As will be appreciated by those skilled in this field, SOI layers can be formed in a variety of ways. Unless otherwise noted, "SOI layer" is used herein to refer to a relatively thin, single crystal portion of a semiconductor wafer that can be cleaved and bonded to another previously fabricated wafer, or similar type of substrate, such that a three dimensional stack is formed from the SOI layer and the previously fabricated wafer or similar type of substrate. In this context, the SOI layer may be thought of as an attachment layer, or stackable add-on structure, that itself contains at least devices and/or interconnections, and which is suitable for bonding to a semiconductor substrate already containing devices and/or interconnections. As a stackable add-on layer, the single-crystal layer may have been doped so as to have one or more doped regions vertically adjacent each other. For purposes of this disclosure, doped regions may include intrinsic regions as well as p-type and n-type regions. Individual semiconductor structures may be formed by etching through portions of the doped stack to electrically isolate those structures. The spaces between such individual structures may be filled dielectric material so as to re-form a layer without gaps or voids therein, and thereby provide for mechanical stability, and support for additional stacked layers.

The expression "3-D IC", as used herein, refers to a three-dimensional integrated circuit that includes a semiconductor substrate having devices and/or interconnect structures fabricated thereon, and least one SOI layer, also having devices and/or interconnect, where the semiconductor substrate and the SOI layer are stacked and bonded to each other.

The disclosures of U.S. Pat. No. 6,600,173, U.S. Pat. No. 5,563,084, and U.S. Pat. No. 6,355,501, show the formation of 3-D ICs as a packing technology that includes stacking individually working ICs. However, embodiments of the present invention do not use individually working ICs, but rather, as shown in FIG. 2, provide device integration technology using bonded SOI technology and a thin single crystalline semiconductor layer 124 without device formation before layer transfer. Because single crystalline semiconductor layer 124 is formed by SOI technology, it is referred to herein simply as an SOI.

Figure 3:
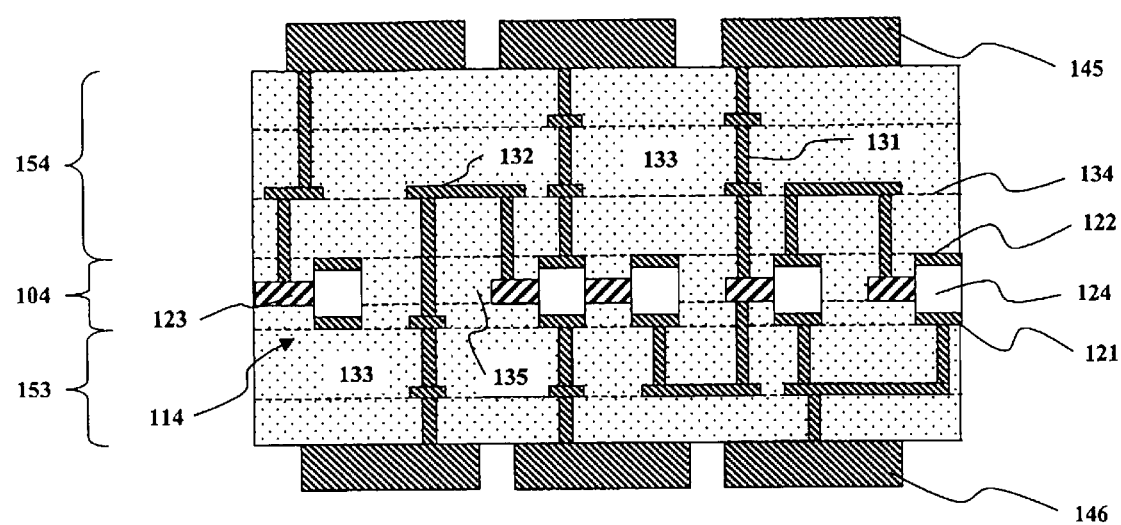
FIG. 3 is a cross-sectional view of an embodiment of the present invention without a base semiconductor substrate.

The meaning of thin film including semiconductor layer 104 in FIG. 3 is thin film single crystalline semiconductor layer including diffusion layer such as p-type, n-type, or i(intrinsic)-type, and physically distinguishable layers, such as dielectric layer or metal layer. Also the meaning of 'non-multiple-device formed' semiconductor layer 124 of FIG. 4*b* is that SOI thin layer 124 does not have isolation structures, metal patterns, interconnection used for multiple devices, nor separated impurity regions used for individual devices.

As shown in FIG. 2, devices 111, 112, 113 in accordance with the present invention are separated by isolation 135 and have floating structures in the filled dielectric materials 133. As used herein, devices 111, 112, 113 are referred to as floating devices (FLD). Such floating devices may alternatively be referred to as doped stack structures, or vertically oriented semiconductor devices.

Embodiments of the present invention are different from a conventional bonded IC layer that has a shared well 142 or substrate 143, where an electrically common region is located. Additionally, embodiments of the present invention do not have the physically supporting layer which can be found in a conventional SOI IC substrate where all devices in one IC layer are supported by a substrate under a bottom oxide. In an illustrative embodiment of the present invention, a second IC layer that includes FLD 112, 113 is called FLD IC layer 102, and a first IC layer that includes FLD 113 is called FLD IC layer 101. Inter-layer dielectric (ILD) layers disposed above and below FLD IC layer 101 has interconnection lines 132 and vias, or contacts, 131. Interconnection lines 132 and vias 131 connect FLDs directly or indirectly within an FLD IC layer, or connect devices from a FLD IC layer to another FLD IC layer or to a base substrate 103.

As shown in FIG. 2, the substrate bonded to lower dielectric layer 151 is called base substrate 103, the first FLD IC layer above base substrate 103 is called first FLD layer 101, and the next FLD IC layer is called second FLD IC layer 102.

FIG. 2 shows multiple FLD IC layers 101,102 and one base semiconductor substrate 103. Dashed line 134 denotes a border, or interface, of two ILD layers. First ILD layer 151 has interconnection lines and vias, and base semiconductor substrate 103 shares these interconnections and vias with first FLD IC layer 101. Some vias may directly connect to second FLD IC layer 102 from first ILD layer 151. Also interconnection lines and vias in second ILD layer 152 are shared by first and second FLD IC layers 101, 102. This sharing scheme of interconnection lines and vias is an advantage of embodiments of the present invention.

Still referring to FIG. 2, the formation of electrodes to floating devices 111, 112, 113 is by direct connection to the top and bottom of each floating device 111, 112, 113. Also, in various embodiments of the present invention, floating devices may be constructed that have vertically separated single or more intermediate electrodes 123. These electrodes could be connected to interconnection lines within the ILD layers disposed on the top and/or bottom of the FLD layer.

In FIG. 2, if a logic IC is implemented in base semiconductor substrate 103, memory devices are implemented in first FLD IC layer 101, and image sensors are in second FLD IC layer 102, then one semiconductor substrate could integrate different types of individually optimized devices without using a difficult and expensive SoC structure or semiconductor processing.

FIG. 3 shows a 3-D IC structure having FLD IC layer without an attached base substrate. In one method of obtaining the structure of FIG. 3, first, ILD layer 153 is placed on the top of base substrate, and then SOI layer 124 is formed on the ILD layer 153, and then devices are implemented using SOI layer 124, and then another ILD layer 154 including interconnection lines 132 and vias 131 is placed on top of the single crystalline semiconductor devices 104, and then the base substrate is detached from ILD layer 153. The base substrate (not shown) could be a flat substrate with even surface, such as plastic, ceramic, glass, metal, or semiconductor materials. The base substrate should be able to withstand processing temperatures in the range of 250° C.~650° C., which range is considered to be a "non-high temperature semiconductor processing temperature".

Still referring to the FIG. 3, embodiments of the present invention may have pads which are connected to a package (not shown) disposed at the bottom of first ILD layer 153 and/or at the top of second ILD layer 154. Bottom pads 146 could be connected to a package using, for example, solder. Top pads 145 could be connected to a package using, for example, wires. Such pad structures in accordance with the present invention reduce die area and the density of a package.

Various embodiments of the present invention do not require a physically supporting substrate for floating devices. Also, without a base substrate, various embodiments could exist along with interconnection lines, vias, and FLDs only.

Various embodiments of the present invention provide floating devices that are separated by dielectric isolation regions. These electrically separated structures do not have the parasitic devices which are typically found in prior art approaches.

Various embodiments of the present invention provide floating devices that may be connected directly or indirectly.

In various embodiments of the present invention, combining the SOI layer with a semiconductor substrate does require the same type of wafer alignment structures as are used in photolithographic processes, rather, the wafer alignment structure may be implemented as a wafer alignment mark, or as a bump-type alignment structure. Alternatively, without a wafer alignment structure, the SOI layer could be transferred along with a simple notch alignment because the transferred SOI layer does not have structures for multiple devices, such as isolation structure or interconnection lines, which are horizontally divided. The transferred SOI layer has only vertically divided several layers.

Various embodiments of the present invention provide for interconnection of floating device both above and below the FLD.

Conventional technology typically uses horizontally oriented MOSFETs. In the case of conventional vertical MOSFETs, implementation of contacts and interconnection is difficult, and processes are incompatible between vertical and horizontal MOSFETs. However, embodiments of the present invention can easily implement vertical devices, including MOSFETs, and compared to conventional approaches, it is easy to implement interconnections and contacts with low contact resistance.

In order to implement logic devices in a conventional manner, individual devices need to be connected. However, in some embodiments of the present invention, FLD logic can be formed using vertically connected individual devices without interconnection lines because embodiments of the present invention include a form of SOI device, and a well is not needed.

In various embodiments of the present invention, a FLD can have directly contacted metal electrodes at top, bottom, and intermediate regions. The area of metal electrodes can be the same as the top and bottom size of single crystalline semiconductor of FLD, which is formed by isolation etching. Therefore, voltage drop of the device could be reduced.

Figure 4A:
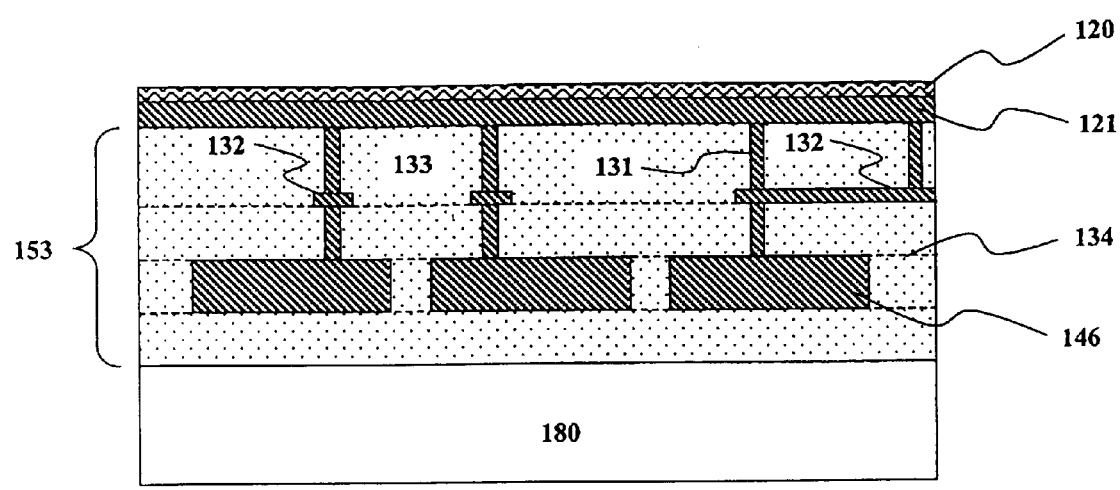
FIGS. 4a–4d illustrate a process flow which forms a 3-D IC structure using SOI layer in accordance with the present invention.
Figure 4B:
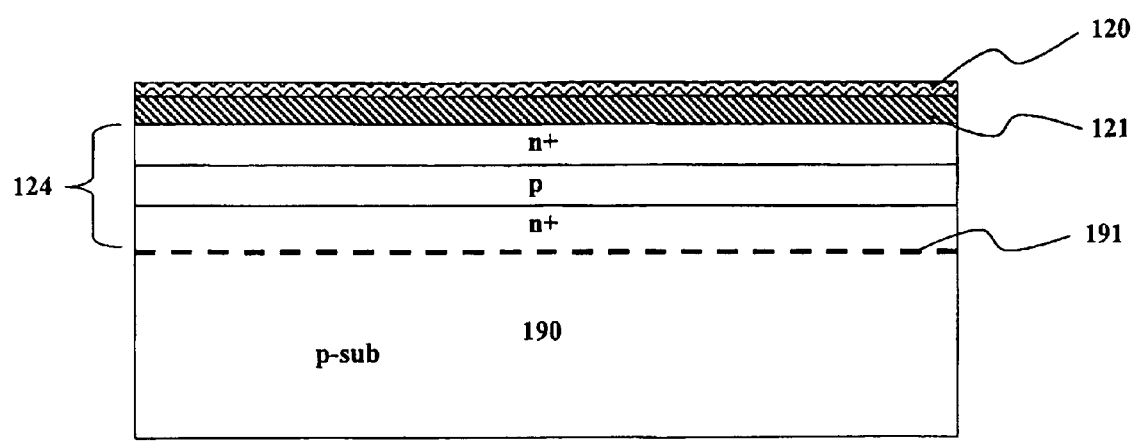

FIGS. 4*a*–*d* explain a process flow for making a 3-D IC such as the one shown in FIG. 3. In FIG. 4*a*, after formation of a mask alignment mark (not shown) on substrate 180, single or multiple ILD layers 133 are formed in dielectric layer 153, and interconnection lines 132 and vias 131 which are conducting materials are formed. At here, borderline of each ILD layer 133, which comprise dielectric layer 153, are shown as dashed lines 134. Base substrate 180 should withstand semiconductor processing temperatures in the range of 250° C.~650° C. The conductors are formed of low electrical resistance material which conducts voltage/current and could be metals such as aluminum and copper, refractory metal, silicide, or low resistance polycrystalline/amorphous semiconductor materials with heavy doping. Once vias 131 connected to FLD directly or indirectly are formed in dielectric layer 153, metal layer which is to be used as bottom electrode 121 of FLD is deposited and, if necessary, another metal layer which is an intermediate bonding layer 120 could be implemented. The metal used for intermediate bonding layer 120 typically has a lower meting point than the metal layer on dielectric layer 153. Metal 120 is required to have desirable reflow properties at low temperature for surface planarization in order to prevent voids due to surface microroughness at SOI substrate 190 bonding process. If interconnection lines 132 in dielectric layer 153 are aluminum, the metal of intermediate bonding layer 120 needs to have melting point in the range of 250° C.~650° C., which is below the melting point of aluminum, 660° C. Here is the list and melting points of metals which could be intermediate bonding layer; aluminum alloy 204° C.~674° C., zinc 420° C., zinc alloy 377° C.~484° C., lead 328° C., thallium 304° C., tellurium 445° C., solder 268° C.~579° C., and tin alloy 223° C.~422° C.).

FIG. 4b shows an SOI substrate 190. To implement FLD, doped layers are formed in single crystal semiconductor layer 124, where the doped layers may be formed by any suitable method including, but not limited to, ion implantation, or impurity mixing during epitaxial layer growth for single crystalline semiconductor layer 124 formation. Metal layer 121 is formed on single crystalline semiconductor layer 124, and intermediate bonding layer 120 is formed on metal layer 121. In typical embodiments of the present invention, metal layer 121 and bonding layer 120 are formed as blanket layers that are formed over the whole surface. SOI substrate 190 is a single crystal semiconductor substrate, and a material for FLD single crystal semiconductor layer 124. SOI substrate 190 could be single source semiconductors, such as silicon and germanium, or compound semiconductors, such as SiGe, GaAs, GaP, and InP. Also SOI substrate 190 could be combination of single source semiconductors and compound semiconductors. Before bonding, it is better for the SOI substrate to have an intermediate bonding layer which has high reflow rate with a low temperature melting point in order to remove surface roughness.

SOI substrate 190 may have a detach layer 191, which may be a porous or strained layer at a certain desired depth using, for example, SmartCut (U.S. Pat. No. 5,882,987), ELTRAN (U.S. Pat. No. 5,371,037), or SiGen technologies. Detach layer 191 is a defective region in the semiconductor lattice and, after bonding with dielectric layer 153, SOI substrate 190 will be removed except for single crystal layer 124 which forms the FLD.

Figure 4C:
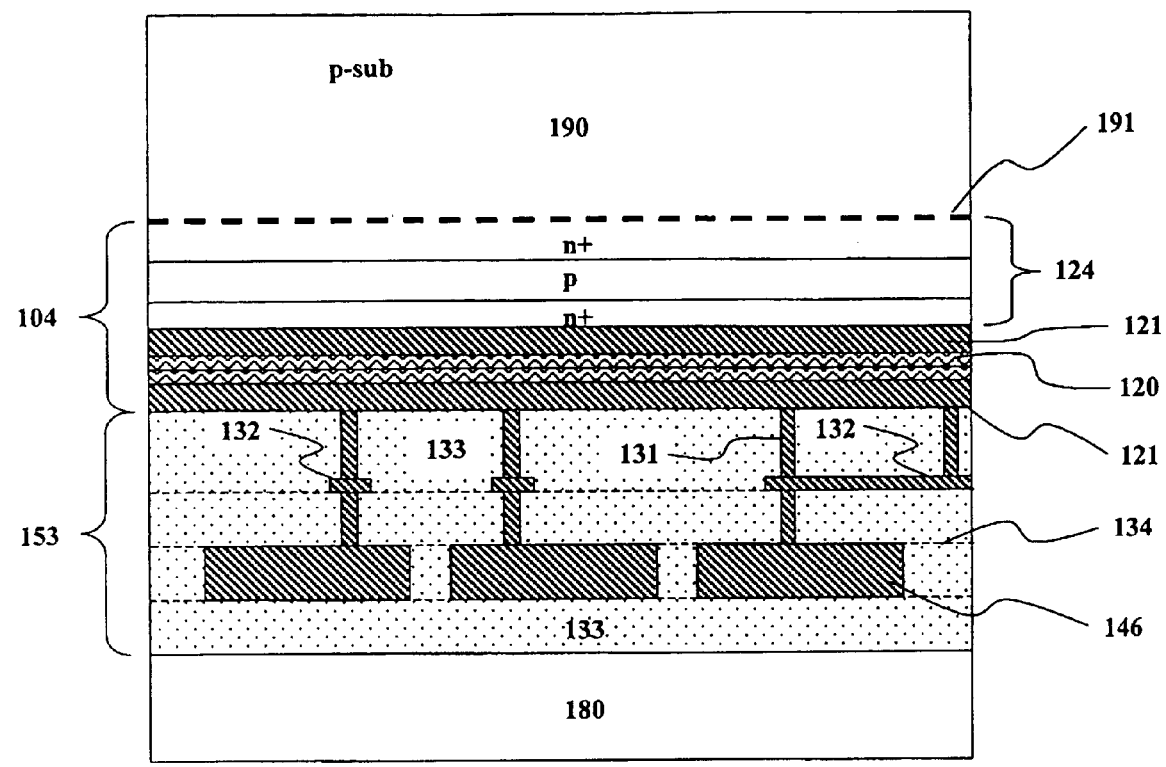

FIG. 4c is a cross sectional view of the bonding of dielectric layer 153 of FIG. 4a and SOI substrate of FIG. 4b. SOI substrate 190 shown in FIG. 4b is upside-down and bonded on dielectric layer 153 in FIG. 4a. During the bonding process, pressure is applied with heat treatment in order to increase bonding strength and remove voids between bonding interfaces. Alternatively, eutectic bonding with gold, or thermocompression bonding with a soft metal thin film could be used as the intermediate layer bonding process. Metal layer 121 including intermediate bonding layer 120 used in bonding process may be used as the bottom electrode of the FLD.

Figure 4D:
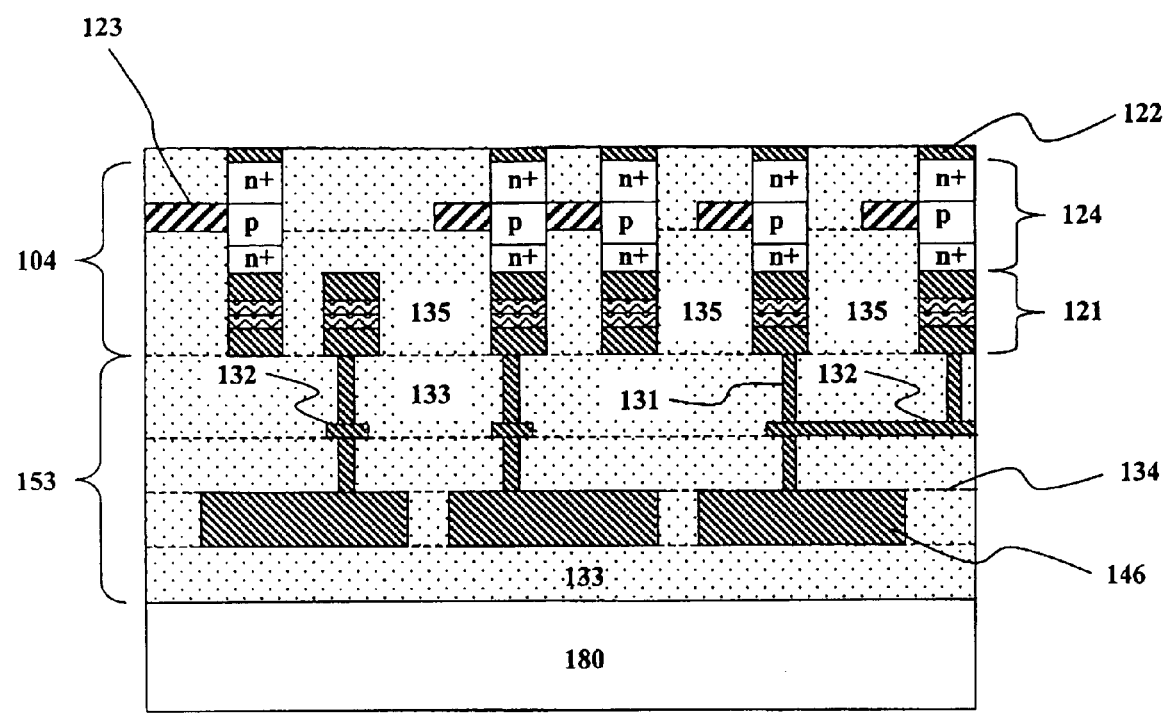

Referring to FIG. 4d, SOI substrate 190 has been detached after leaving SOI layer 124, where FLD is implemented, on dielectric layer 153, and then isolation structures 135 are implemented over all or part of the FLD layer. SOI substrate 190 is detached using detach layer 191 and a wafer jet may be used for SOI substrate detachment. Without detach layer 191, using a Bond and Etch-Back method (U.S. Pat. No. 5,013,681), leaving SOI layer 124, where the floating devices are implemented. This SOI layer 124 may also be referred to as a stackable add-on layer. SOI substrate 190 can be removed by etching or polishing. Also, using a handling substrate, SOI substrate 190 is bonded with the handling substrate, SOI substrate 190 is detached from the handling substrate and leaving SOI layer 124, and then the SOI layer could be transferred to dielectric layer from the handling substrate. The handling substrate could be the same kind of substrate used for the base substrate. Also, the handling substrate may use vacuum to hold the single crystalline semiconductor layer temporarily from the SOI substrate, and then transferring the SOI layer to dielectric layer could be easily done by releasing vacuum. The vacuum surface better has thick dielectric layer which protects SOI layer. The role of the handling substrate is to transfer an SOI layer from the SOI substrate to the dielectric layer without damage. Also, as explained in U.S. Pat. No. 6,355,501, the SOI substrate and the handling substrate could be bonded using polyamide. Once the SOI substrate has been detached, Chemical-Mechanical Polishing (CMP) could be used to reduce surface roughness of the transferred SOI layer.

Once single crystalline semiconductor layer (i.e., SOI layer) has been transferred, isolation is implemented to make individual floating devices. For isolation formation, trench technology is used. Also at this time, SOI layer on top of scribeline is to be removed because this will facilitate subsequent die saw operations. Bottom electrode 121 of FLD is automatically implemented during the trench isolation process. A method of forming bottom electrode 121 is explained below in conjunction with FIGS. 7a–7c. Once the SOI layer has been transferred, a mask alignment mark is exposed on base substrate 180 by removing SOI layer over the mask alignment mark, and then, using the exposed mask alignment mark, the FLD pattern on mask and via 131 pattern on dielectric layer can be aligned. Vertical FLD, where current flows in a vertical direction, may have intermediate electrode. Interconnection lines and contacts which connect with top electrode and interconnection lines which may be formed by conventional semiconductor process methods.

Using the method set forth above, multiple FLDs can be stacked and, therefore, IC density can be increased. Various embodiments of the invention, therefore, do not need wafer or chip alignment marks, or micro bumps for wafer alignment when bonding SOI substrate having single crystalline semiconductor layer and dielectric layer having interconnection lines and vias. Various embodiments of the invention can be implemented by mask alignment mark used in conventional photo process. The isolation structure is to be filled by dielectric material and intermediate electrode materials. Formation method of the dielectric and intermediate electrode in the isolation structure is explained in FIGS. 8a–8d. After the process of FIGS. 4a–4d, according to conventional semiconductor process, ILD, interconnection lines, and vias are implemented and the base substrate is detached, then it becomes the structure shown in FIG. 3.

Figure 5A:
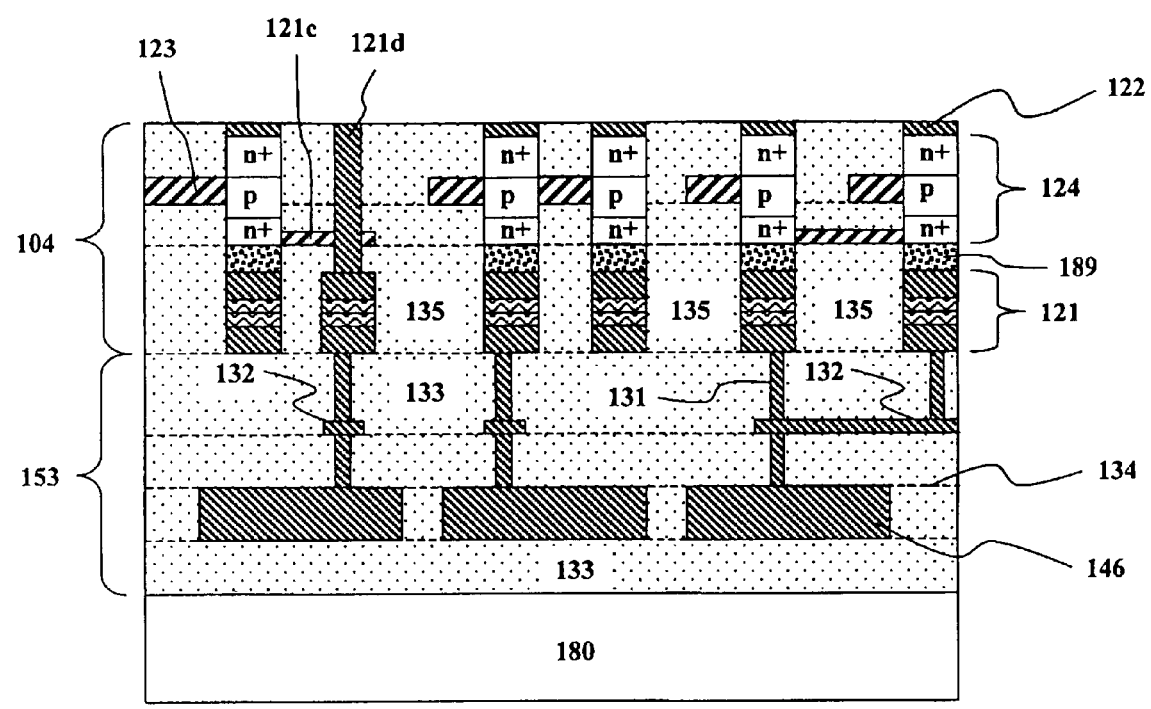
FIG. 5a is a cross-sectional view of an embodiment of the present invention wherein the bottom of SOI layer does not have directly connected electrodes.

In FIG. 4, n+ layer on the top of SOI substrate 190 is directly connected to metal layer 121. However, as can be seen in FIG. 5a, another dielectric 189 could be formed in between the top of SOI substrate 190 and metal layer 121, and then transferred to dielectric layer 153. In this case, bottom electrode 121 could be used for a gate electrode having gate dielectric 189. Or, another bottom electrode 121c could be used to connect the bottom electrode of the FLD.

Figure 5B:
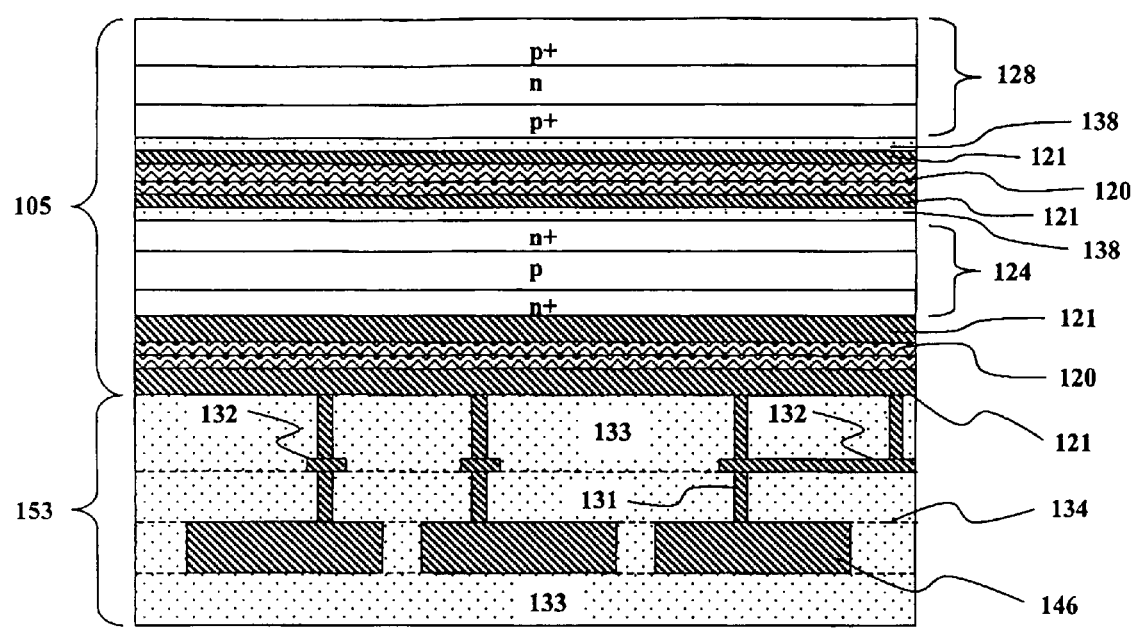
FIG. 5b is a cross-sectional view of an embodiment of the present invention that includes multiple stacked SOI layers.

An FLD IC layer could have one or more SOI layers. The FLD IC layer shown in FIGS. 3 and 5 have a single SOI layer. FIG. 5b shows multiple SOI layers 124, 128 consisting one FLD IC layer 105. FLD IC layer 105 shows the structure before formation of FLD. As shown in FIG. 5b, there are no vias in between SOI layer 124 and SOI layer 128. If vias exist between multiple SOI layers, as shown in FIG. 2, one FLD IC layer 101 and the other FLD IC layer 102 are separated and distinguishable. Multiple SOI layers are implemented by adding another SOI layer 128 on already transferred SOI layer 124 sequentially. Multiple SOI layers 124, 128 shown in FIG. 5b have dielectric layer 138 which electrically separates the multiple SOI layers 124, 128. Therefore, multiple SOI layers 124, 128 could have different types of devices which are electrically separated at each SOI layer. For example, one SOI layer could have p-type MOSFET, and the other SOI layer may become memory devices.

FLD could be conventional semiconductor devices. MOSFETs, bipolar transistors, diodes, capacitors, and resistors, images sensors (e.g., Charge-Coupled Devices (CCD) or Active Pixel Sensor (APS)), or MicroElectroMechanical System (MEMS). FLD could be a form of circular pillar (see FIG. 13a), rectangular pillar (see FIG. 13b), or multi-angle pillar, or cylindrical pillar. If the width of FLD is getting narrow, aspect ratio of the pillar structure increases and could topple or be detached from the bonded dielectric layer. To prevent these phenomenon, FLD could be a trapezoidal format with narrow top width and wide bottom width.

FLDs can be divided into High Temperature (HT) and Low Temperature (LT) devices depending on the temperature used in the manufacturing processing. Similarly, depending on the direction of device operation, FLDs can be divided into Vertical (V) and Horizontal (H) devices, where 'V' and 'H' mean the 'Vertical' and 'Horizontal' directions of major device current flow.

FLD process temperature could be divided into high temperature which is above 800° C. and low temperature which is below 650° C. In this disclosure, we call the devices produced with a high temperature process HT-FLD, and call the devices produced with a low temperature process LT-FLD, or simply FLD, because a benefit in accordance with the present invention is the implementation of a 3-D IC at low process temperatures. HT-FLD can be treated at high temperature for thermal activation of implanted ions and could be vertical or horizontal devices. To implement HT-FLD, the interconnection lines 132 and vias 131 in dielectric layer 153 shown in FIG. 4 should be copper or refractory metals, such as tantalum, molybdenum, or tungsten. Also the base substrate used in HT-FLD should withstand at more than 800° C.

LT-FLD or FLD do not need ion implantation, heat treatment, and photo process for ion implantation because the impurity layer required for device operation has been formed in SOI substrate before the transfer to dielectric layer. If high temperature is required during the FLD process, characteristics of the devices existing on other layer could be altered. Device process control along early prediction of the alteration is very difficult. Therefore, embodiments of the invention could be implemented on top of base semiconductor substrate having devices without process change. An advantage of the present invention is that a low cost process is obtained because ion implantation and photo process are not required. Also, because various embodiments of the invention do not require a high temperature process, refractory metal, aluminum, and aluminum which has low melting point and is widely used in semiconductor could be used. Also LT-FLD could use metal gate and high-k dielectric materials more easily than conventional manufacturing processes.

Figure 6A:
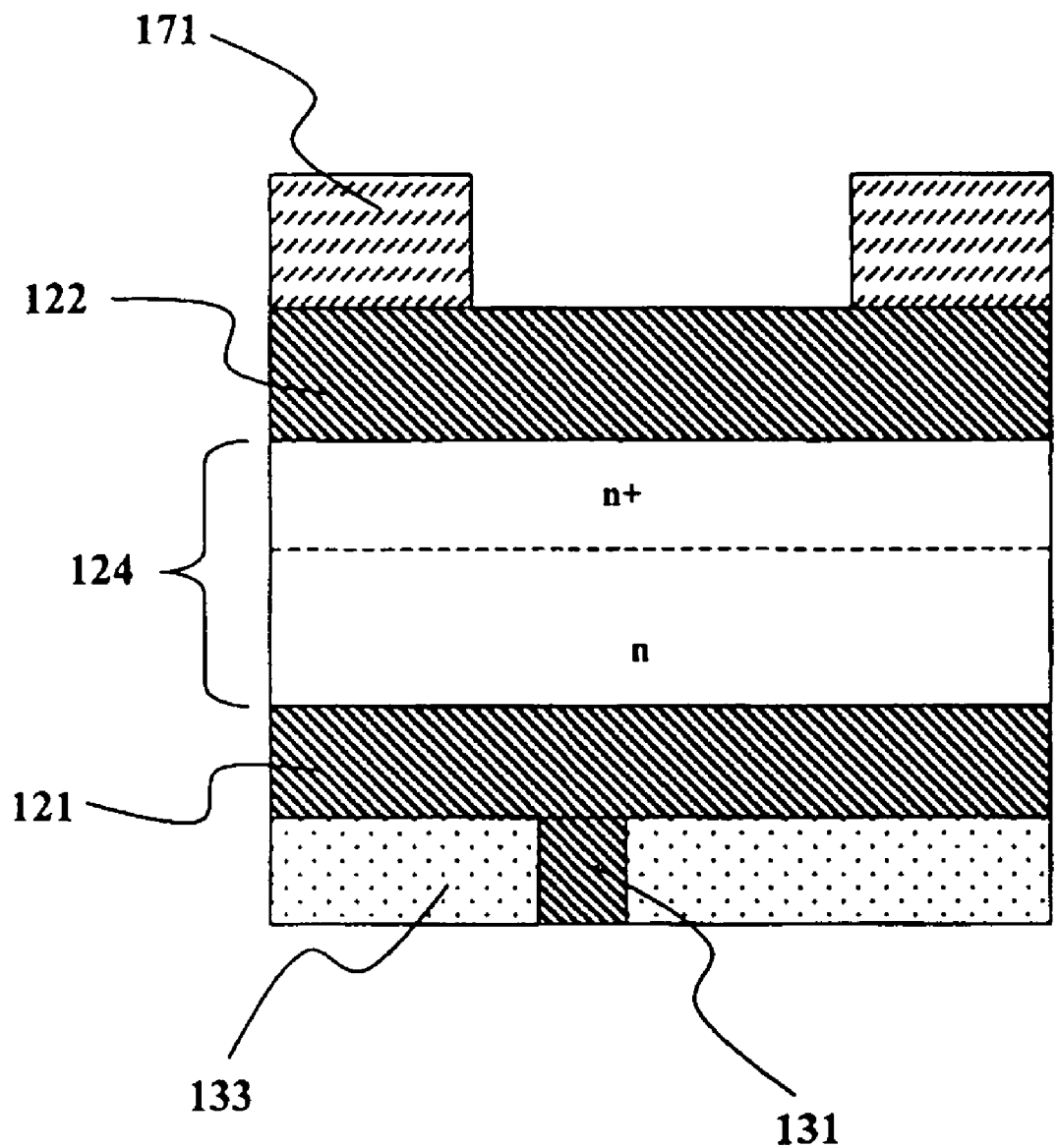
FIGS. 6a–6b are cross-sectional views of an embodiment of the present invention which has horizontally oriented, rather than vertically oriented, devices incorporated in the SOI layer.
Figure 6B:
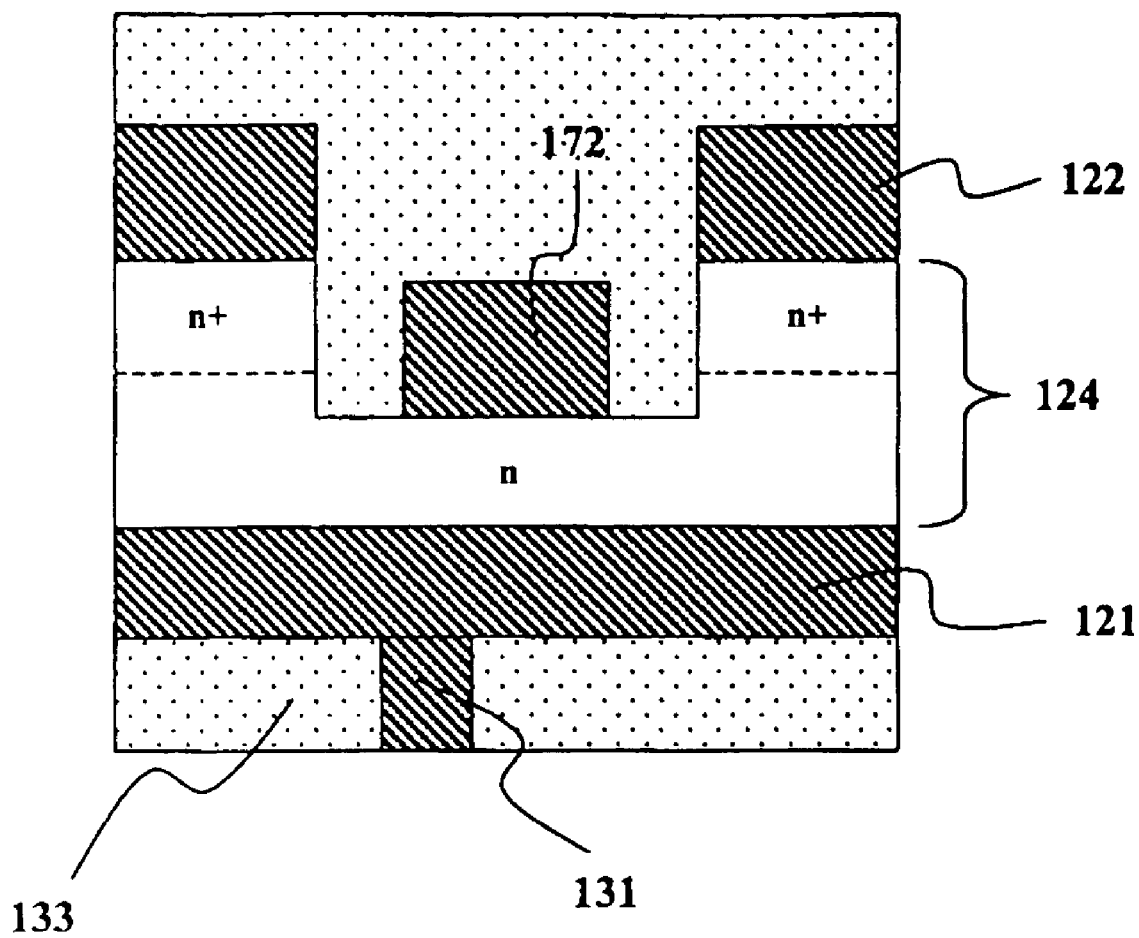

A typical form of LT-FLD is VFLD (Vertical FLD) because vertical impurity junctions are formed in SOI substrate already and it is easy to implement a bottom electrode. However, at low temperature, HFLD (Horizontal FLD) can be implemented without ion implantation. HFLD could be a form of MESFET, MOSFET, diode, or horizontal bipolar transistor. As shown in FIG. 6a, once part of SOI layer has been etched using PR (Photoresist) or hard mask 171, then FIG. 6 is formed. FIG. 6b shows MESFET-type HFLD with metal gate forming Schottky diode. Or bottom electrode 121 could be used as a gate electrode. FIG. 6b is a FLD 113 in FIG. 2. If gate 172 has dielectric layer underneath it, the FLD becomes a MOSFET. If gate 172 in FIG. 6b has an ohmic contact and the n-type region is switched to p-type region, then it becomes a horizontal bipolar transistor. From the horizontal bipolar transistor, if the n+ region is anode and p-type region is cathode, then it becomes a horizontal diode. Also without gate, the FLD could be a resistor using only the n-type region.

VFLD (or LT-VFLD) could be a form of MESFET, MOSFET, diode, capacitor, resistor, bipolar, thyristor, or, instead of single device, could be a form of vertical connections of different types of FLD devices to implement circuitry. Combining optimized horizontal devices in the base semiconductor substrate and optimized VFLD, SoC could be optimized in performance and in price.

Figure 1:
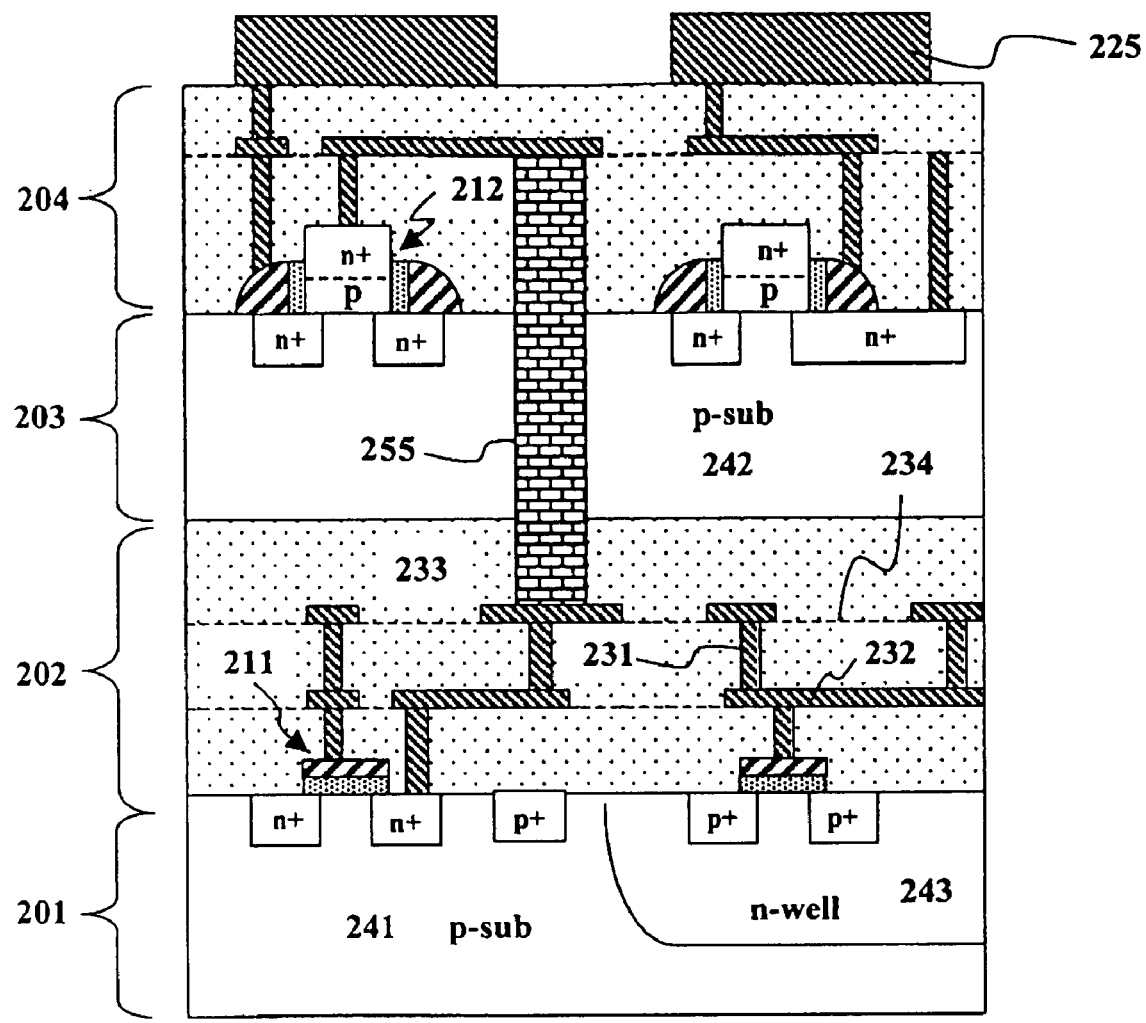
FIG. 1 is a cross-sectional view of a stacked integrated circuit, referred to as a three-dimensional integrated circuit, in accordance with the prior art.

Unlike vertical device 212 at prior art shown in FIG. 1, it is easy to implement electrodes, contacts, and formation and connection of interconnection lines in VFLD. In this disclosure, 'electrode' means electrical part which is directly connected to devices or a gate with gate dialectic material. 'Contact' means connection part between electrode and interconnection line, which is usually a form of vertical shape. The vertical devices in U.S. Pat. No. 5,414,288, U.S. Pat. No. 6,027,975, U.S. Pat. No. 6,337,247, and U.S. Pat. No. 6,449,186 should have horizontally extended doping region which is used for source/drain and providing space for contact formation. Therefore, in prior arts, the extended source/drain region increases resistance and parasitic capacitors. As shown in FIG. 2, the electrodes are formed at top 122 and bottom 121 of FLD 111. In case of VFLD, intermediate electrode 123 could be connected to interconnection lines at the top or bottom of the FLD. Further, the intermediate electrode could be used for local interconnection. This very flexible interconnection scheme for a 3-D IC is not possible in conventional approaches to forming 3-D ICs.

The bottom of FLD is connected to metal layer 121 which is also directly connected to vias 131 in the ILD layer 151. Therefore, bottom of FLD already has pre-formed electrode and contact. To connect bottom electrode 121 of FLD 111 and via 131 in the dielectric layer 151, they need to be aligned. The alignment scheme used in this technology is to be done by conventional photo alignment mark (not shown). However, the photo process has misalignment margin and bottom electrode 121 and via 131 should be aligned within the alignment margin. In general, in order to connect interconnection lines at different level of ILD layers through via 131, as shown in FIG. 2, the width of interconnection lines are needed to be wider than the size of via 131. Photo process with photo mask and etch process are needed for formation of interconnection lines 132 and vias 131.

Figure 7A:
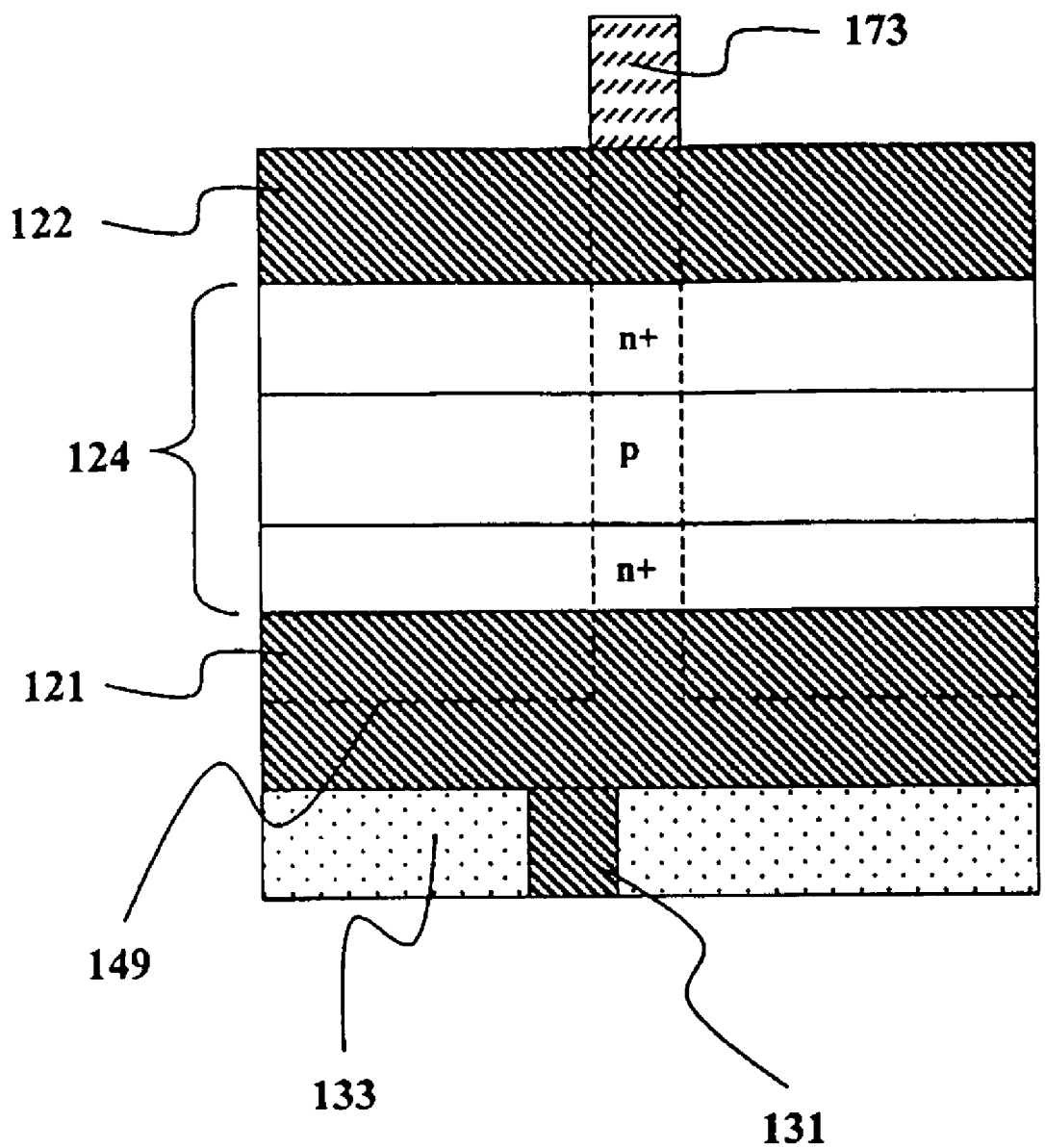
FIGS. 7a–7c illustrate a process flow of in accordance with the present invention that produces vertically oriented devices incorporated in the SOI layer with those devices having directly connected bottom electrodes.
Figure 7B:
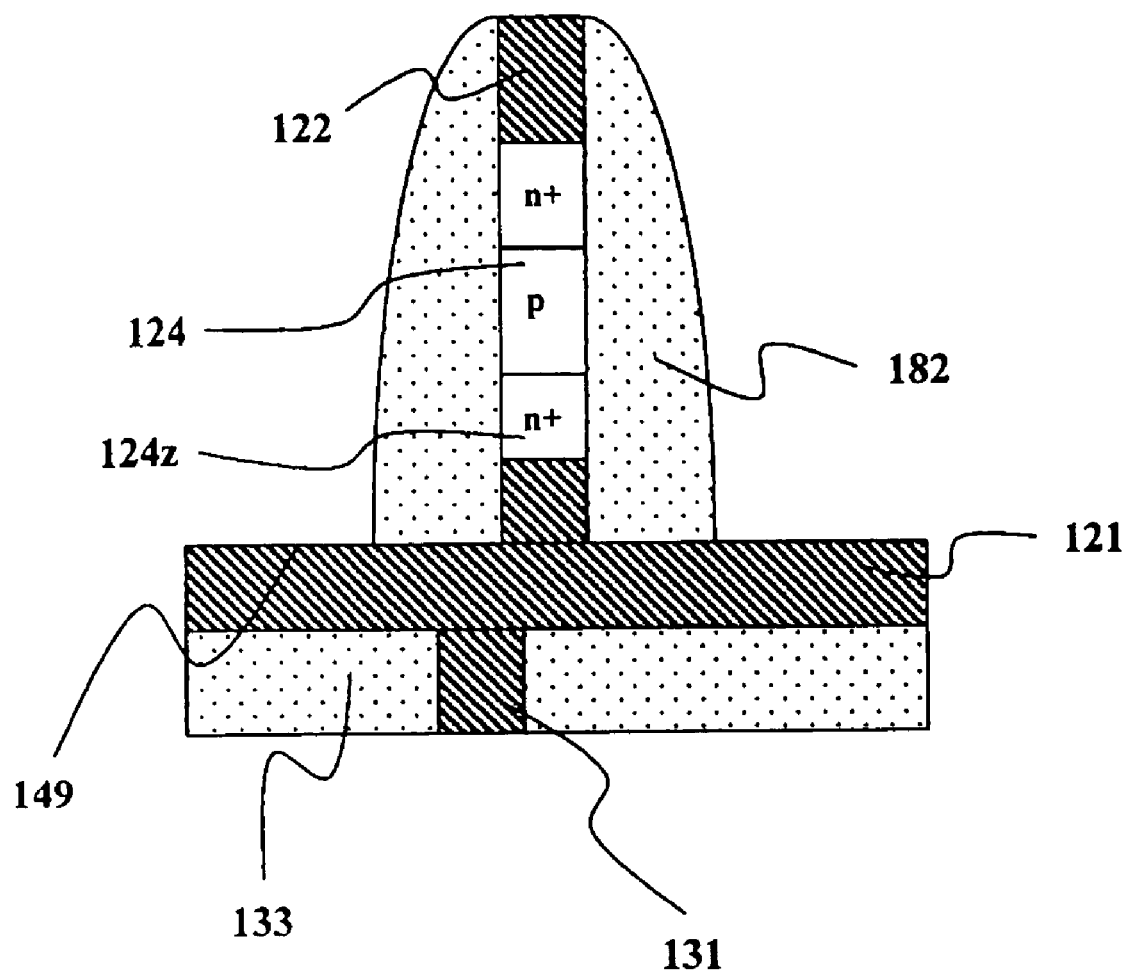

Referring to FIGS. 7a and 7b, the formation of bottom electrode 121 used for alignment between bottom portion 124z of FLD and via 131 uses a self-aligning technology and therefore does not require a photo mask type of process. Part of the metal layer used in the SOI substrate bonding process is to be extension of bottom part of FLD and other part of the metal layer becomes a bottom electrode 121. As shown in FIG. 7*a*, using etching mask 173, the portion of layers 122 and 124 indicated by the dashed lines is etched away. FIG. 7*b* shows spacer type etching mask which enables bottom electrode 121 to be wider than via 131. The width of bottom electrode 121 can be, for example, more than twice the FLD height if the etching mask is deposited taller than FLD and etched by, for example, a dry etching process. The width of bottom electrode 121 can be controlled by the thickness of a hard mask, the FLD height, the FLD width, and the etching amount of spacer 182. If the width of the FLD is bigger than a photo process margin, then wider bottom electrode 121 is not required.

Figure 8A:
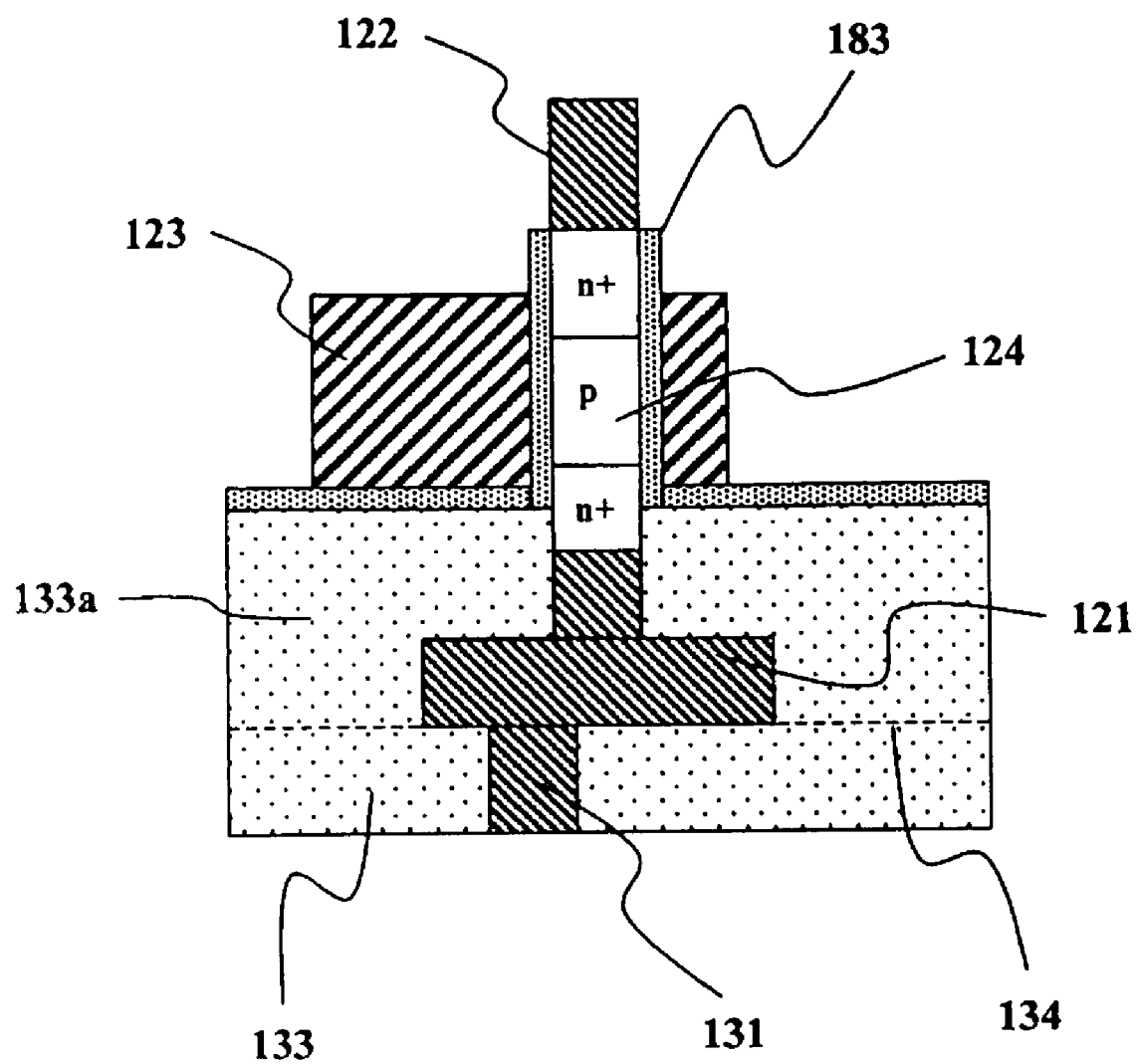
FIG. 8a is a cross-sectional view of an embodiment of the present invention having a vertical device with a planar middle electrode.

Referring to FIGS. 8*a*–8*d*, an intermediate electrode in accordance with the present invention can be implemented as follows. First, there is a planar intermediate electrode, or planar electrode, method. After electrode material deposition and a CMP operation for planarization, dry etching is performed to provide a planar electrode 123 shown in FIG. 8*a*. Patterning of planar electrode 123 can be done before or after the dry etching process. The deposited electrode material is usually thicker than the height of VFLD. Also, at this point in the process, an etch stop layer 122 may be needed on top of the FLD to prevent damage on SOI layer 124. Etch stop 122 is typically a combination of multiple oxide, nitride, or metal layers. In FIG. 8*a*, a dielectric material 133*a* is deposited, planarized, and dry etched in a manner similar to the formation of planar electrode 123. Dielectric material 133*a* reduces parasitic capacitance between bottom electrode 121 and planar electrode 123.

Figure 8B:
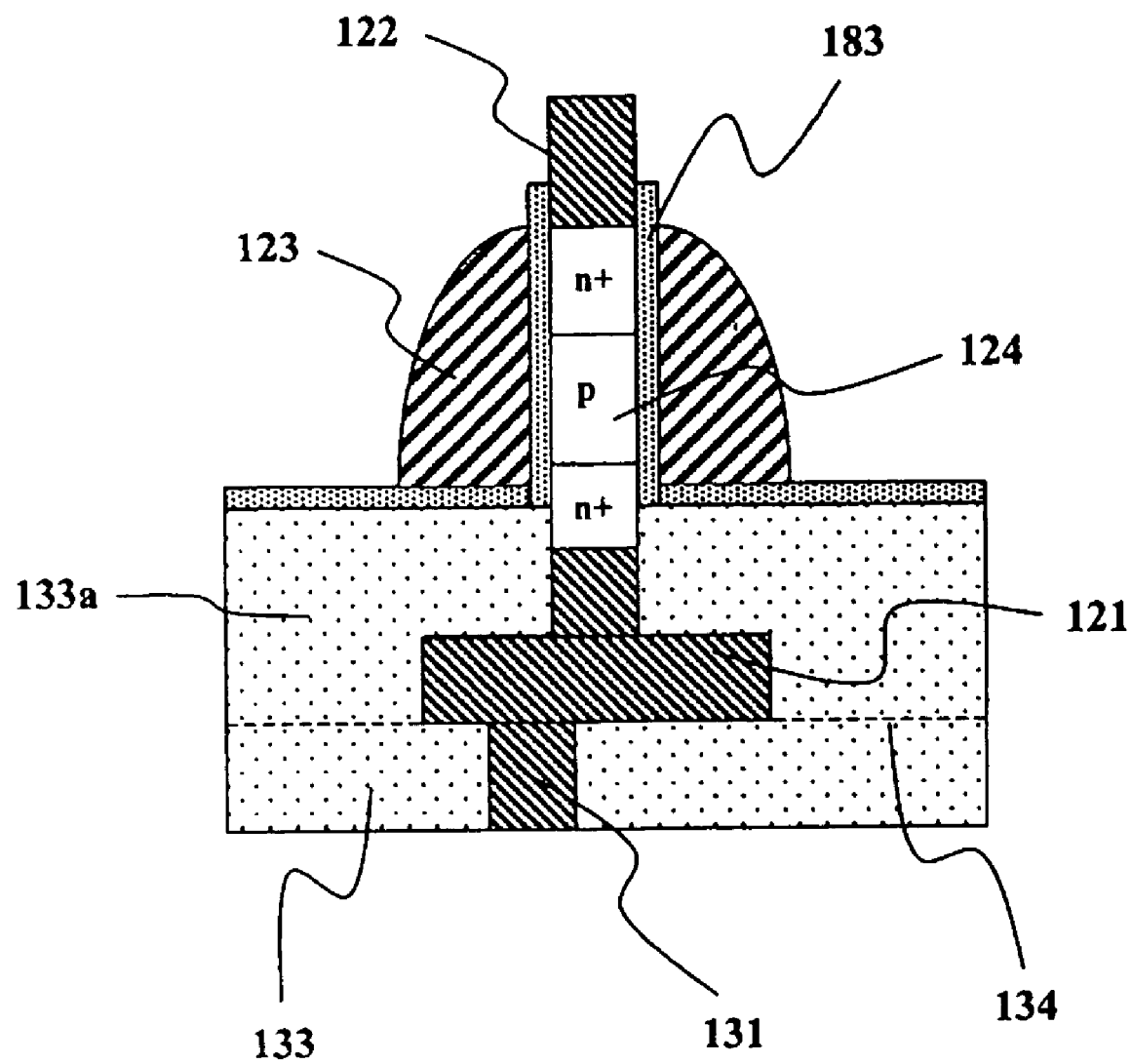
FIG. 8b is a cross-sectional view of an embodiment of the present invention having a vertical device with a spacer middle electrode.

Second is the method using spacer 123 as shown in FIG. 8*b*. If the width of spacer intermediate electrode or spacer electrode is wide, it is easy to obtain electrical contact with the spacer electrode. However, it is difficult to achieve high density. If the width is narrow, it is difficult to obtain electrical contact with the spacer electrode. The spacer method doest not require photo or CMP processes.

Figure 8C:
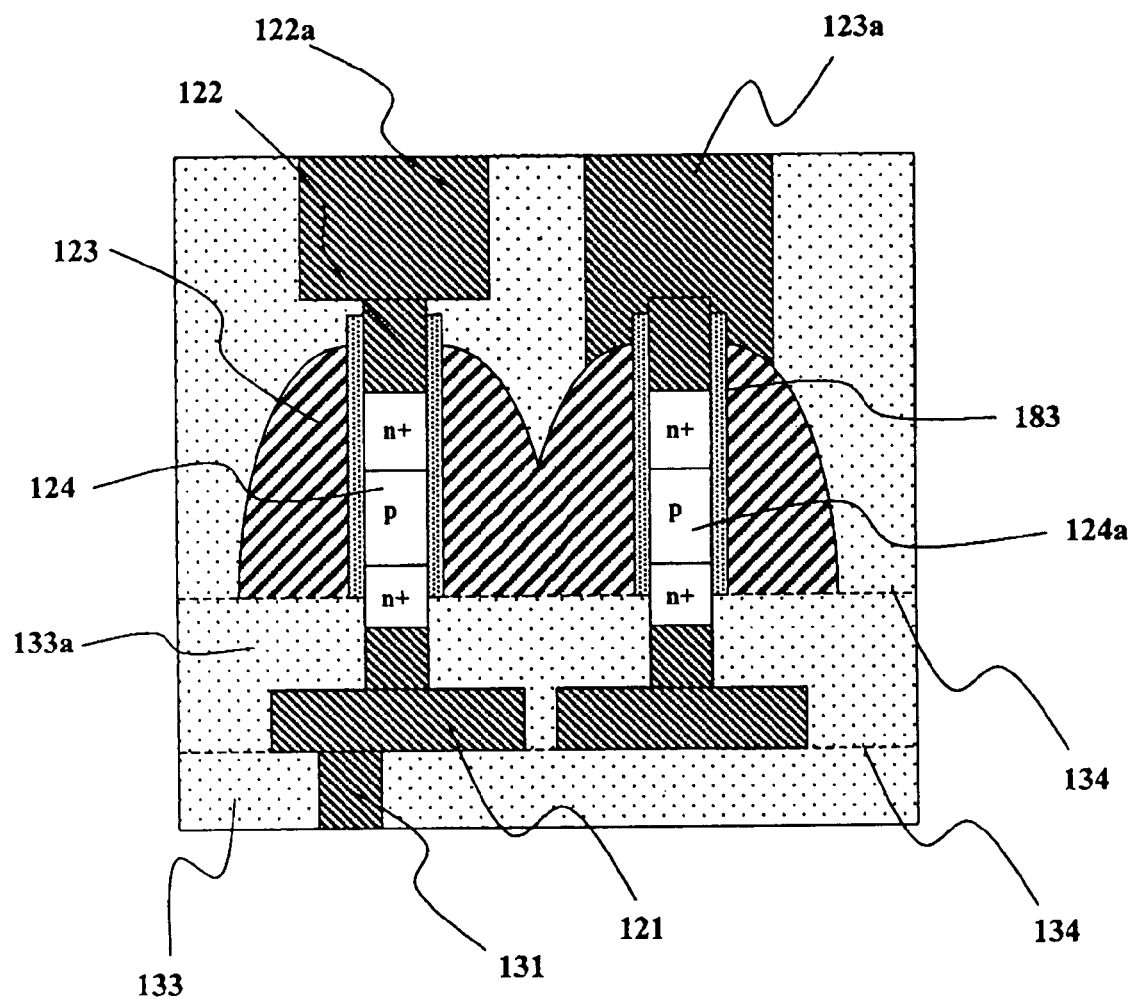
FIG. 8c is a cross-sectional view of an embodiment of the present invention having a vertical device with a spacer middle electrode extended to an adjacent dummy vertical device.

Third method is spacer method using a dummy FLD (i.e., an FLD which does not work as a device). As shown in FIG. 8*c*, a dummy FLD 124*a* is located close to FLD and increases the width of the spacer used for intermediate electrode 123. Because contact 123*a* connected to intermediate electrode 123 could be located on the top of dummy FLD 124*a*, the margin for contact formation increases. As shown in FIG. 8*c*, the spacing between the FLD and dummy FLD 124*a* should be smaller than two times the spacer film thickness.

Figure 8D:
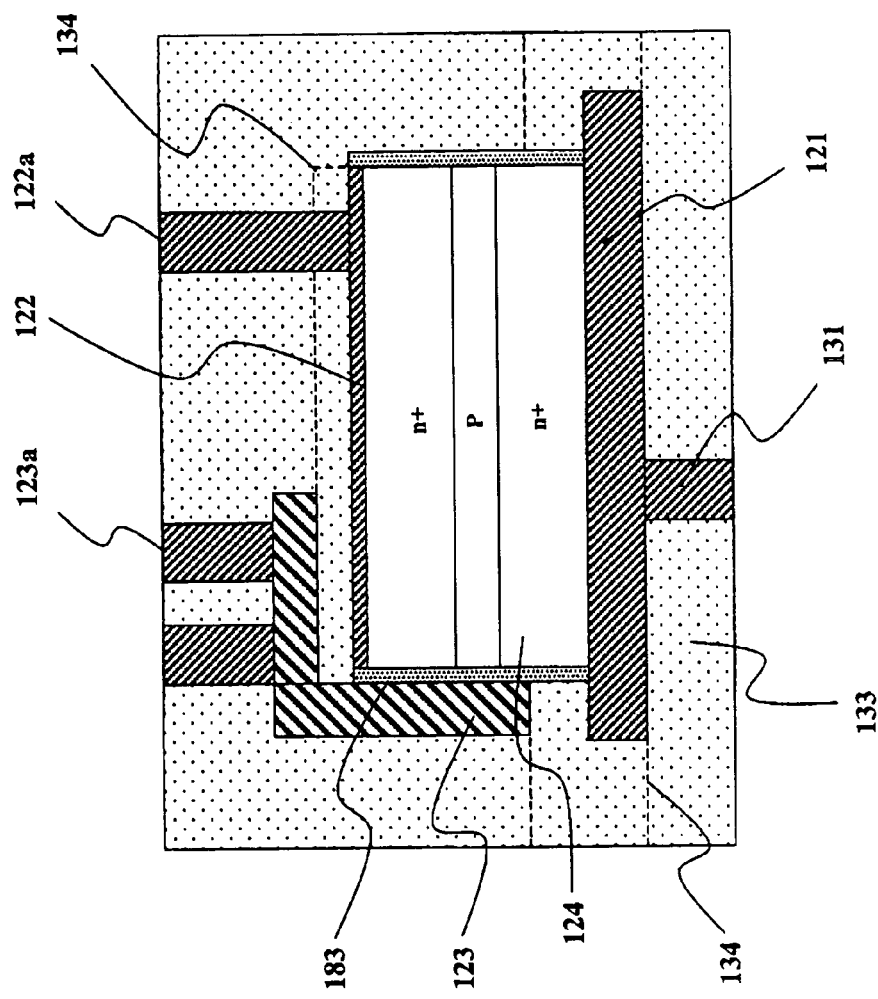
FIG. 8d is a cross-sectional view of an embodiment of the present invention having a vertical device with a middle electrode extended to the top of the vertical device.
Figure 8E:
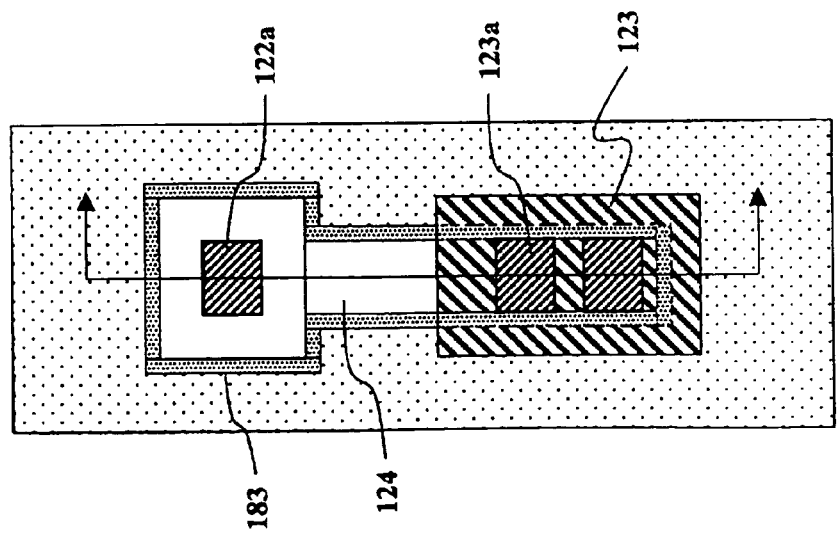
FIG. 8e is a top view of the structure shown in FIG. 8d.

The fourth method is, as shown in FIG. 8*d*, thin spacer method which extends intermediate electrode 123 to the top of FLD. After deposition of the intermediate electrode material, covering the area of contact formation on intermediate and etching the rest of the area, we get the structure of FIG. 8*d*. This method is good for thin spacer thickness. To reduce parasitic capacitance between top and intermediate electrodes, a thick dielectric layer may be used on the top electrode.

Intermediate electrode may surround the entire or part of intermediate region of the VFLD. Also, multiple intermediate electrodes could be formed at one FLD.

Figure 9A:
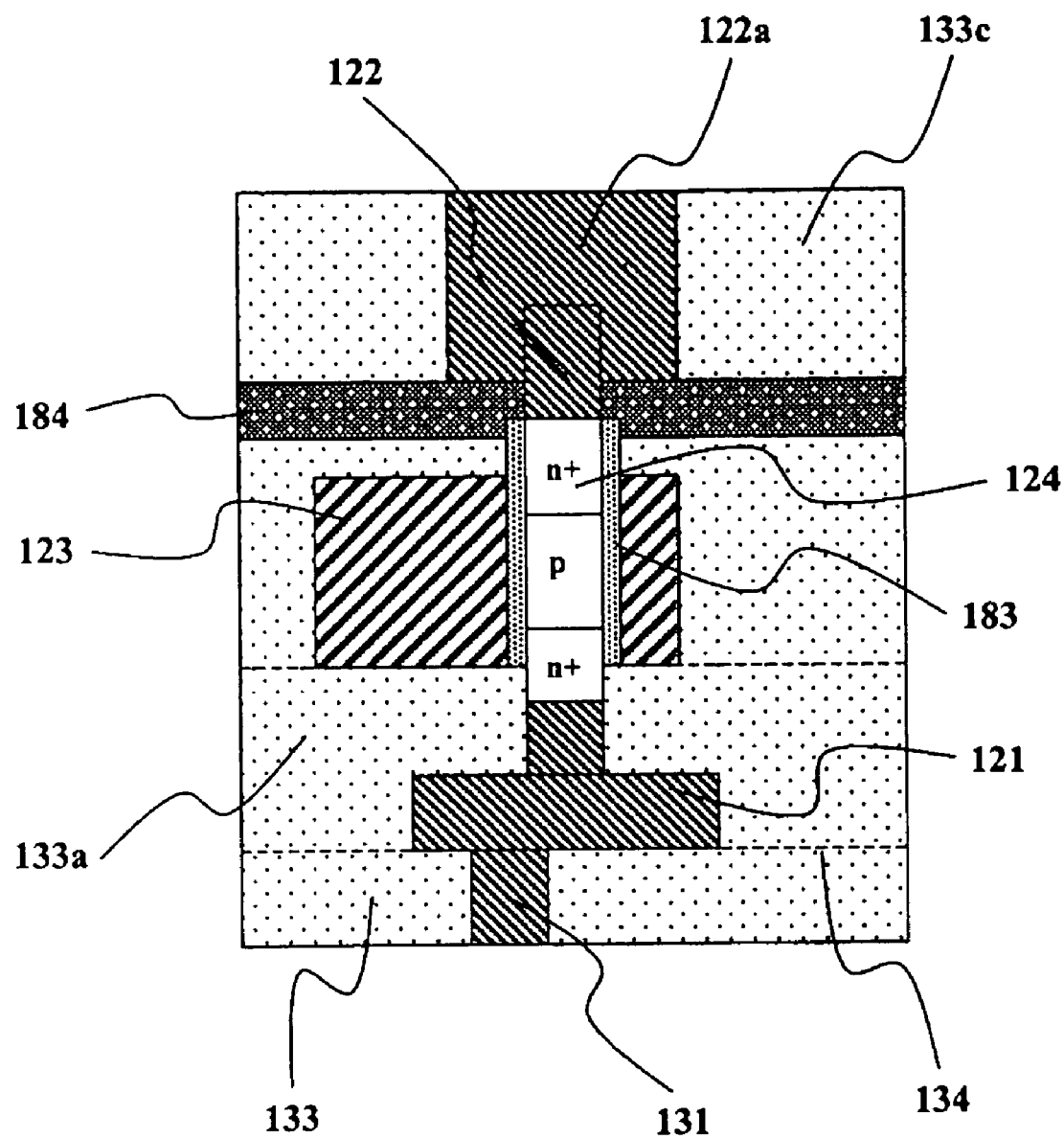
FIG. 9a is a cross-sectional view of an embodiment of the present invention having a vertical device with a planar etch stop layer for a top contact electrode.
Figure 9B:
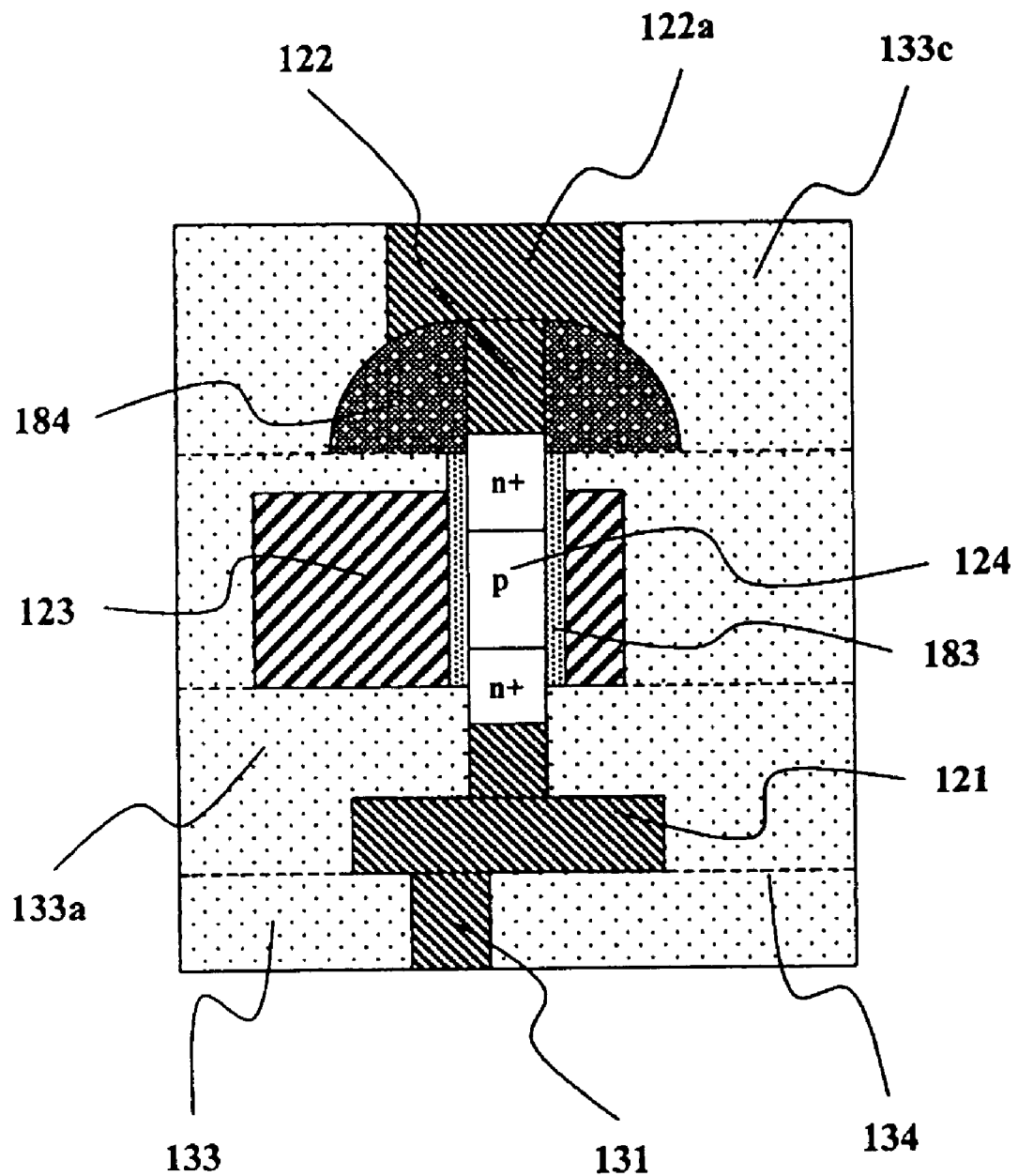
FIG. 9b is a cross-sectional view of an embodiment of the present invention having a vertical device with a spacer etch stop layer for a top contact electrode.

After the SOI layer has been transferred from SOI substrate, electrode material 122 has been deposited on the SOI layer and FLD has been patterned, then top electrode could be implemented as shown in FIG. 7*a*. If the size of contact 122*a* is smaller than the size of top electrode 122, then conventional semiconductor photo/etch technologies can be used as shown in FIG. 8*d*. However, if the FLD width is less than the misalignment margin of the photo process for formation of contact 122*a*, or the size of contact 122*a* is greater than the area of FLD, then photo/etch processing for contact 122*a* may cause a short circuit to the intermediate electrode. Therefore, this disclosure describes several structures in accordance with the present invention that increase process error margin for photo/etch during the formation of contact 122*a*. First thing is to increase thickness of top electrode formation material in order to provide etching process margin. Second is to use etch stop layer 184 with planar technology as shown in FIG. 9*a*. Third is to use etch stop layer 184 with spacer technology as shown in FIG. 9*b*, where the etch stop layer 184 has slow etching rate compared to the dielectric layer 133*c* during the contact 122*a* formation. For example, if dielectric layer 133*c* is oxide film, then etch stop layer 184 could be nitride.

In this disclosure, we annotate VFLD, which is implemented at low temperature and has vertical operation, as follows: MOSFET VMFLD, MESFET VMEFLD, diode VDFLD, resistor VRFLD, capacitor VCFLD, bipolar VBFLD, and Thyristor VTFLD.

Figure 10A:
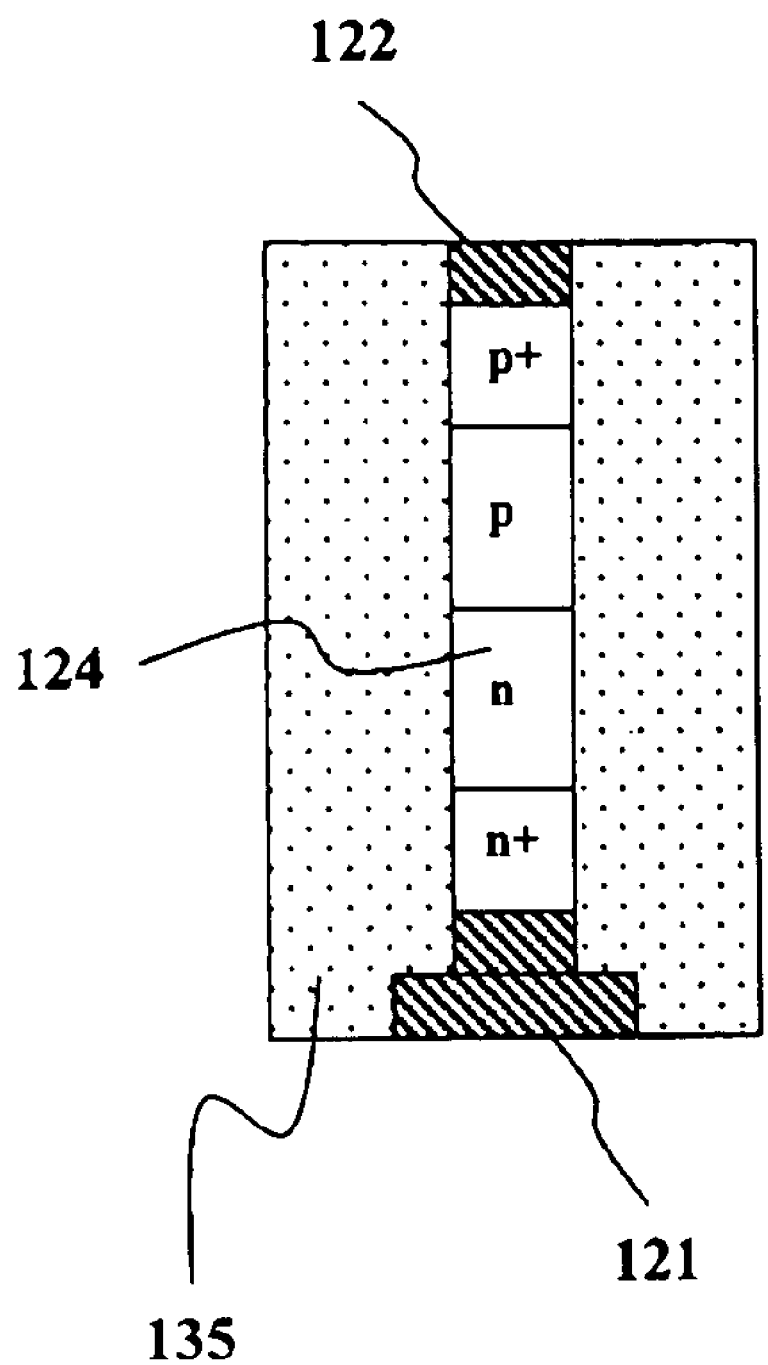
FIG. 10a is a cross-sectional view of an embodiment of the present invention having a vertically oriented p-n junction diode.
Figure 10B:
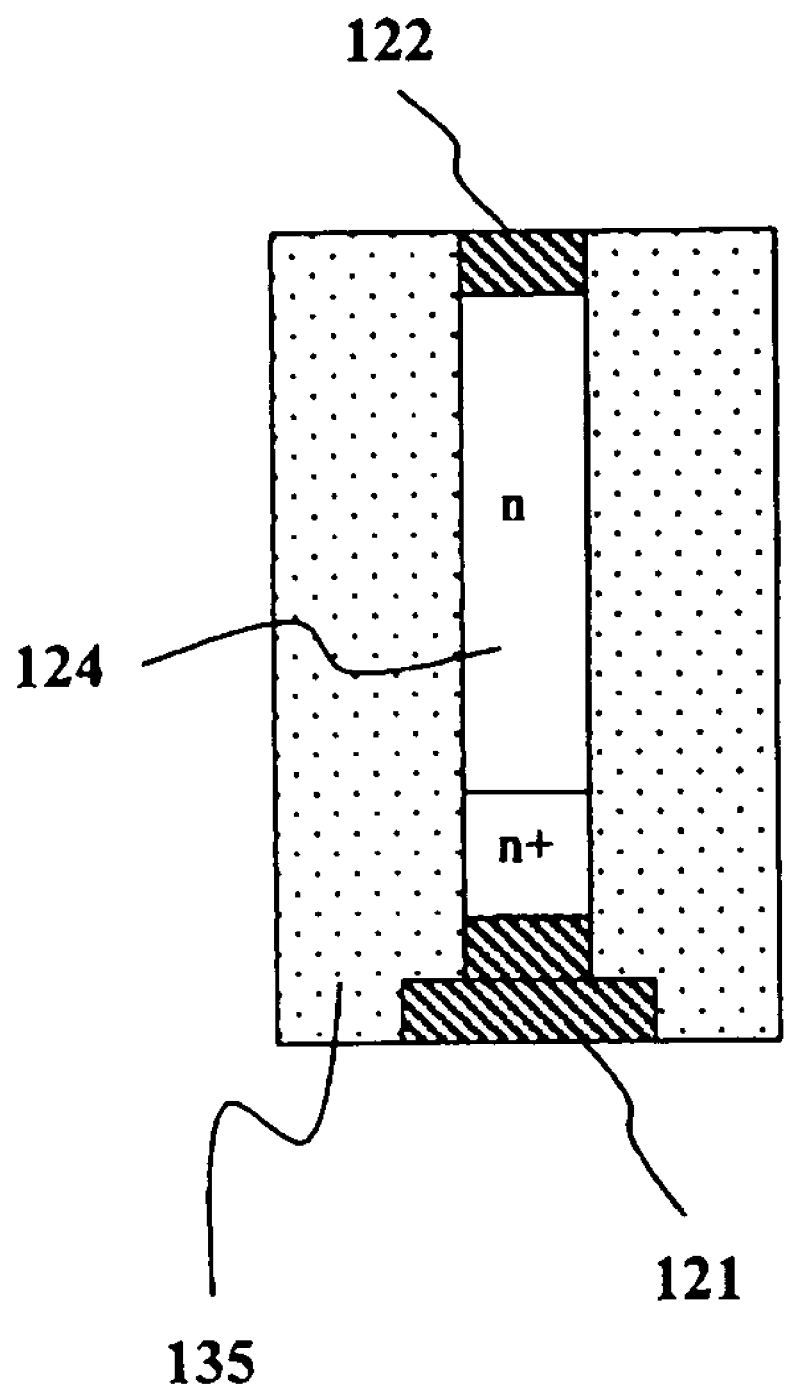
FIG. 10b is a cross-sectional view of an embodiment of the present invention having a vertically oriented Schottky diode.
Figure 10C:
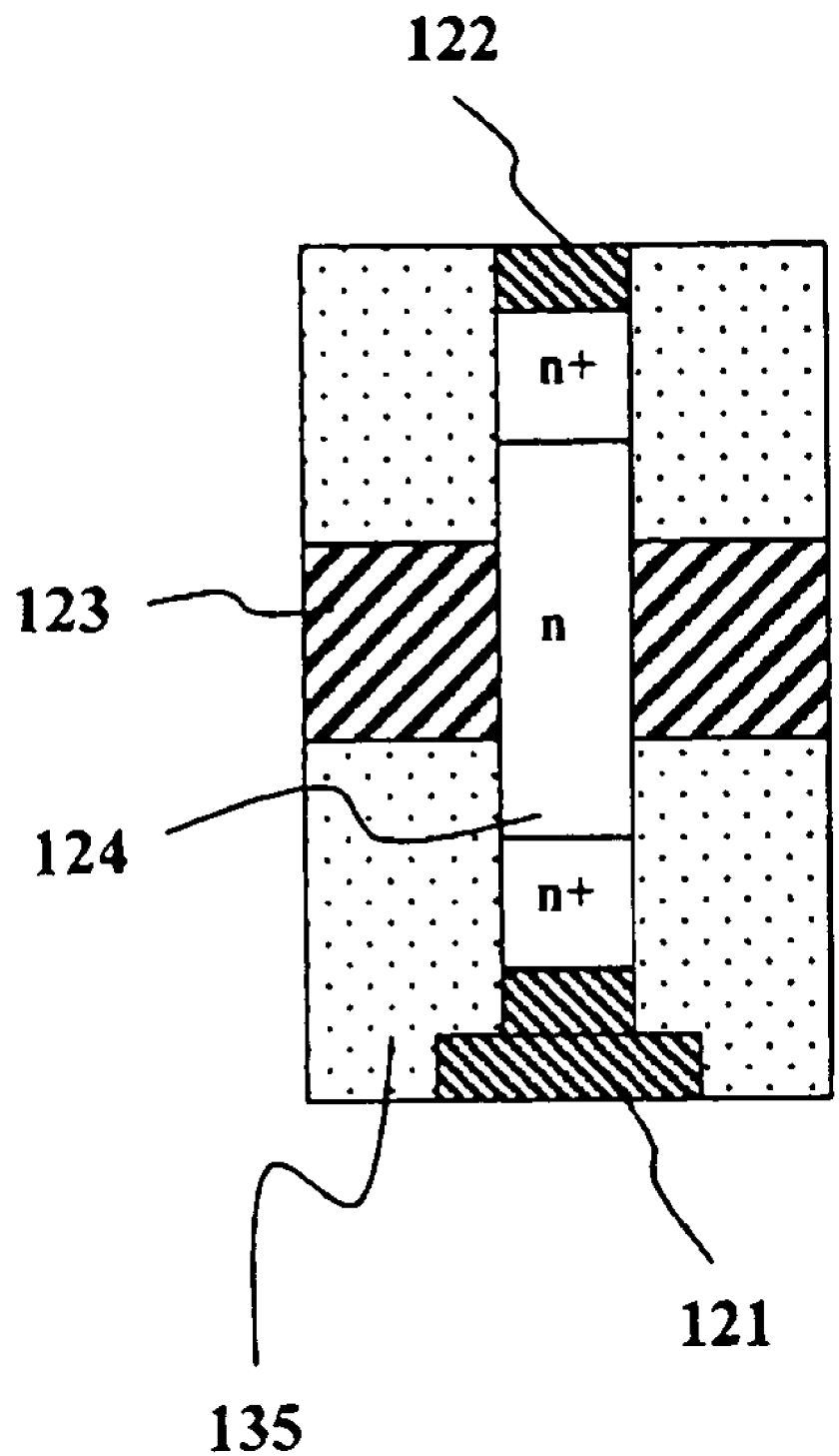
FIG. 10c is a cross-sectional view of an embodiment of the present invention having a vertically oriented Schottky diode with Schottky contact disposed at the middle electrode.

VDFLD could be implemented as vertical p-n or p-i-n junction diodes as shown in FIG. 10*a*. Also, FIG. 10*b* shows vertical Schottky diode, which has Schottky junction between top electrode 122 and SOI 124. Or, as shown in FIG. 10*c*, metal intermediate electrode 123 could be used for 3-D Schottky diode. The VDFLD shown in FIG. 10*c* has twice the current driving capability compared to the one in FIG. 10*b*, because current follows from anode at intermediate electrode 123 to cathodes at top and bottom electrodes.

Figure 11A:
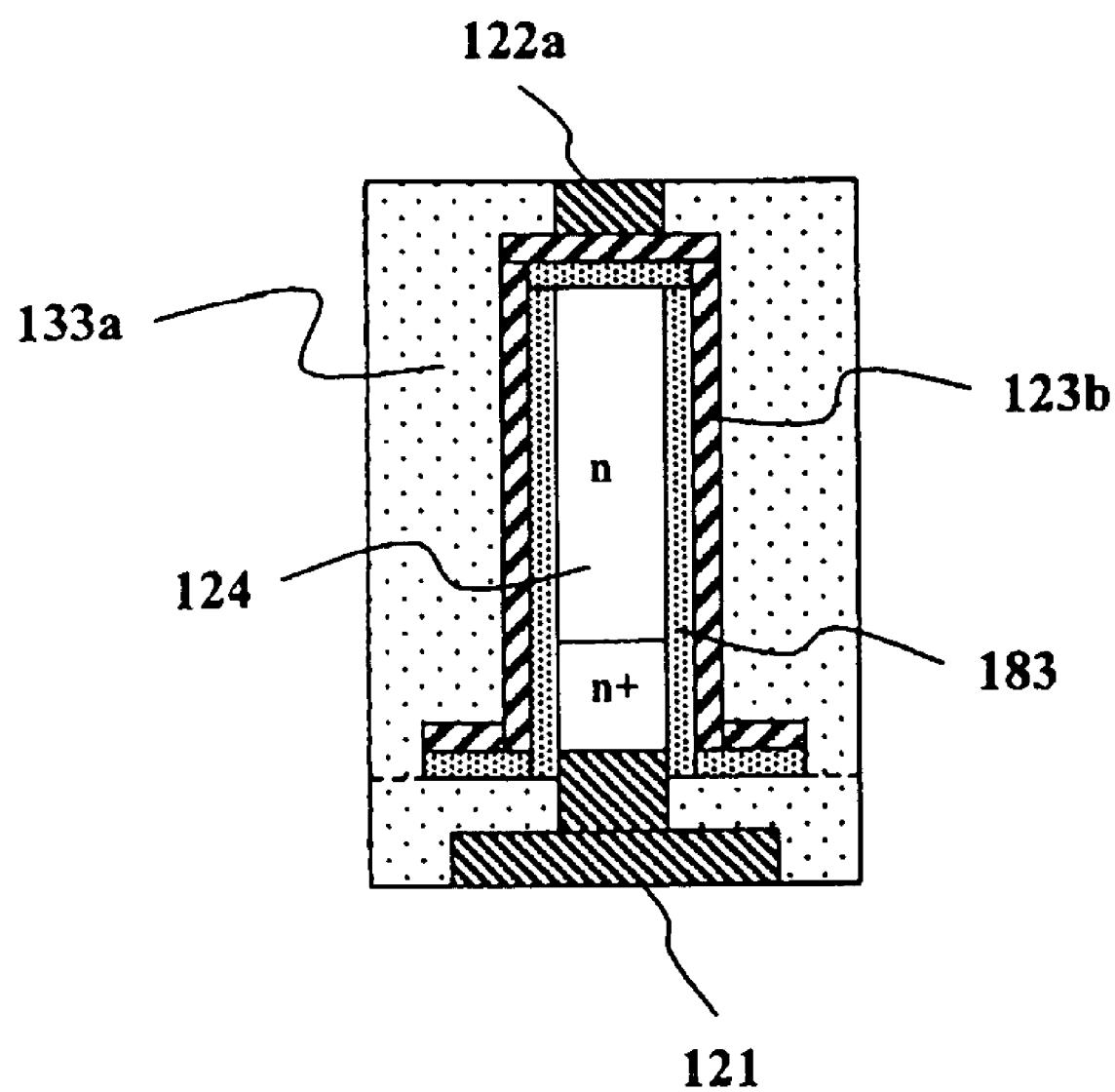
FIG. 11a is a cross-sectional view of an embodiment of the present invention having a vertically oriented capacitor formed by a depletion region.
Figure 11B:
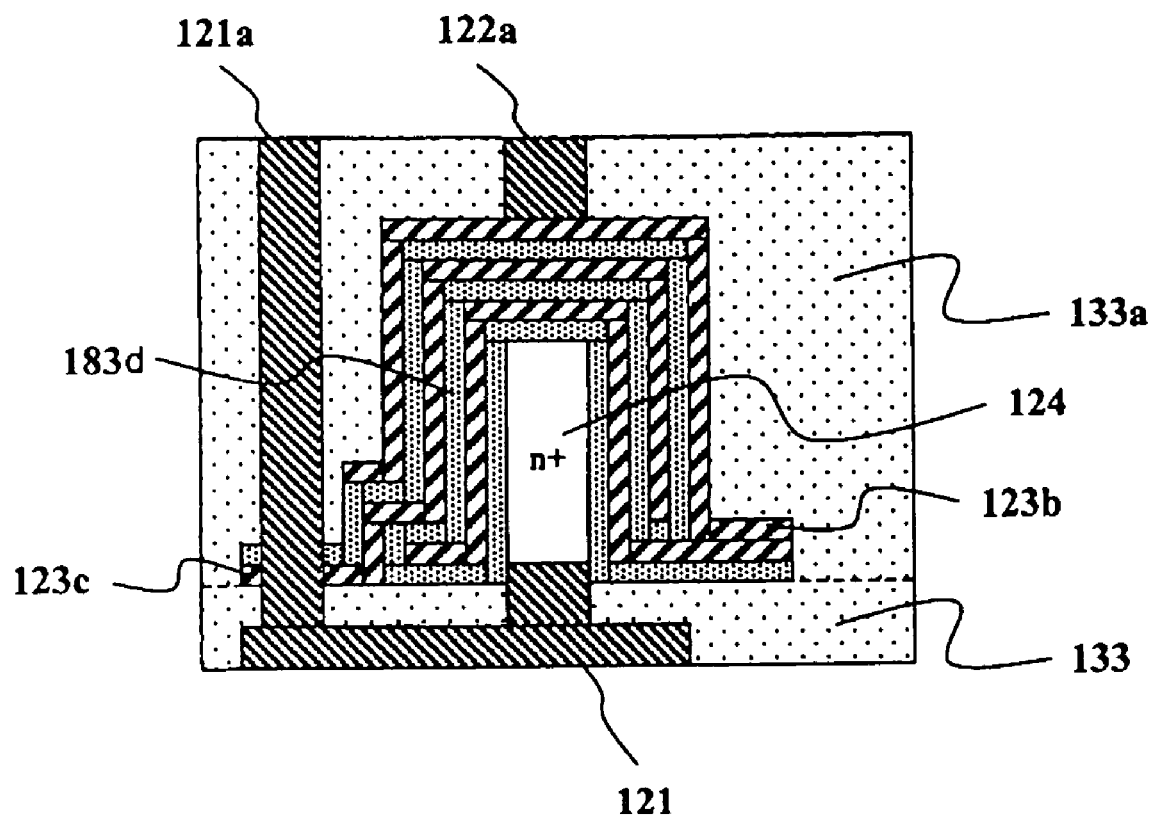
FIG. 11b is a cross-sectional view of an embodiment of the present invention having a vertically oriented capacitor formed by a dielectric layer between electrodes.

There are two types of VCFLDs. One is MOS capacitor type or depletion capacitor, which uses a depletion region formed in the single crystalline semiconductor; and the other one, or dielectric capacitor, stores charge at dielectric interface without a depletion region. If the doping concentration of the semiconductor is low, then, depletion exists in semiconductor region. If doping concentration is high, then, it becomes dielectric capacitor, VCFLD without depletion. VCFLDs are shown in FIGS. 11*a* and 11*b*. In FIG. 11*a*, there are gate dielectric which surrounds n-type single crystalline semiconductor and an electrode which connects the n-type semiconductor. Because, in general, the total capacitance is proportional to the electrode area, the surrounding gate 123*b* increases total capacitance of VCFLD. Without the gate dielectric layer, the metal gate forming the Schottky diode could be used as a capacitor with reverse bias.

If the semiconductor has a pillar structure, the capacitance of VCFLD increases due to the increased semiconductor and gate interface area. Also, as shown in FIG. 11*b*, gates 123*b*, 123*c* and a gate dielectric layer are stacked repeatedly on a VCFLD, and the stacked capacitor and the VCFLD are connected in parallel, and then, capacitance could be increased. This type of capacitor has the same structure of stacking capacitor used in DRAM. The contact 121*a* in FIG. 11*b* connects gate of the stacked capacitor and bottom electrode 121.

Figure 12:
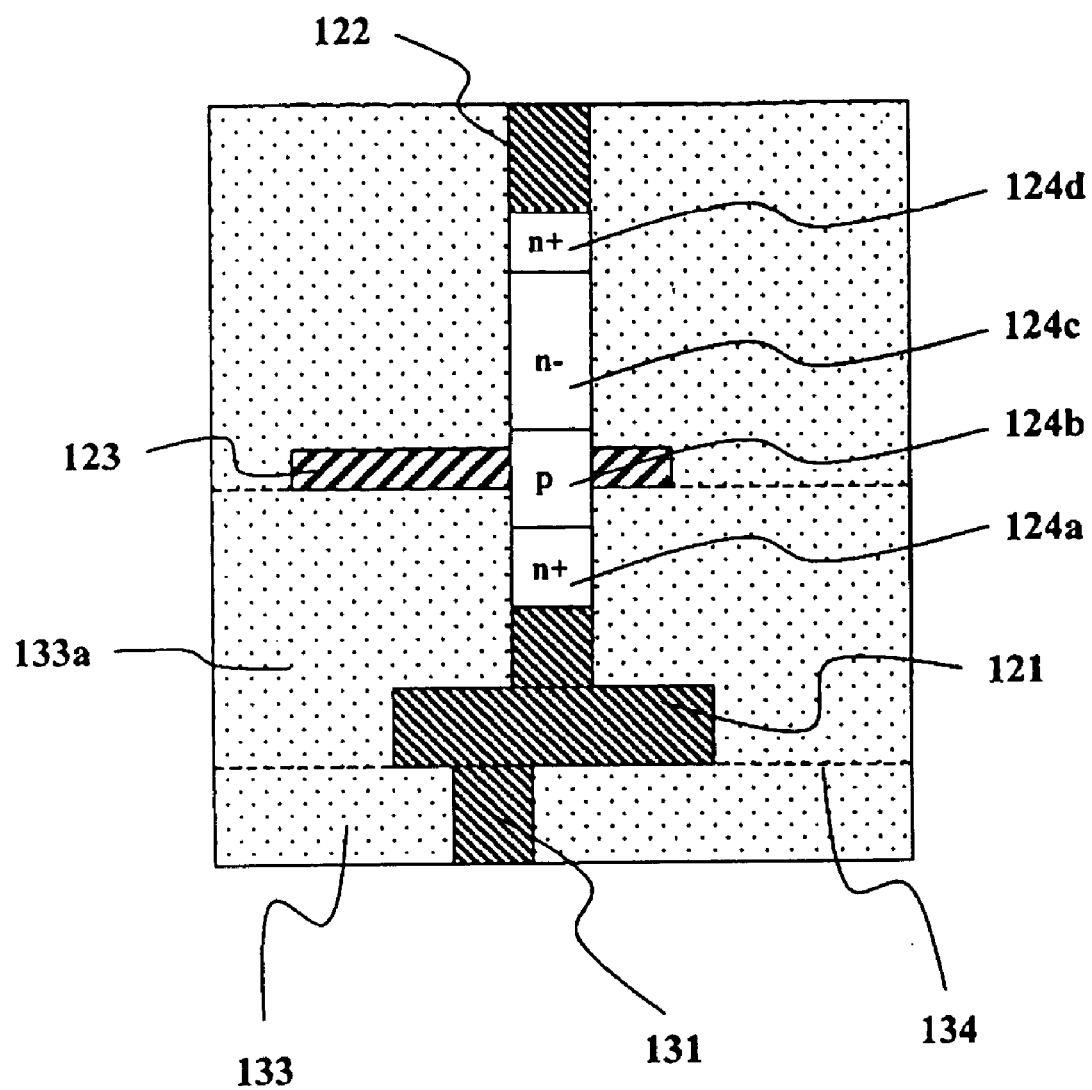
FIG. 12 is a cross-sectional view of an embodiment of the present invention having a vertically oriented bipolar transistor.

Bipolar type VBFLD is shown in FIG. 12. The impurity regions, which consist of collector 124*c*, 124*d*, base 124*b*, and emitter 124*a*, have been implemented at SOI substrate and then transferred. Electrodes, which consist emitter 124*a* and collector 124*d*, are formed at bottom 121 and top 122, and base 124*b* electrode 123 is formed in middle of the FLD. Even though emitter 124*a* could be located at top or bottom of VBFLD, emitter is at the bottom of VBFLD in the illustrative embodiment. In this case, the emitter is implemented at top of the SOI substrate before the single crystalline semiconductor 124*a*–124*d* has been transferred.

Therefore, accurate junction control is enabled when emitter 124a and base 124b regions are formed. Also, SiGe heterojunction base is possible and polycrystalline semiconductor can be used as part of emitter region. In addition, because the emitter 124a is located at the bottom of VBFLD, emitter could be away from thickness variation during planar process after the SOI layer transfer process. If handling substrate is used for SOI layer transfer, then emitter is located at top of the FLD.

In accordance with the present invention, to obtain low collector series resistance, the VBFLD does not need a buried layer and heavily doped collector region which connects the collector contact and the buried layer. Various embodiments of the present invention provide lower collector series resistance compared to conventional approaches. Also, base series resistance can be low without a heavily doped extrinsic base region because the surrounding base electrode 123 formed in the middle of VBFLD has a wide contact surface at the base region. Further, the VBFLD does not have parasitic capacitors which prevent high speed operation. In addition, because the VBFLD does not have a substrate, base-collector-substrate parasitic bipolar transistor does not exist in embodiments of the present invention. Whereas conventional implementations need deep and shallow trench isolations, VBFLD only needs one isolation structure 135. In FIG. 11, if the base intermediate electrode 123 is extended from base region to collector region, then the low doped collector region 124c forms a Schottky diode with the base electrode which enables high speed operation of the VBFLD.

MOSFET-type VMFLD are shown in FIGS. 8a–8d and FIGS. 9a–9b. The vertical MOSFET could have high integration density at small space. It is noted that the channel length of a MOSFET in accordance with the present invention is not limited by photo and etching process limitations, but rather is determined by the thickness of a doped layer. Also, the VMFLD could have high driving current because channel width could be increased easily with a surrounding gate compared to conventional structures which have the same channel length.

However, vertical MOSFETs of the prior art are not used often because of many disadvantages. Vertical transistors shown in U.S. Pat. No. 5,414,288 and U.S. Pat. No. 6,027,975 are formed by epitaxial growth at exposed single crystalline region. Because this technology requires difficult manufacturing technologies and high temperature operation for epitaxial growth, it is not good for low temperature semiconductor processing.

Pillar type Surrounding Gate Transistor (SGT), shown in U.S. Pat. No. 6,337,247 and U.S. Pat. No. 6,449,186, is difficult to co-exist with optimized horizontal devices and may cause a shadow effect during ion implantation due to pillar type transistor. Also, SGT does not have high integration density because it has problems with forming electrodes at source/drain and gate regions. Therefore, these approaches are not suitable for SoC formation.

The VMFLD has a directly connected bottom electrode which decreases voltage drop, and current reduction by parasitic resistance. Also VMFLD could be easily full or partial depletion mode with control of FLD width, where the depletion mode could be also controlled by operation voltage and gate dielectric constant. Because the detached surface from the SOI substrate becomes heavily doped source/drain region, even though there are small surface defects, unlike prior arts of horizontal device, there is little effect to gate oxide quality, device operation, and yield.

The VMFLD may have gradient impurity distribution in the channel region and electric field could be formed in the channel region due to the graded impurity, where the induced electric field accelerates current flow and graded impurity may reduce Short Channel Effect (SEC). The graded impurity can be formed easily by ion implantation or epitaxial process. Increased impurity concentration in the channel region from source to drain side makes asymmetric operation. In addition, LDD (Lightly Doped Drain) could be selectively formed at drain side only. It is difficult to implement the graded channel in horizontal MOSFET in the prior arts, because of difficulties in high tilt ion implantation and device layout.

MOSFET-type VFLD, or VMFLD, has a gate dielectric layer which is implemented at below 650° C. as shown in U.S. Pat. No. 5,330,935 and U.S. Pat. No. 5,443,863. The dielectric layer could be thermal oxide, deposited oxide, oxynitride, or combination of oxide and nitride, such as ONO and NO (Nitride Oxide). Any suitable dielectric material could be used except high temperature processing films requiring more than 650° C. Another advantage of embodiments of the present invention is that it is easy to use high dielectric constant (high-k) materials in the gate dielectric layer, such as, but not limited to, $Al_2O_3$, $ZrO_2$, $HfO_2$, $Y_2O_3$, $La_2O_3$, $Ta_2O_5$, $TiO_2$, and BST. In conventional manufacturing of MOSFETs, a high temperature heat activation operation is required after the source/drain ion implantation. At this time, the properties of high-k materials can be altered. However, the VMFLD process does not need a high temperature process, and so high-k materials could be used at stable condition. Also, if ALD (Atomic Layer Deposition) is used to provide the gate dielectric layer, then a substantially uniform layer can be obtained.

In accordance with the present invention, threshold voltage could be controlled by changing gate dielectric thickness and/or width of FLD. If different gate dielectric thickness is used or different dielectric constant materials are used at VMFLD, then multiple operational voltage and threshold voltage could be implemented at the same SOI layer and it is useful for SoC. Also, because the VMFLD is produced at low temperature, and a surrounding gate is used, it is easy to use a metal gate compared to prior art manufacturing approaches.

Figure 13A:
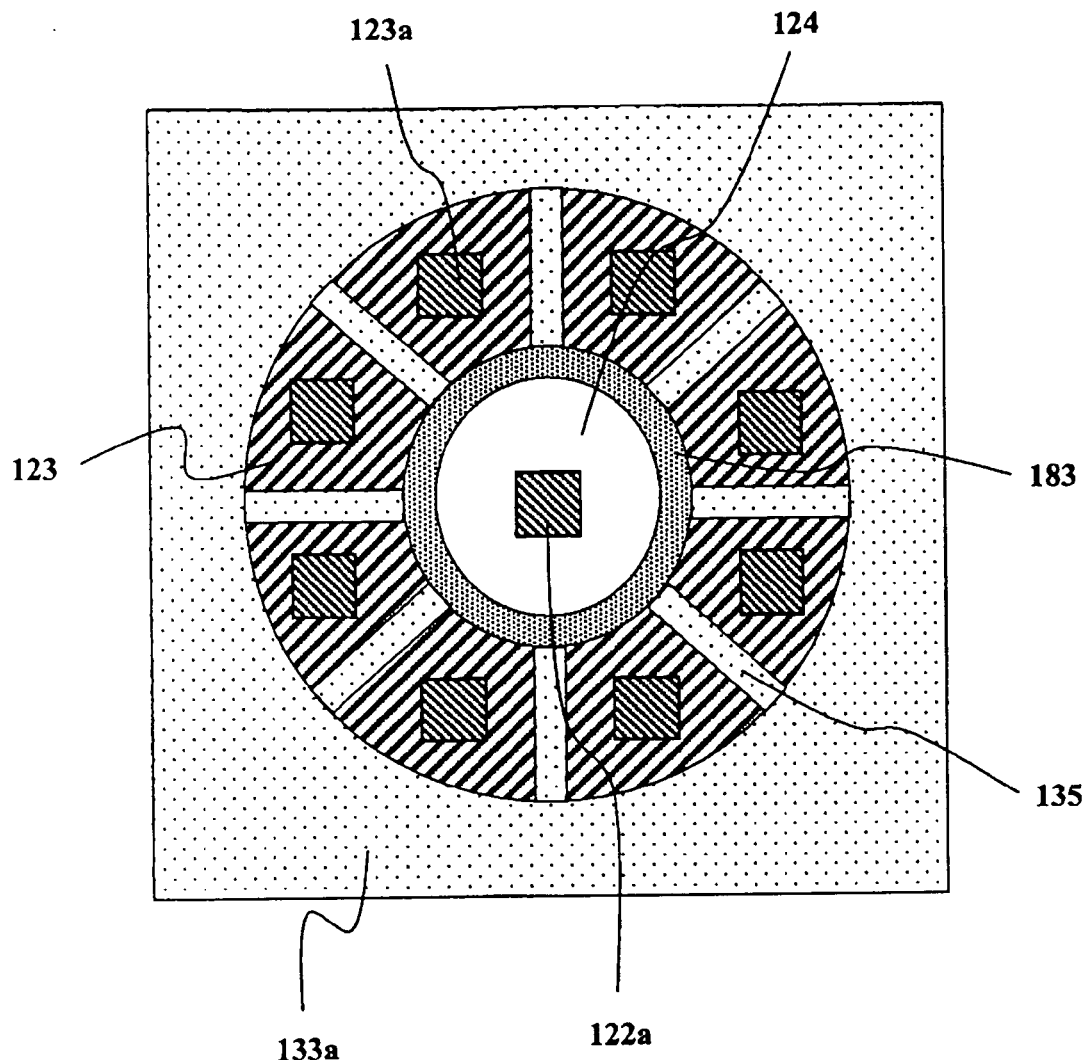
FIG. 13a is a top view of an embodiment of the present invention having a vertical device structure forming a MOSFET with eight gates for multi-bit, or variable gate width, operation.
Figure 13B:
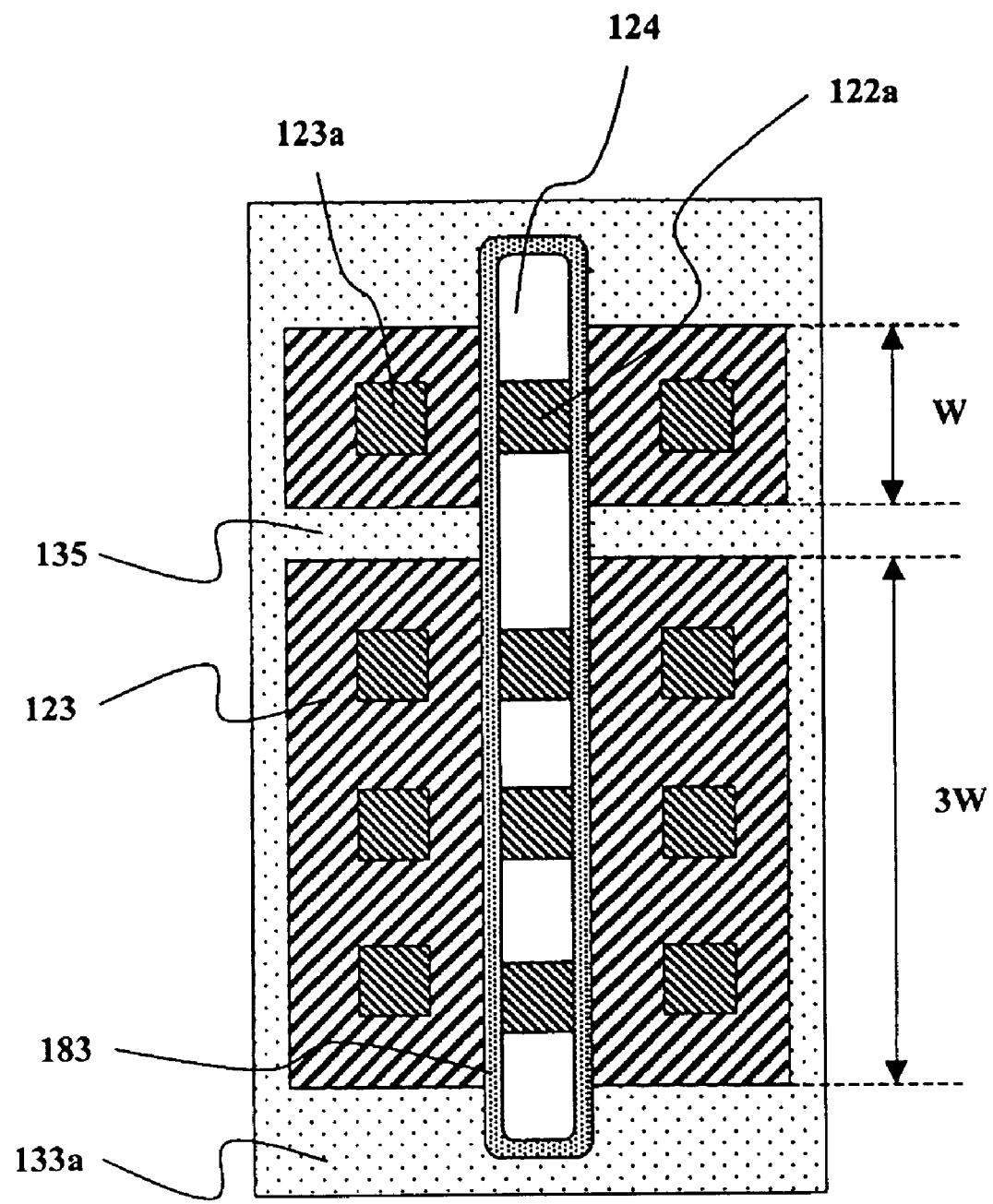
FIG. 13b is a top view of an embodiment of the present invention having a vertical device forming a MOSFET with four different size gates for multi-bit, or variable gate width, operation.

In the prior art, for digital application, a MOSFET is in either an "Off" or an "On" state depending on voltage or current status. VMFLD shown in FIG. 13a could be a multi-Level (ML) VMFLD which has multiple status values with multiple gates sharing one source/drain. Current driving capability of VMFLD is proportional to the gate area. Therefore, simply multiple gates with same gate size could be used for gradual increase of current. Or, multiple gates with same gate size of a VMFLD could be used for ML-VMFLD. FIG. 13b shows a ML-VMFLD which has two "W" size gates and two "3W" size gates, where "W" is a constant number and "3W" means triple the value of "W". Using combination of these 4 different gates, ML-VMFLD could have 9 different current values from "0" to "8". If the same size gates are used for ML-VMFLD, eight gates are required for nine different values as shown in FIG. 13a. ML-FLD could be used for memory or digital logic device applications. Intermediate electrodes for multi-level could be used for bipolar transistor as base electrodes.

Figure 14:
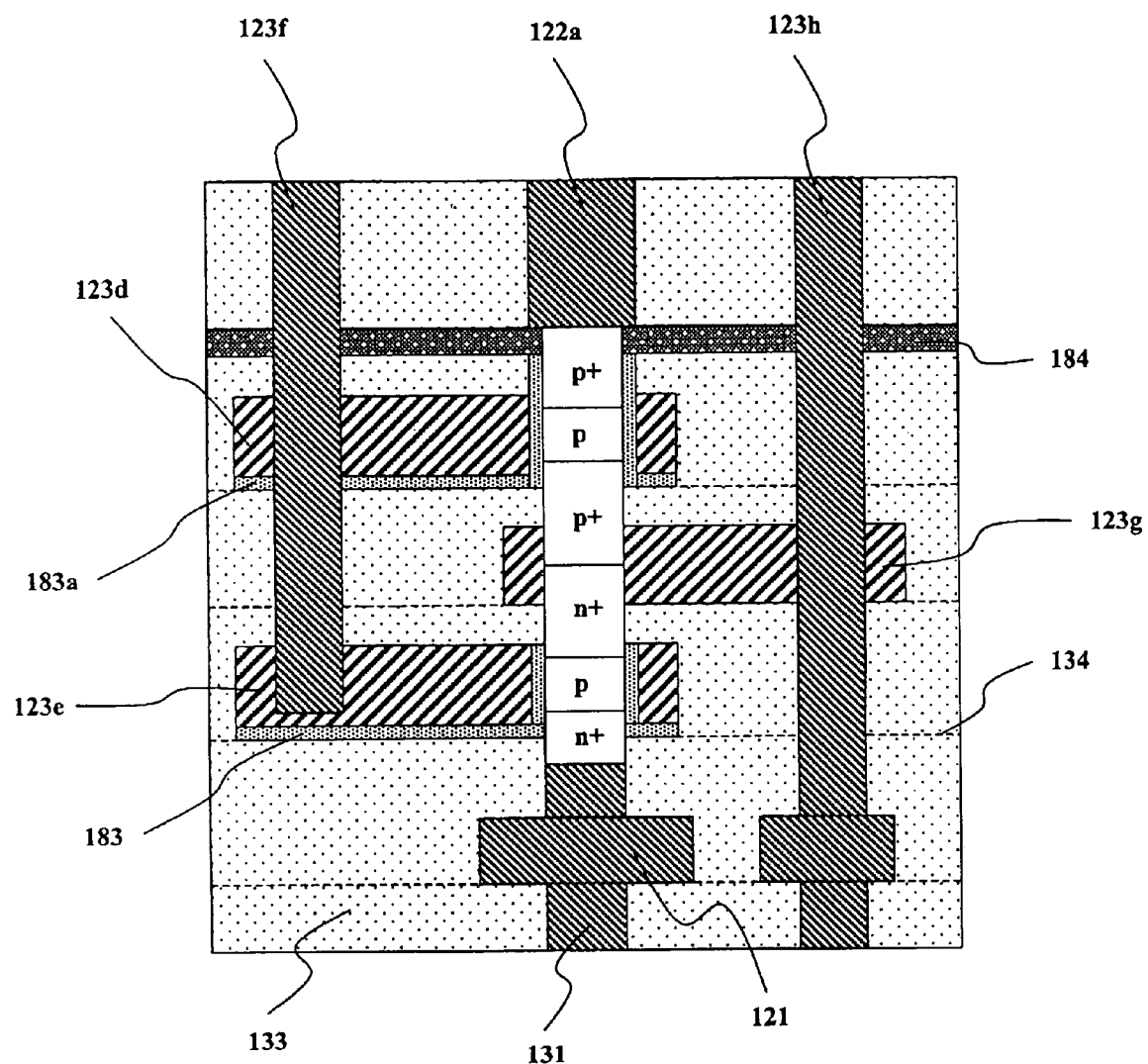
FIG. 14 is a cross-sectional view of an embodiment of the present invention having a vertically oriented inverter.

A 3-D IC including FLDs may have not only single device form, such as MOSFET or bipolar transistor, but also multiple devices formed in a single FLD layer. FIG. 14 shows a single inverter type VFLD. The p-MOSFET and n-MOSFET which make up the inverter do not require different wells, and therefore this inverter has a high integration density. Contact 123f, which connects gates of p-MOSFET and n-MOSFET together, becomes the input terminal of the inverter. Drains of p-MOSFET and n-MOSFET are connected together and connected to electrode 123g and contact 123h. In FIG. 14, p+-p-p+ type p-MOSFET is a depletion mode MOSFET. Or the p-MOSFET could be a p+-n-p+ type and in this case n-region needs reference voltage. As shown in FIG. 14, the contact, which penetrates the dielectric layer used for FLD isolation structure, could be connected to interconnection lines above or below FLD layer.

In addition to the FLD inverter shown in FIG. 14, which uses only one SOI layer, a FLD inverter could be implemented using two SOI layers as shown in FIG. 5b; in which case one SOI layer has the n-MOSFET and the other SOI layer has the p-MOSFET, In accordance with the present invention, memory devices could be implemented using multiple FLDs.

Figure 15A:
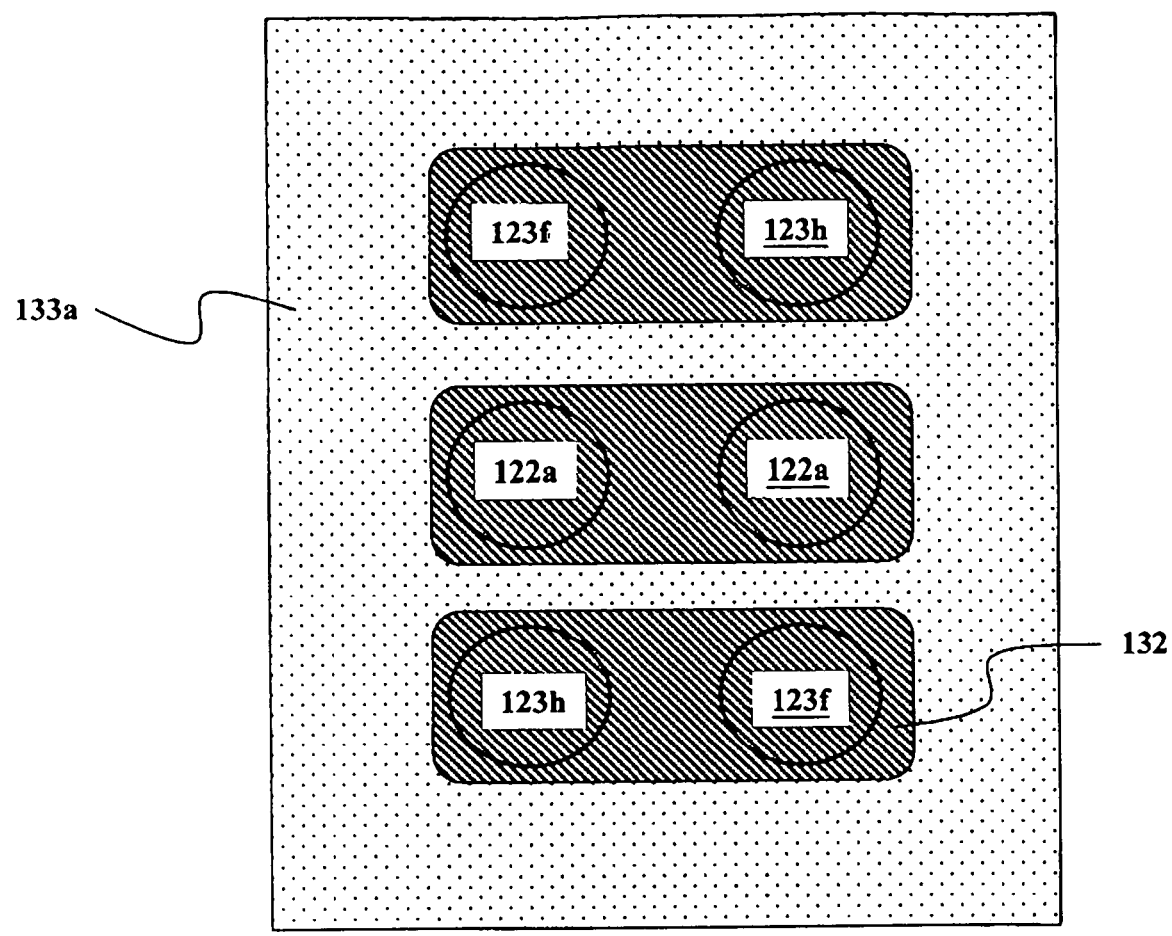
FIGS. 15a–15b illustrate top and bottom layouts of an SRAM cell in accordance with the present invention.
Figure 15B:
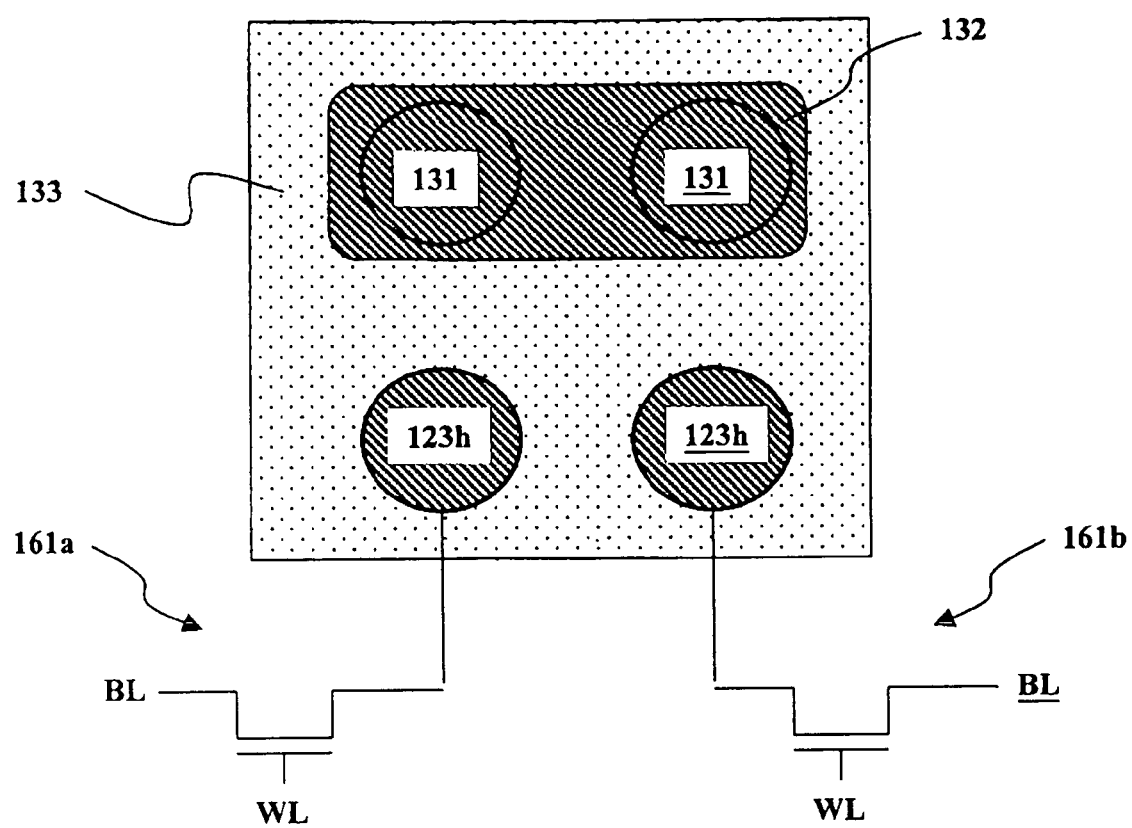

Using two inverters and two pass transistors on base semiconductor substrate, a six-transistor SRAM cell can be implemented as shown in FIG. 15b. The two inverters are VFLD and two transistors, which have word line and bit line, are on the base semiconductor substrate. FIGS. 15a and 15b show interconnection lines of top and bottom contacts, respectively. Two FLD inverters are latched with connecting inputs to outputs of each inverters. Counter parts of one VFLD inverter contacts 122a, 123h, 123f, 131 are shown with underlined 122a, 123h, 123f, 131. Therefore, such an SRAM cell has a high integration density. Especially, because the base semiconductor substrate does not need n-well for p-MOSFET in SRAM cell, integration density in the base semiconductor substrate is high. It is noted that if four pass transistors are used, a dual-port SRAM can be implemented.

There are many ways to implement SRAM cells in accordance with the present invention. A first way is by using four n-MOSFETs on a base semiconductor substrate and two p-MOSFET type FLDs. A second way is by disposing two p-MOSFETs on the base semiconductor substrate and four n-MOSFET type FLDs. A third way is by disposing two p-MOSFET type FLDs on a SOI layer and four n-MOSFET type FLDs on another SOI layer. A fourth way is by using a four-transistor SRAM cell that has either four n-MOSFET type FLDs or four n-MOSFETs on the base semiconductor substrate, and resistors could be either formed on an FLD layer or polycrystalline semiconductor resistors may be used.

Figure 7C:
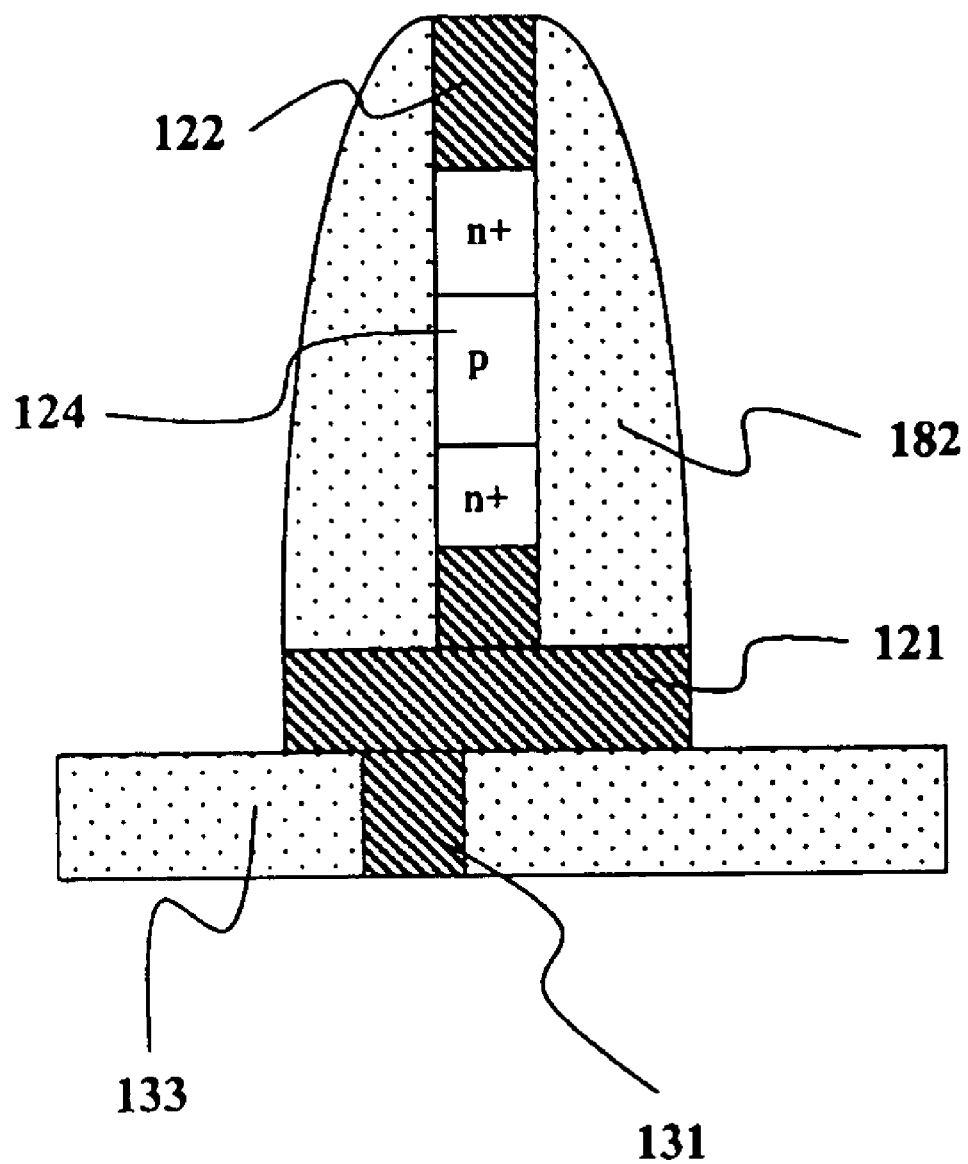
Figure 16A:
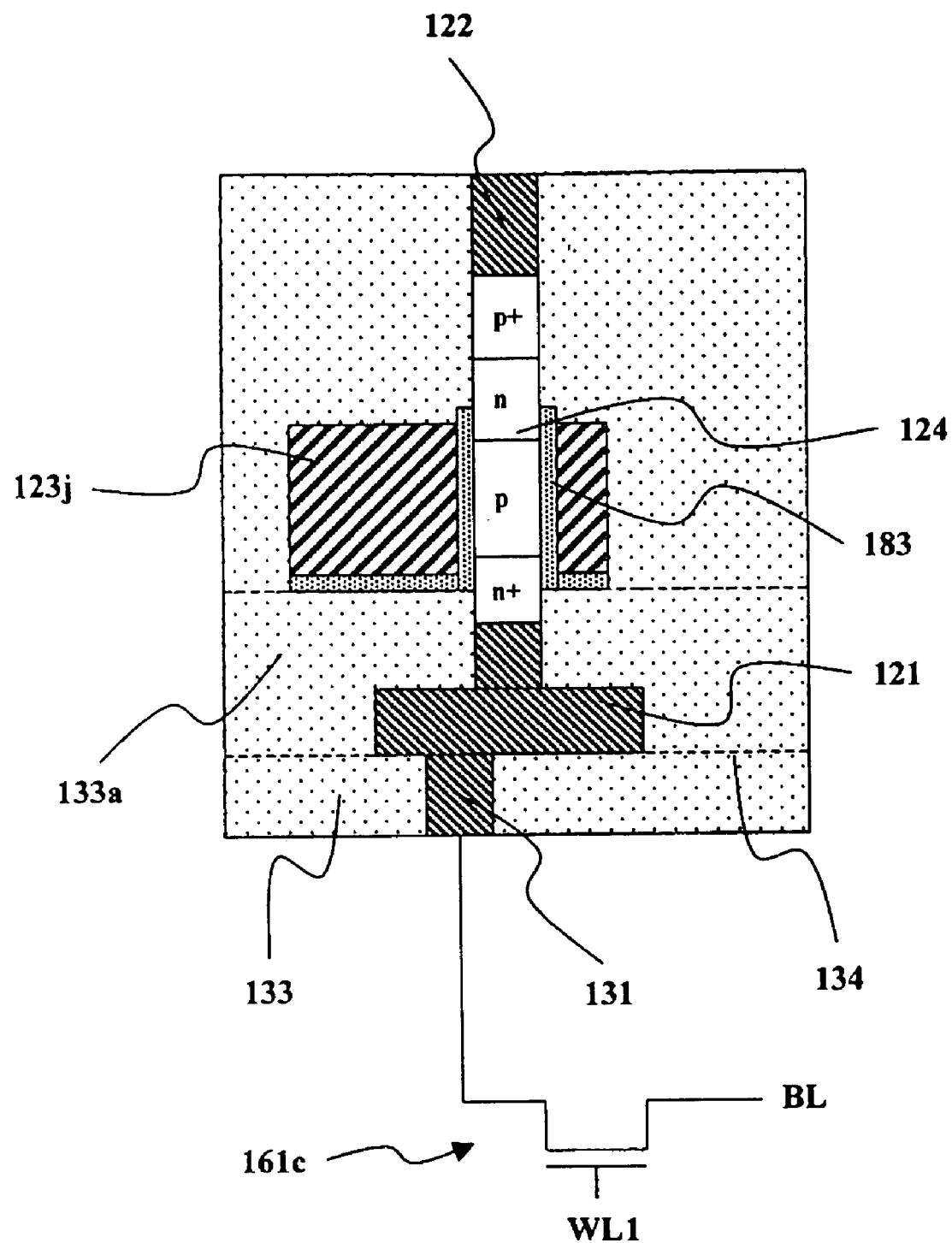
FIG. 16a is a cross-sectional view of an embodiment of the present invention having a vertically oriented Thyristor as part of an SRAM cell.
Figure 16:
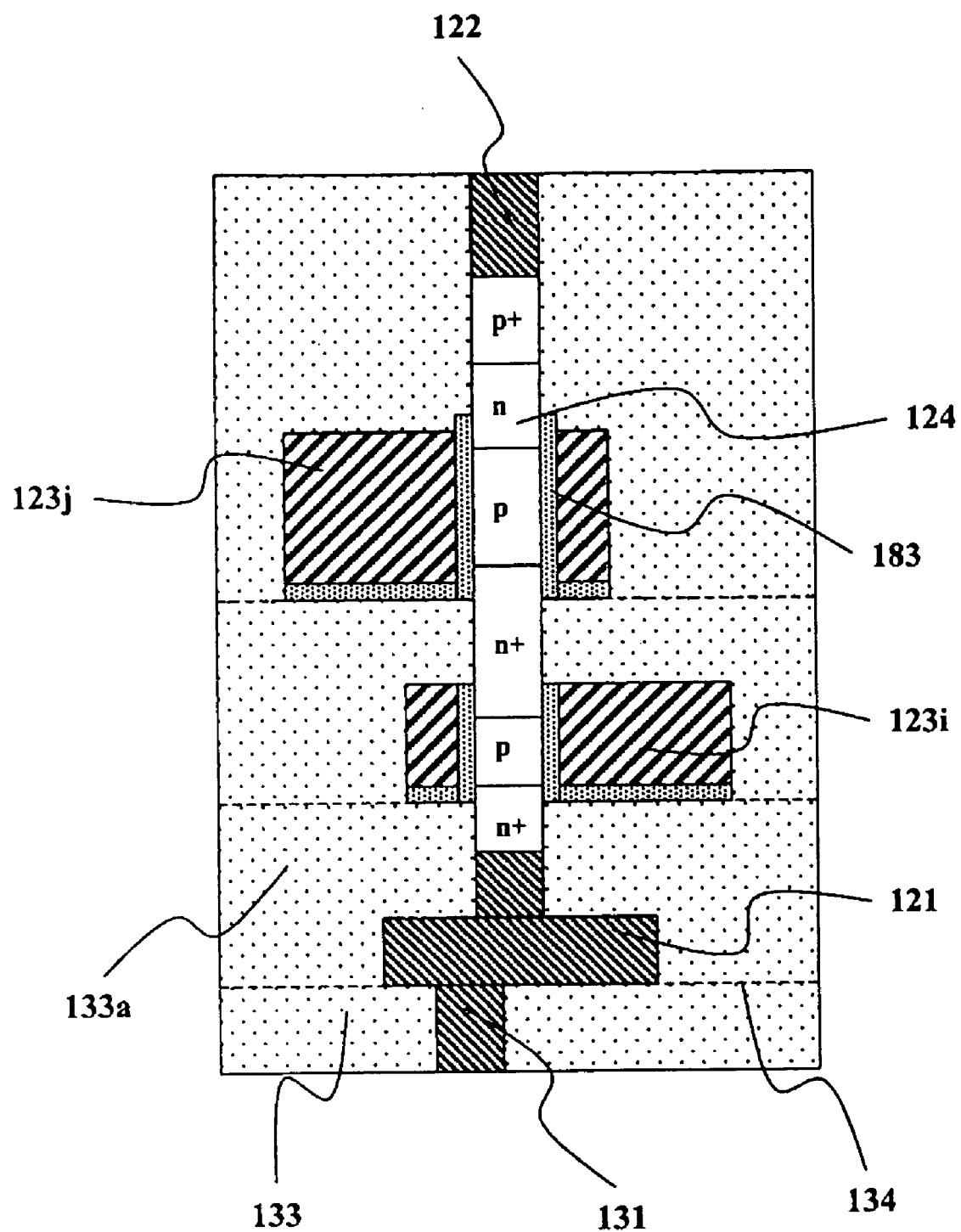
FIG. 16b is a cross-sectional view of an embodiment of the present invention having a both a Thyristor and a MOSFET vertically disposed and serially connected in the SOI layer.
Figure 17A:
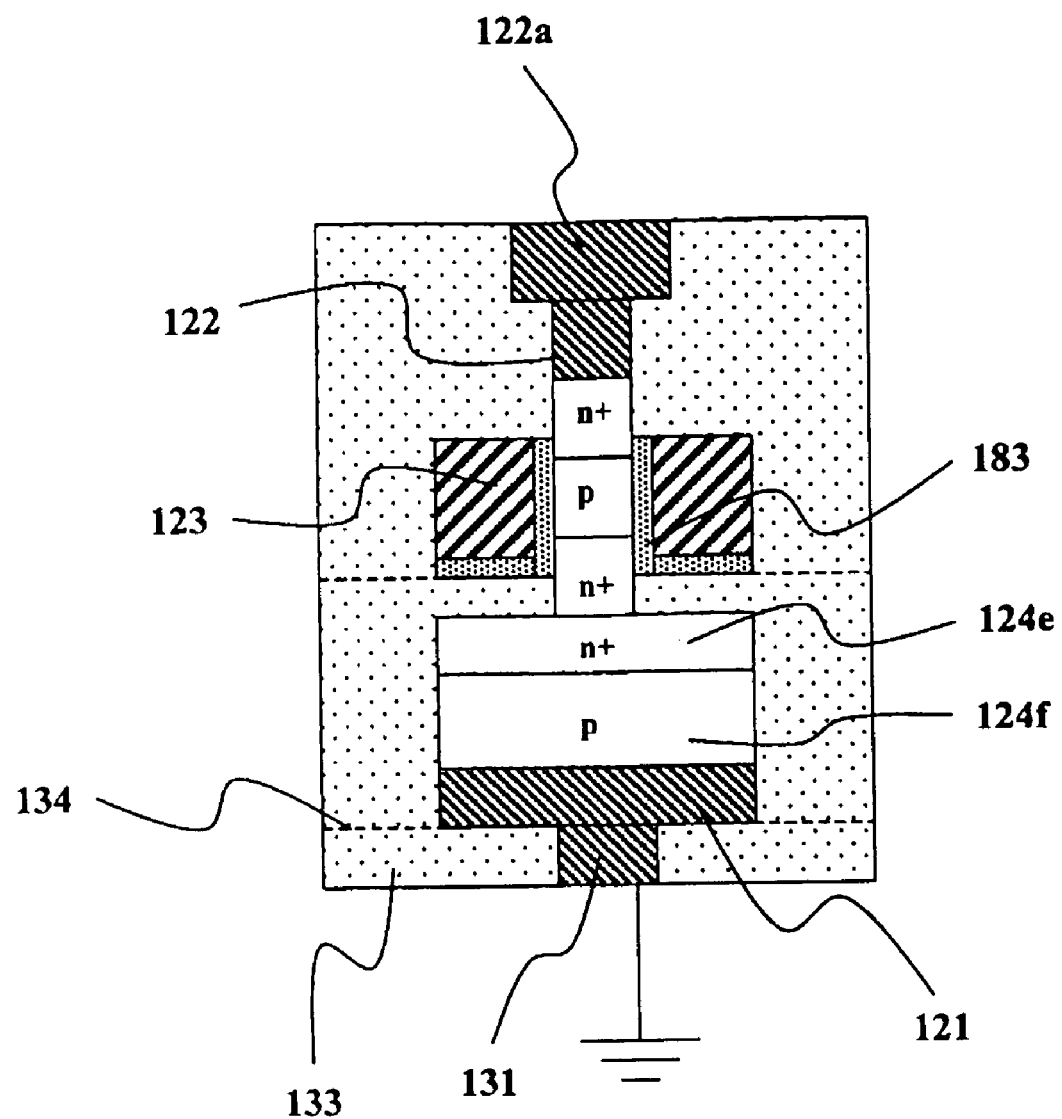
FIG. 17a is a cross-sectional view of an embodiment of the present invention having a vertical DRAM cell with vertical connection of a depletion capacitor and a MOSFET in the SOI layer.
Figure 17B:
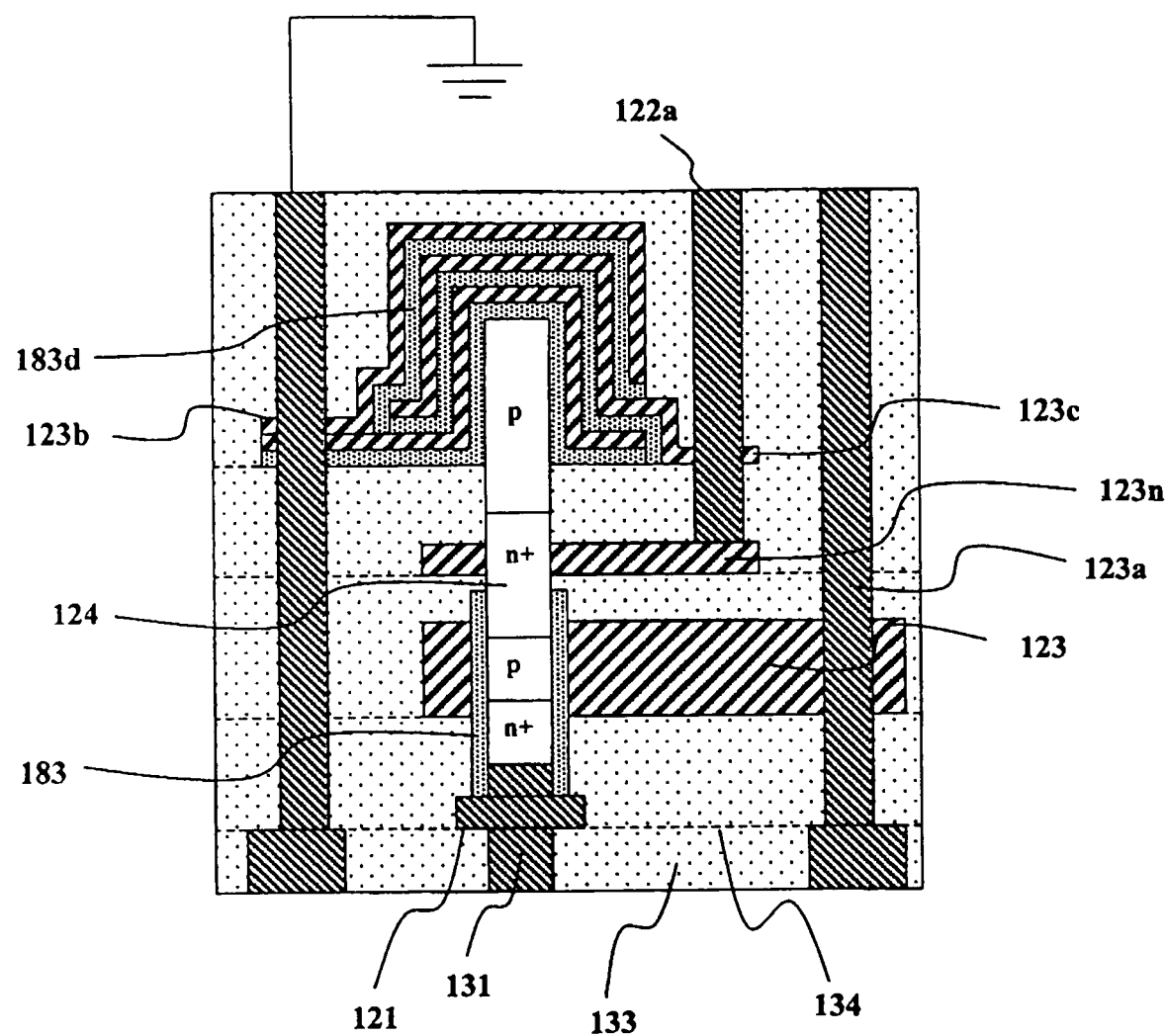
FIG. 17b is a cross-sectional view of an embodiment of the present invention having a vertical DRAM cell with vertical connection of a dielectric capacitor and a MOSFET in the SOI layer.

A prior art SRAM cell using a Thyristor has a complicated structure which has a vertical Thyristor and a horizontal MOSFET on same semiconductor substrate. Therefore, this SRAM has process incompatibility with other devices and it is not good for SoC applications. FIG. 16a shows a VTFLD SRAM cell having a gate 123j in accordance the present invention. Intermediate electrode gate 123j is used for word line 2 and the top electrode is connected to reference voltage. The VTFLD is connected to horizontal access transistor 161c on base semiconductor substrate, therefore, each device can be optimized, and high density is provided for SoC applications. The gate of the access transistor is used for word line 1 (WL1). FIG. 16b shows another structure of SRAM cell shown in FIG. 16a, which vertically connects the access transistor 161c and Thyristor and eventually forms a VFLD SRAM cell. The Thyristor gate 123j and access transistor gate 123i are all intermediate electrodes. VTFLD in FIG. 16a could be the same SRAM cells shown in U.S. Pat. No. 6,225,165B and U.S. Pat. No. 6,172,899. A Dynamic Random Access Memory (DRAM) cell in accordance with the present invention has one transistor and one capacitor, where the transistor could be on the base semiconductor substrate or could be a VMFLD on an FLD IC layer, and the floating source of the transistor is connected to a VCFLD on another FLD IC layer. VCFLDs are shown in FIGS. 11a–11b. Or, from the multiple SOI layers consisting one FLD IC layer, one SOI layer having a transistor and the other SOI layer having a capacitor are connected to form a DRAM structure. Another VFLD DRAM structure has serial connection of a transistor and a capacitor in a SOI layer. FIG. 17a shows a DRAM structure having an n-type MOSFET and a depletion capacitor connected in series therewith. The top electrode 122 is connected to a bit line and intermediate electrode 123 is connected to a word line. In FIG. 17a, a depletion region, which is formed between a floating n+ source 124e and a p-region 124f connected to bottom electrode 121, has wider width than does the n-type MOSFET, where the wider semiconductor region could be implemented using spacer technology without additional photo process operations as shown in FIGS. 7a–7c. FIG. 17b shows that a MOSFET having floating source and a dielectric capacitor are connected in parallel, where the floating source p-region is connected to a reference voltage source (not shown). In FIG. 17b, bottom electrode 121 is connected to a bit line and intermediate electrode 123 is connected to a word line.

Figure 18A:
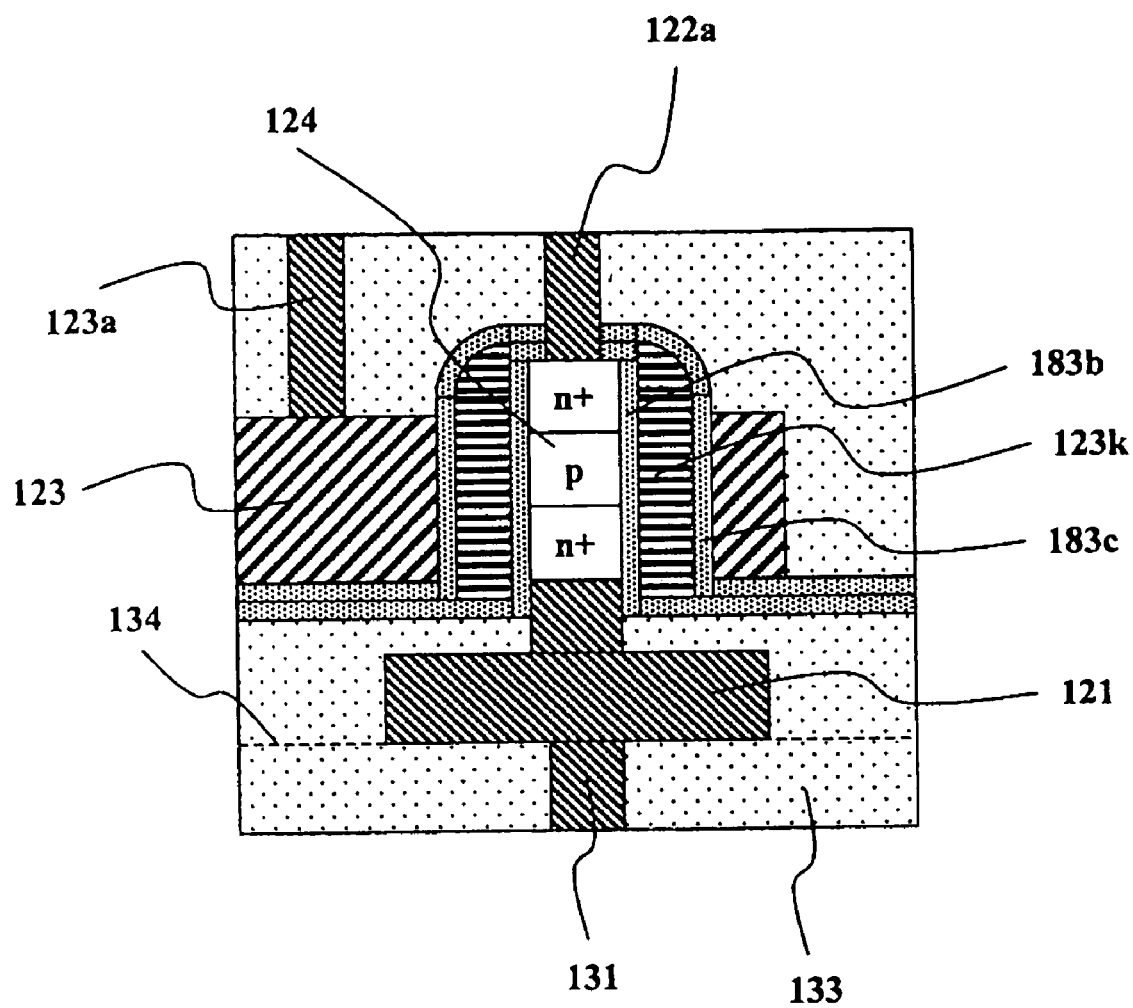
FIG. 18a is a cross-sectional view of an embodiment of the present invention having a vertical Non-Volatile Memory (NVM) cell that includes a floating gate and a control gate in the SOI layer.
Figure 18B:
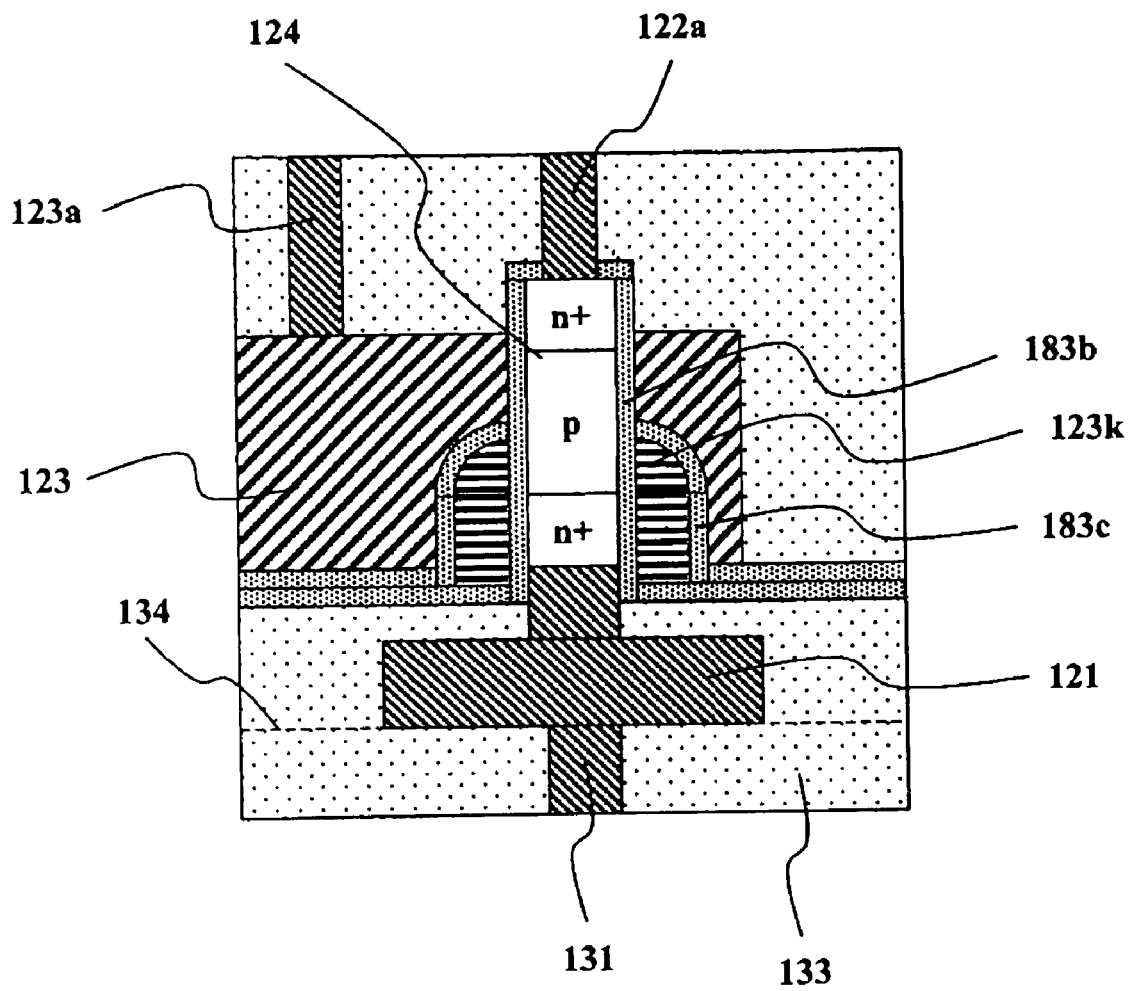
FIG. 18b is a cross-sectional view of an embodiment of the present invention having a vertical NVM cell that includes a floating gate that partially covers the channel region, and a control gate that covers the floating gate and the rest of the channel region in the SOI layer.
Figure 18C:
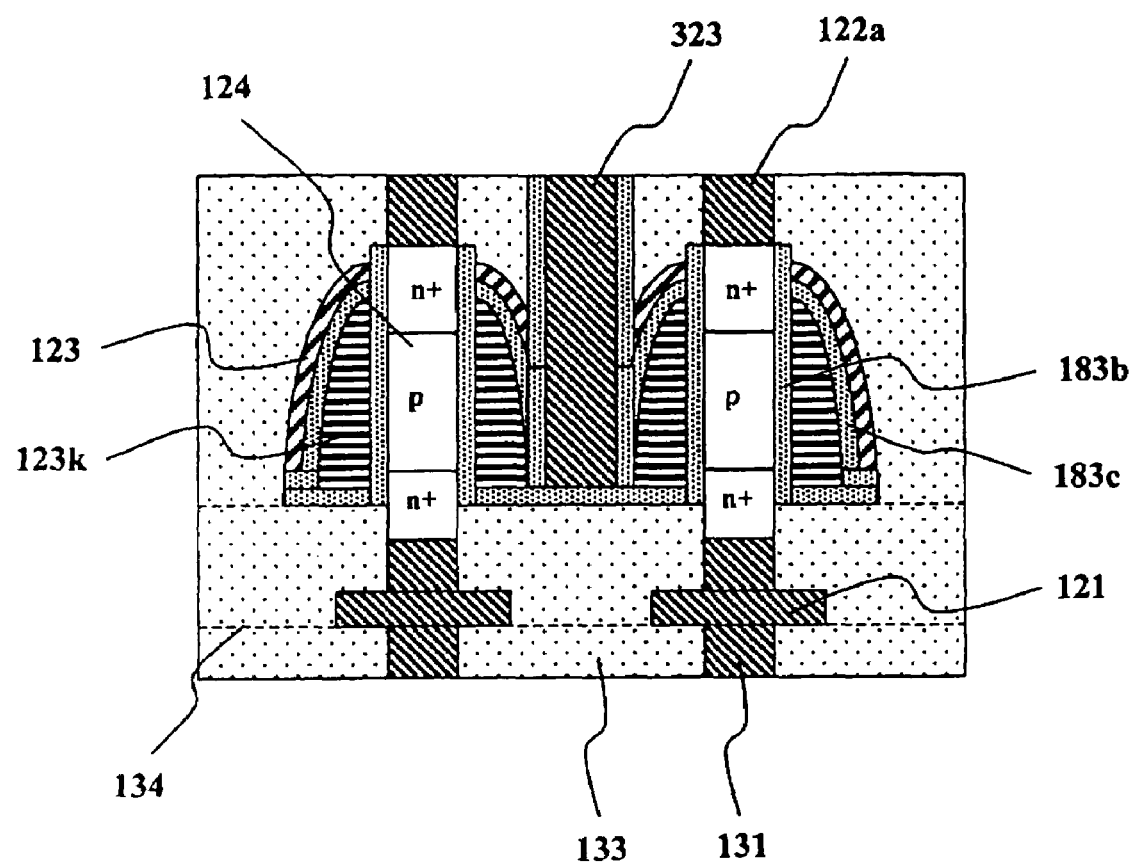
FIG. 18c is a cross-sectional view of an embodiment of the present invention having a vertical NVM cell with a floating gate, a control gate, and a erase gate in a SOI layer.
Figure 18D:
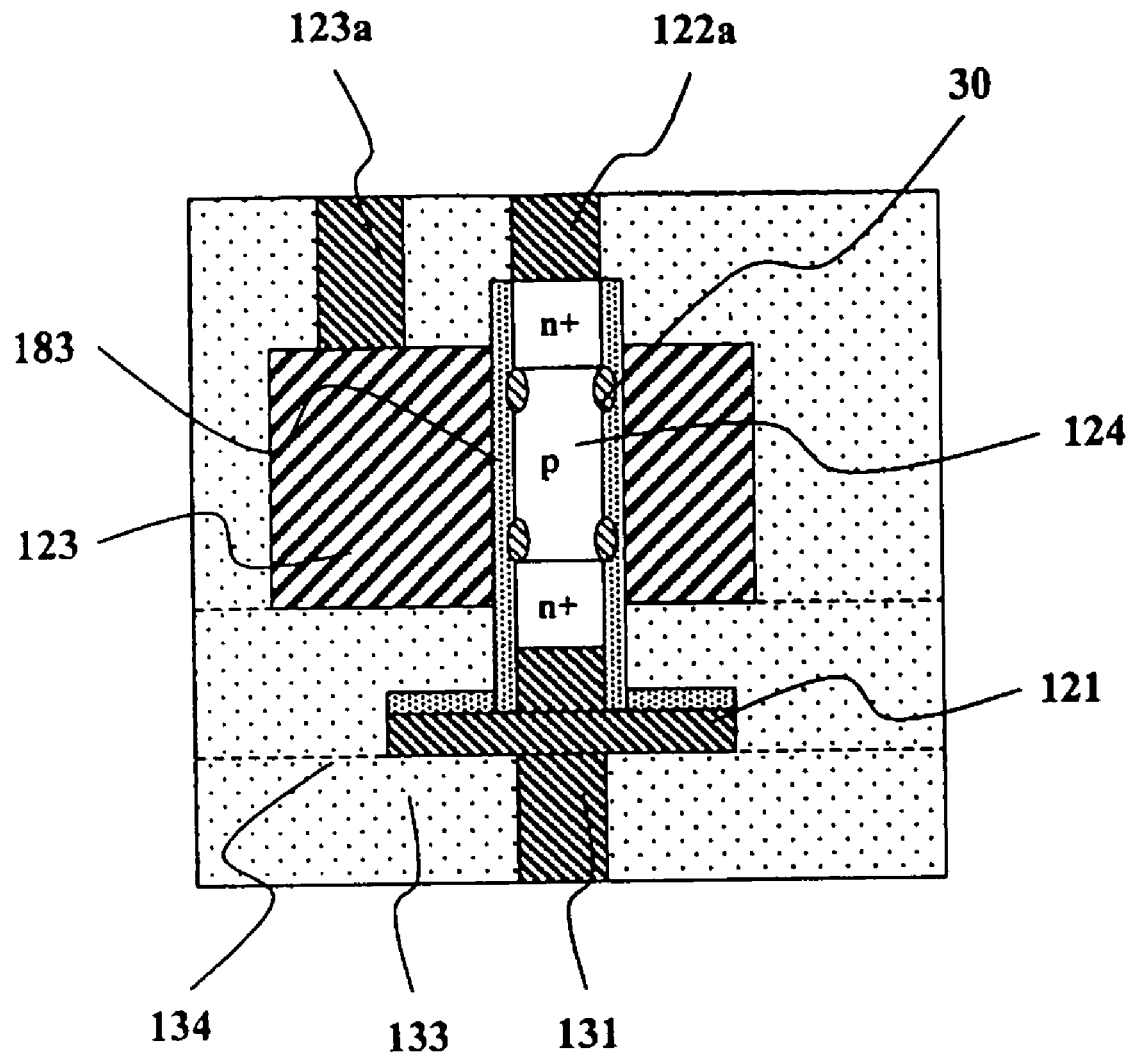
FIG. 18d is a cross-sectional view of an embodiment of the present invention having a vertical NVM cell with an Oxide-Nitride-Oxide (ONO) gate in the SOI layer.
Figure 18E:
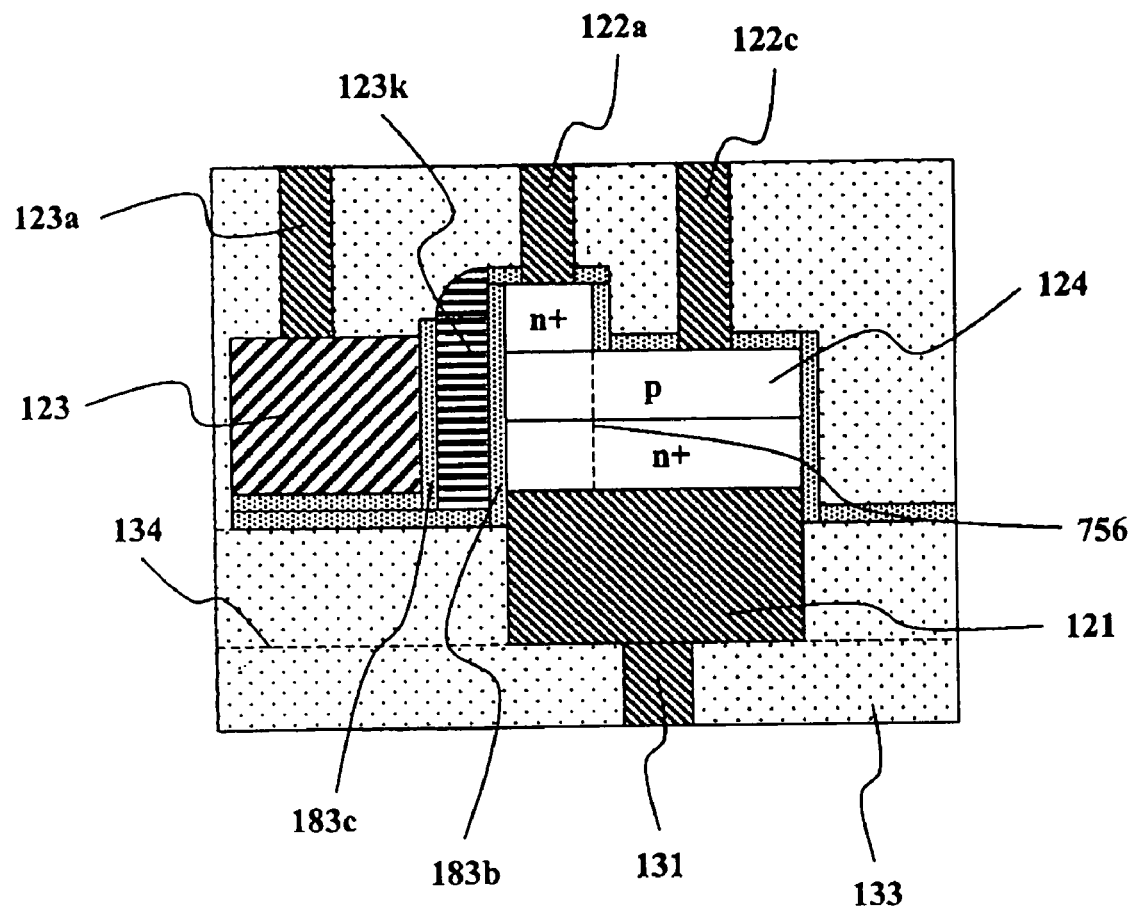
FIG. 18e is a cross-sectional view of an embodiment of the present invention which has a vertical NVM cell with a floating gate, a control gate, and a bulk contact, all disposed in the SOI layer.

A nonvolatile FLD memory structure in accordance with present invention is shown in FIGS. 18a–18f. FIG. 18a has two gates, where one floating gate surrounds a p-type channel region with gate dielectric layer 183b and control gate 123 connecting to bias surrounds floating gate 123k with another gate dielectric layer 183c. FIG. 18b shows a split gate nonvolatile memory, where floating gate 123k surrounds part of p-type channel region, and the rest of channel region and the floating gate 123k are surrounded by control gate 123. FIG. 18c has three gates: a floating gate 123k, a control gate 123, and an erase gate 323 which is designed to erase data. FIG. 18d shows a nonvolatile memory VFLD without a floating gate which has an ONO gate dielectric layer 183, where information can be stored at different locations 30 depending on current flow. FIG. 18e shows a flash memory FLD structure with bulk contact 122c on p-type bulk region 124. VMFLD could have a bulk contact without gate dielectric layer on one side and gate contact with gate dielectric layer on the other side.

Figure 18F:
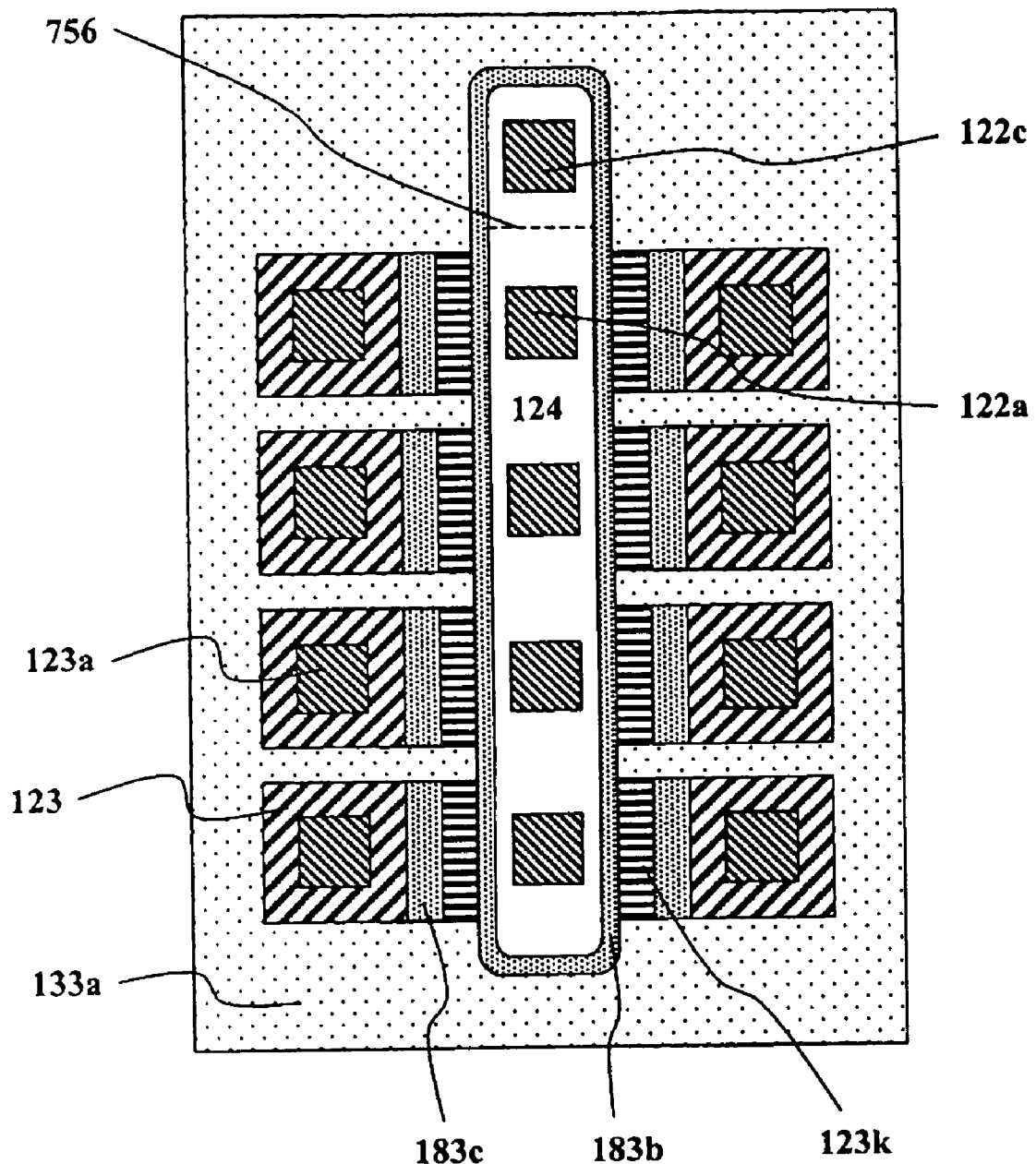
FIG. 18f is top view of the structure of FIG. 18a with eight gates in the SOI layer.

One of advantages of embodiments of the present invention is that nonvolatile memory could be a ML-VMFLD which stores multi bit information in a FLD. As shown in FIG. 18f, an FLD having one source/drain has eight separated gates, and then one FLD has eight multi-bit memory cell. FIG. 18f has a bulk contact 122c and rest contacts are connected to source/drain at SOI layer which is forming FLD. In FIG. 18e, dashed line "756" shows the borderline of an exposed FLD bulk region from the top FLD. Rest contacts 122a on SOI region 124 are connected to source/drain. If the nonvolatile memories in FIGS. 18a–18c, source and drain have different doping concentration, multi bit nonvolatile memory could be achieved depending on device operation similar to ETOX.

In one embodiment of the present invention, FLD memory devices may have redundancy on the same or different FLD IC layers.

Figure 19A:
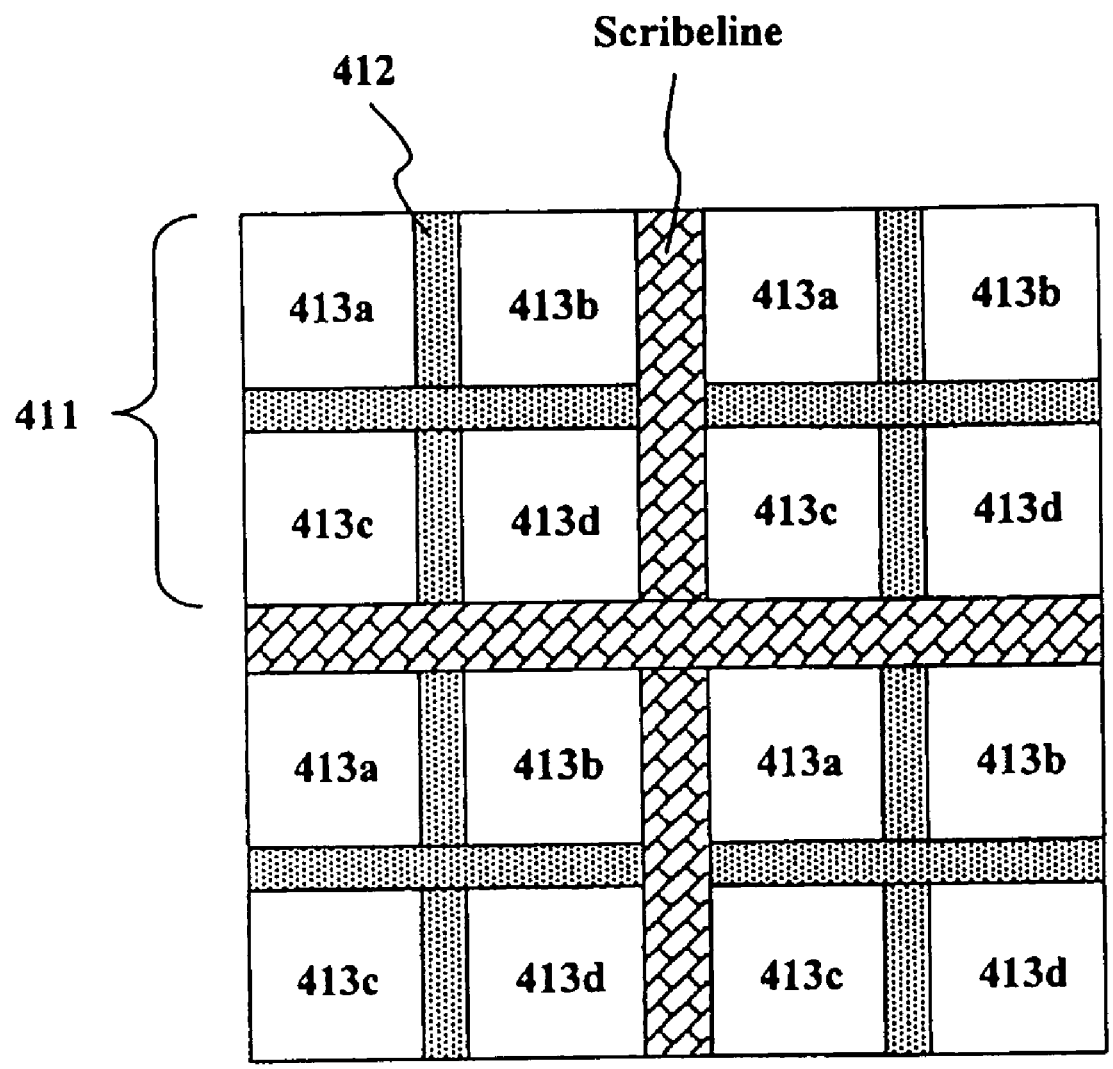
FIGS. 19a–19b illustrate layouts of SOI layers that have multiple blocks containing different types of devices.
Figure 19B:
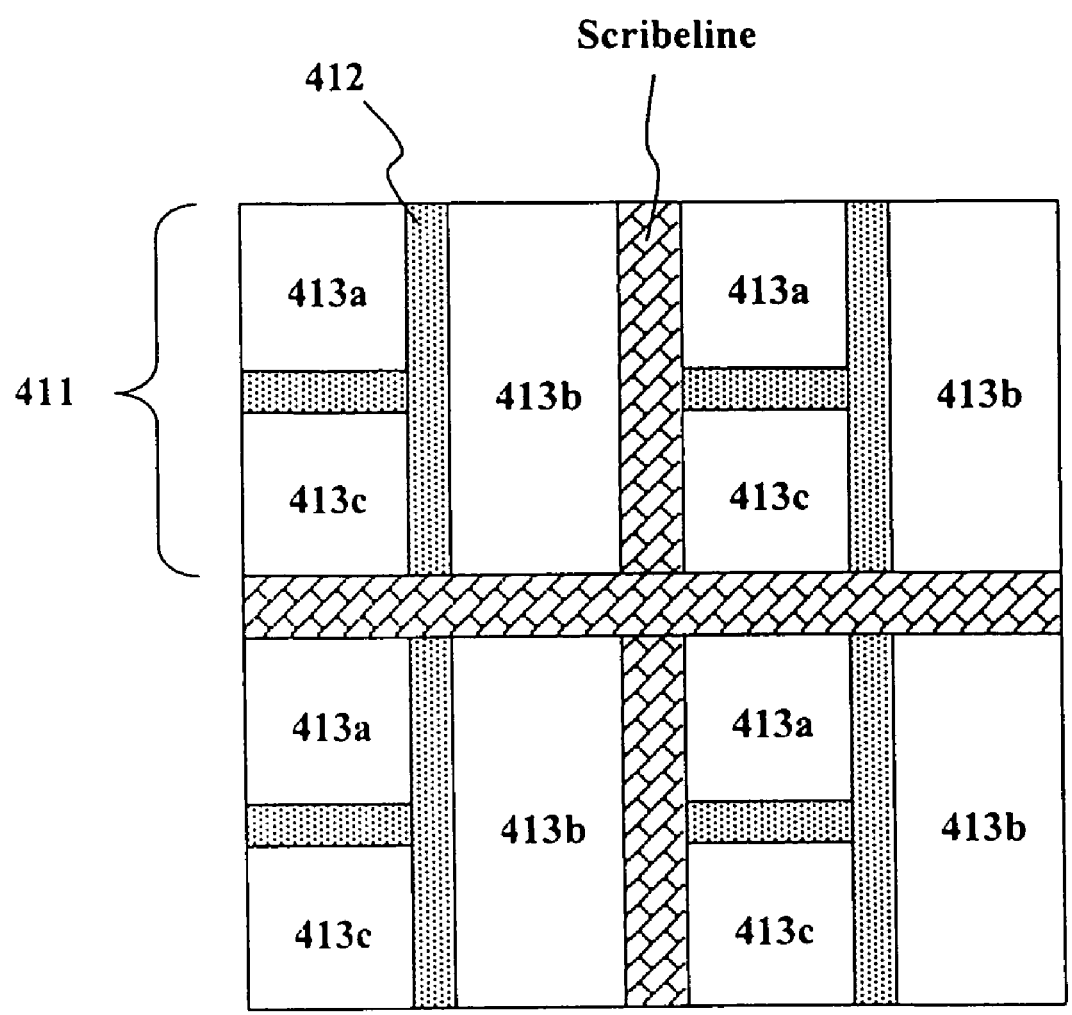

One embodiment of the present invention may have block regions in a FLD IC layer as shown in FIGS. 19a–19b, where each block has different type of FLDs. FIGS. 19a and 19b are top views of an FLD IC, and each chip 441 is distinguished by a scribeline. For example, one FLD IC layer has four blocks 413a–413d, where a first block has a programmable FPGA, a second block has a flash memory, a third block has bipolar devices, and a fourth block may have an SRAM. Each block may require different impurity junctions for different device types, where the impurity junctions should be formed before SOI layer transfer processing in case of LT-FLD. The block FLD formation needs wafer alignment marks at SOI substrate and base substrate. In this case, it is better to have Overlay Error Compensation Area (OECA) 412 considering wafer misalignment, where the OECA may have a few microns to hundreds micron distance.

Figure 20A:
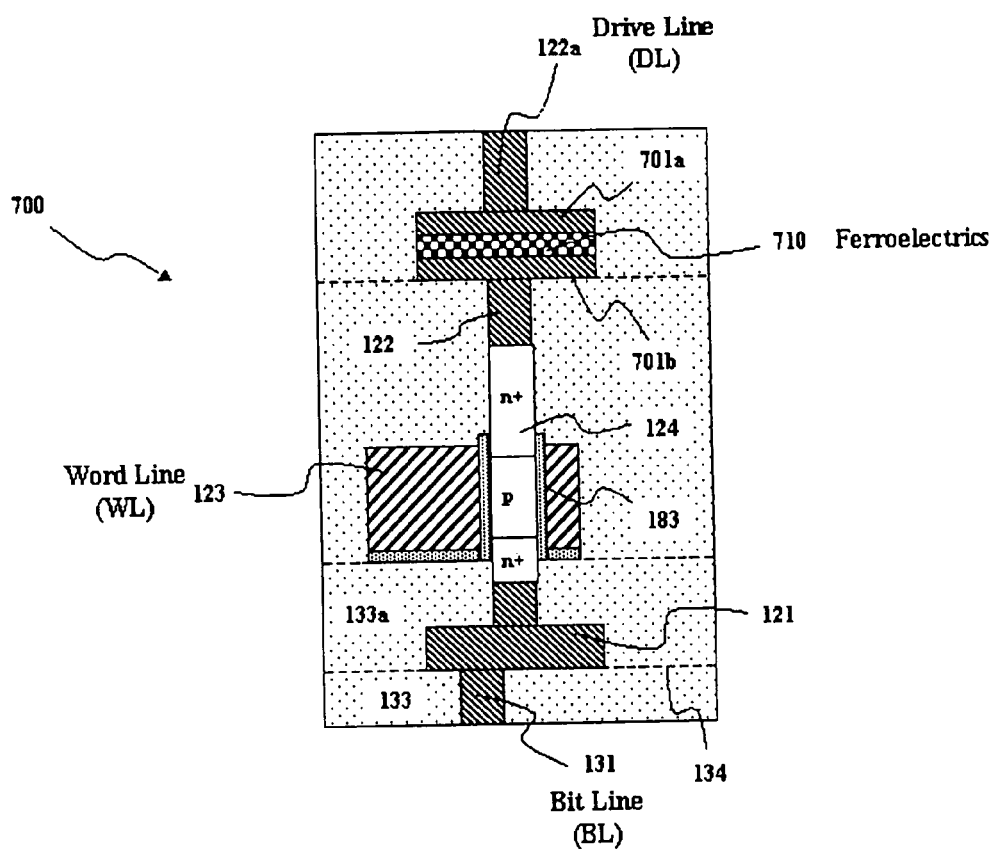
FIG. 20a is a cross-sectional view of an embodiment of the present invention having a vertical NVM cell that includes a MOSFET serially connected to a capacitor, which uses ferroelectric material, both disposed in the SOI.

FIG. 20a shows a nonvolatile memory cell 700 with a capacitor using a ferroelectric film 710, and a VFLD connected in series to the capacitor. The nonvolatile memory using ferroelectric film 700 is called an FRAM (Ferroelectric Random Access Memory). Conventional ferroelectrics are $(PbZr)TiO_3$ (referred to as PZT), $SrBi_2Ta_2O_9$ (referred to as SBT), and $YMnO_3$. If an electric field is applied to such a ferroelectric, then the ferroelectric has a polarization characteristic. In FIG. 20a, FRAM cell 700 has serially connected a ferroelectric capacitor and a VMFLD. Gate 123 of VMFLD is Word Line (WL) and the drain is Bit Line (BL), and the source is connected to the ferroelectric capacitor and the other electrode 122a is connected to Drive Line (DL or Plate Line).

Figure 20B:
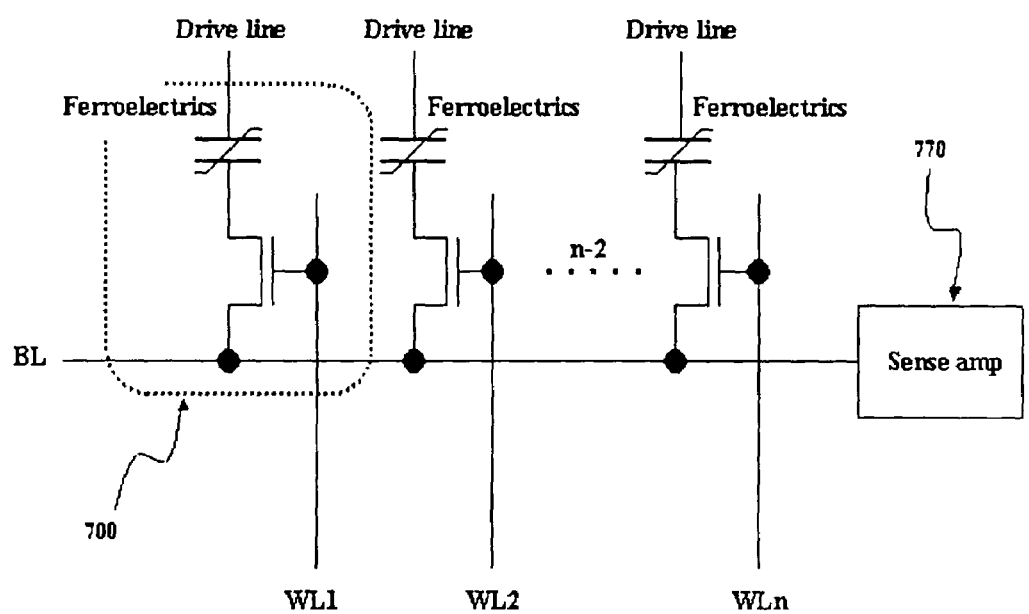

FIG. 20b shows an equivalent circuit of FRAM memory cell 700, where logic devices for sense amp 770 are generally implemented on base substrate and FRAM cell 700 including VMFLD is implemented in SOI layer.

Figure 20C:
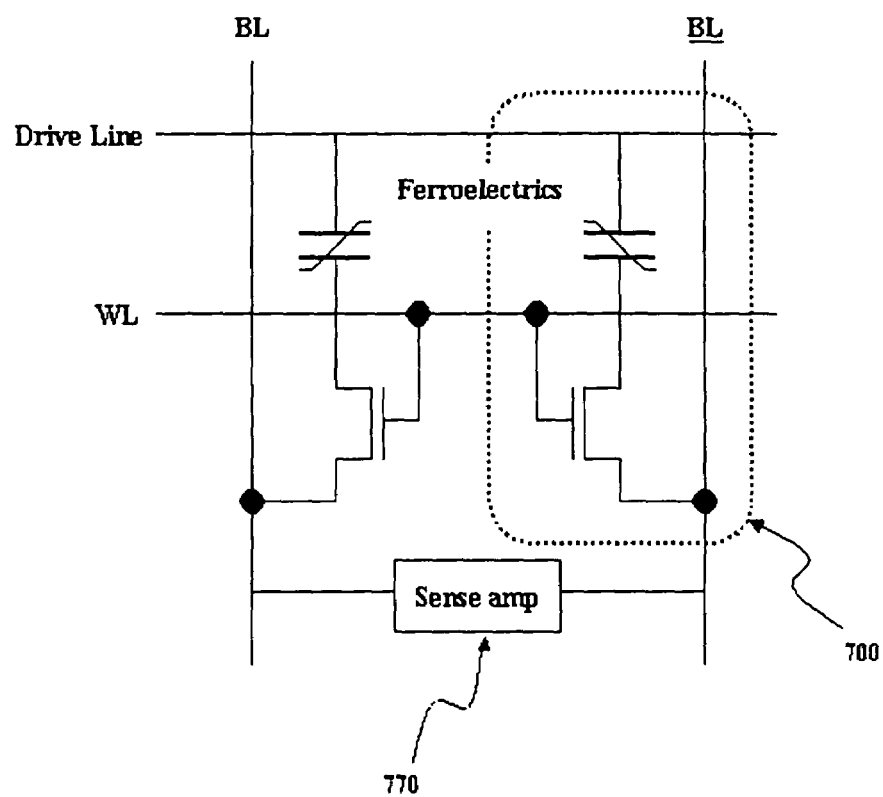

FIG. 20c shows one memory bit using two FRAM cells shown in FIG. 20a, where logic devices for sense amp 770 are generally implemented on base substrate 103 and FRAM cell 700 including VMFLD is implemented in SOI layer.

Figure 21A:
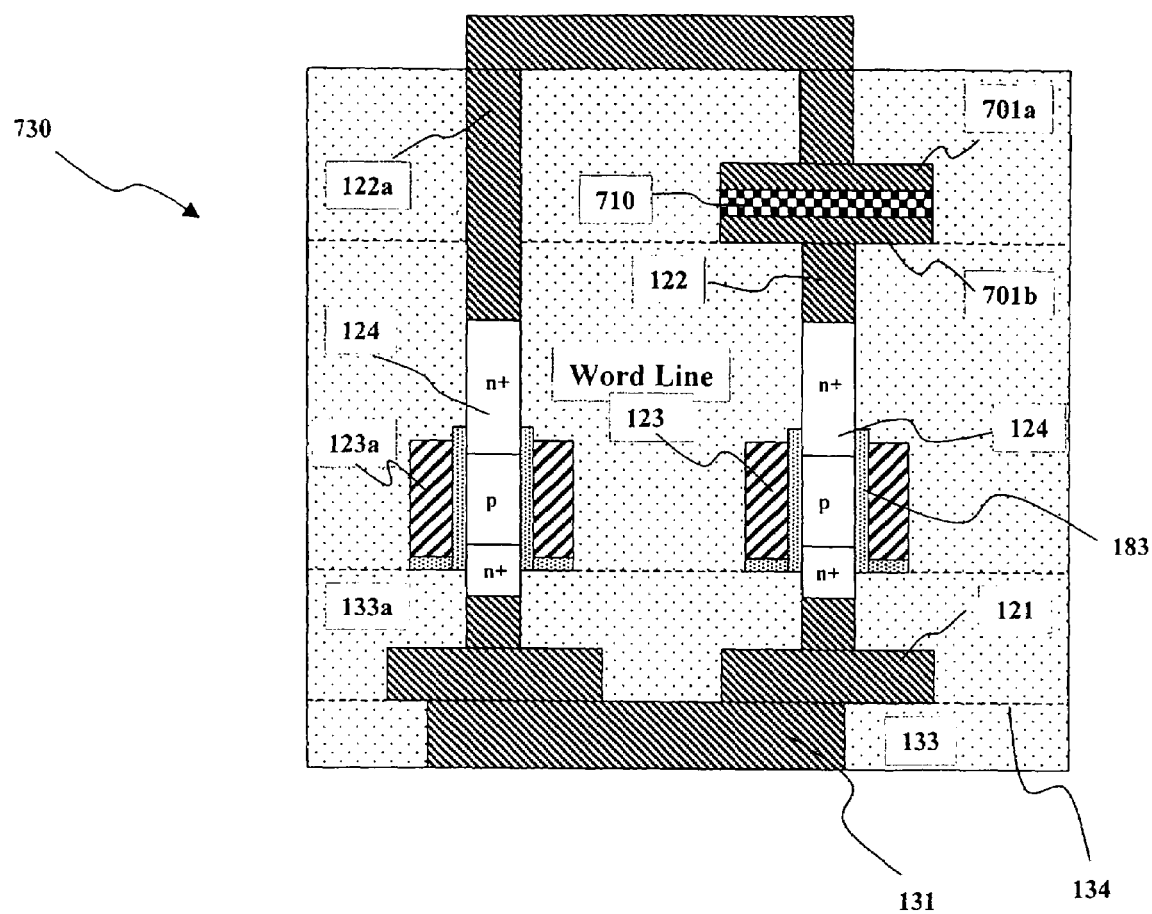

FIG. 21a shows a nonvolatile memory cell 730 with a capacitor using ferroelectric film 710 and a VFLD connected in parallel to the capacitor. The parallel connection FRAM operates at higher speed and has lower power consumption compared to a serially connected FRAM cell. One intermediate electrode 123 is the WL. The other intermediate electrode 123a has an applied reference voltage and keeps constant current status for parallel connecting the ferroelectric capacitor and VFLD.

Figure 21B:
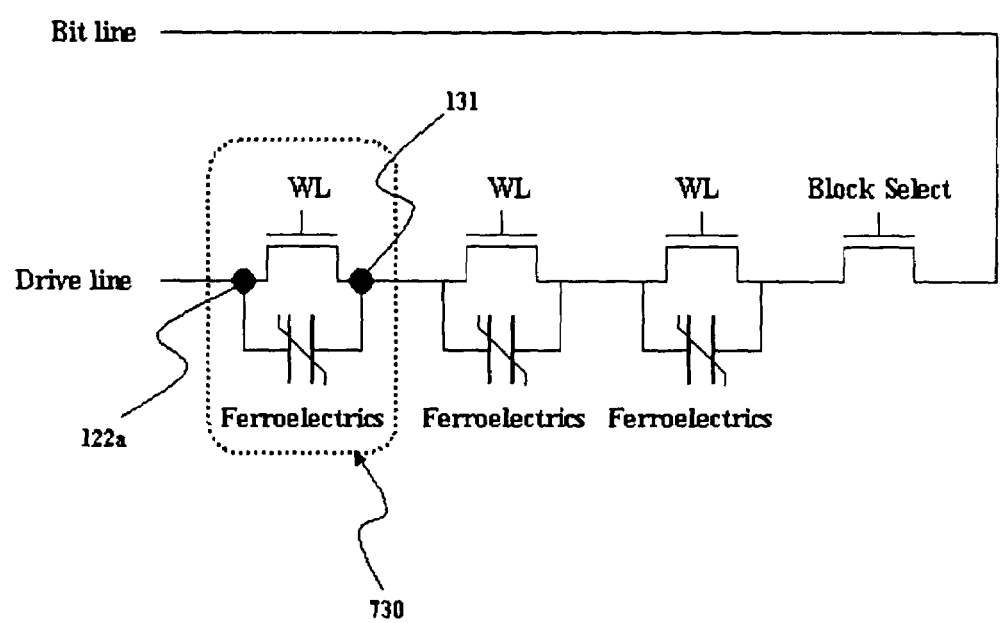

FIG. 21b is an equivalent circuit of FRAM cell 730. FRAM cells 730 are chained to form a byte.

A capacitor using ferroelectric film 710 is located at the top of the VFLD in FIGS. 20a and 21a. However, the capacitor using ferroelectric film 710 could be located at the bottom of the VFLD. Also the VFLD could be a MOSFET, bipolar, or other type of transistor.

Figure 22A:
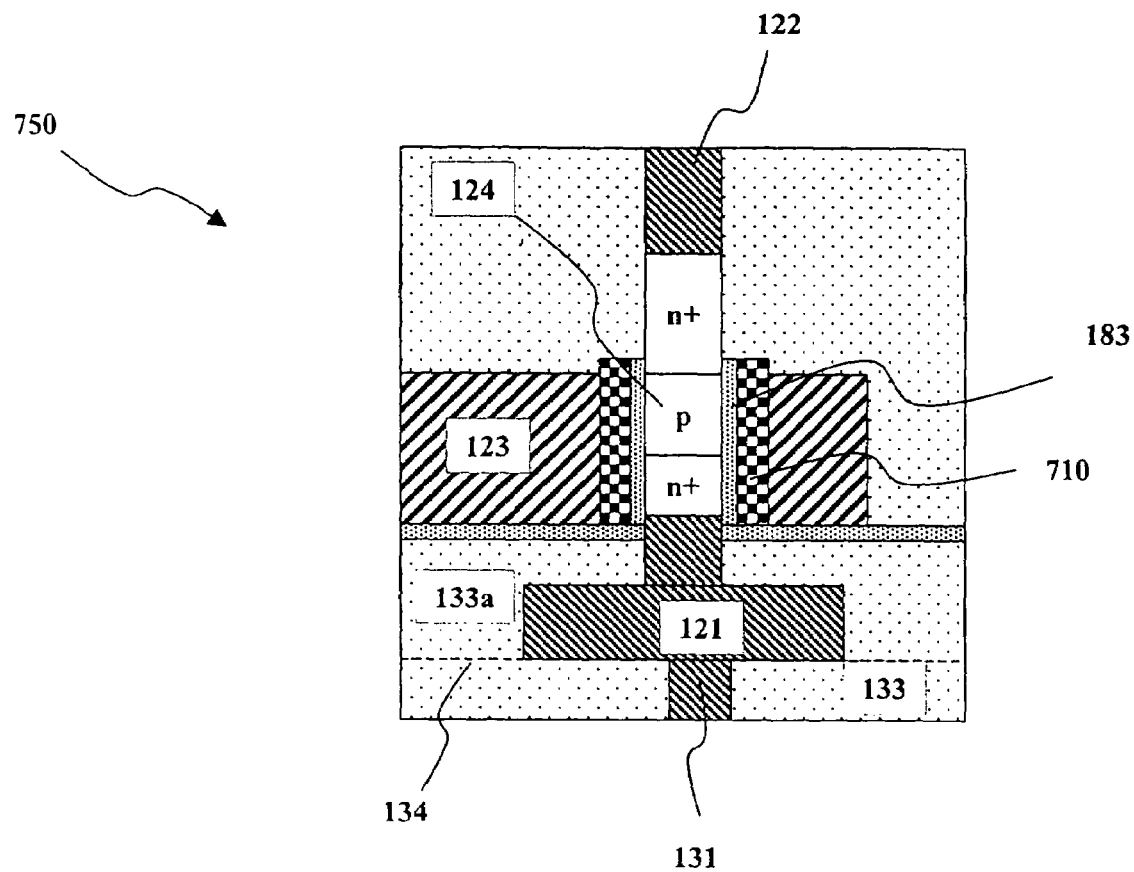
FIG. 22a is a cross-sectional view of an embodiment of the present invention that includes a vertical NVM cell with a MOSFET in the SOI layer and uses a ferroelectric material between the gate and gate dielectric layers.

FIGS. 22a and 22b show nonvolatile VMFLDs 750 which have ferroelectric film 710 as part of a VMFLD structure. In FIG. 22a, a FRAM has ferroelectric film 710 located in between a gate dielectric layer 183 and gate electrode 123. This is called a Metal Ferroelectric Insulator Silicon (MFIS). Gate dielectric layer 183 is a typical MOSFET gate dielectric layer and can be formed, for example, of silicon dioxide or oxynitride. If there is no gate dielectric layer 183 in FIG. 22a and ferroelectric film 710 is used as a gate dielectric layer, then the device becomes a Metal Ferroelectric Silicon (MFS) type FRAM.

In FIG. 22b, ferroelectric film 710 is disposed between floating gate 123k and control gate 123 of a VMFLD, and it forms a Metal Ferroelectric Metal Insulator Silicon (MFMIS) type FRAM 760 FLD.

Ferroelectric film 710 used in the illustrative embodiments of FIGS. 20–22 should be implemented below 660° C. for low temperature FLD.

Figure 23A:
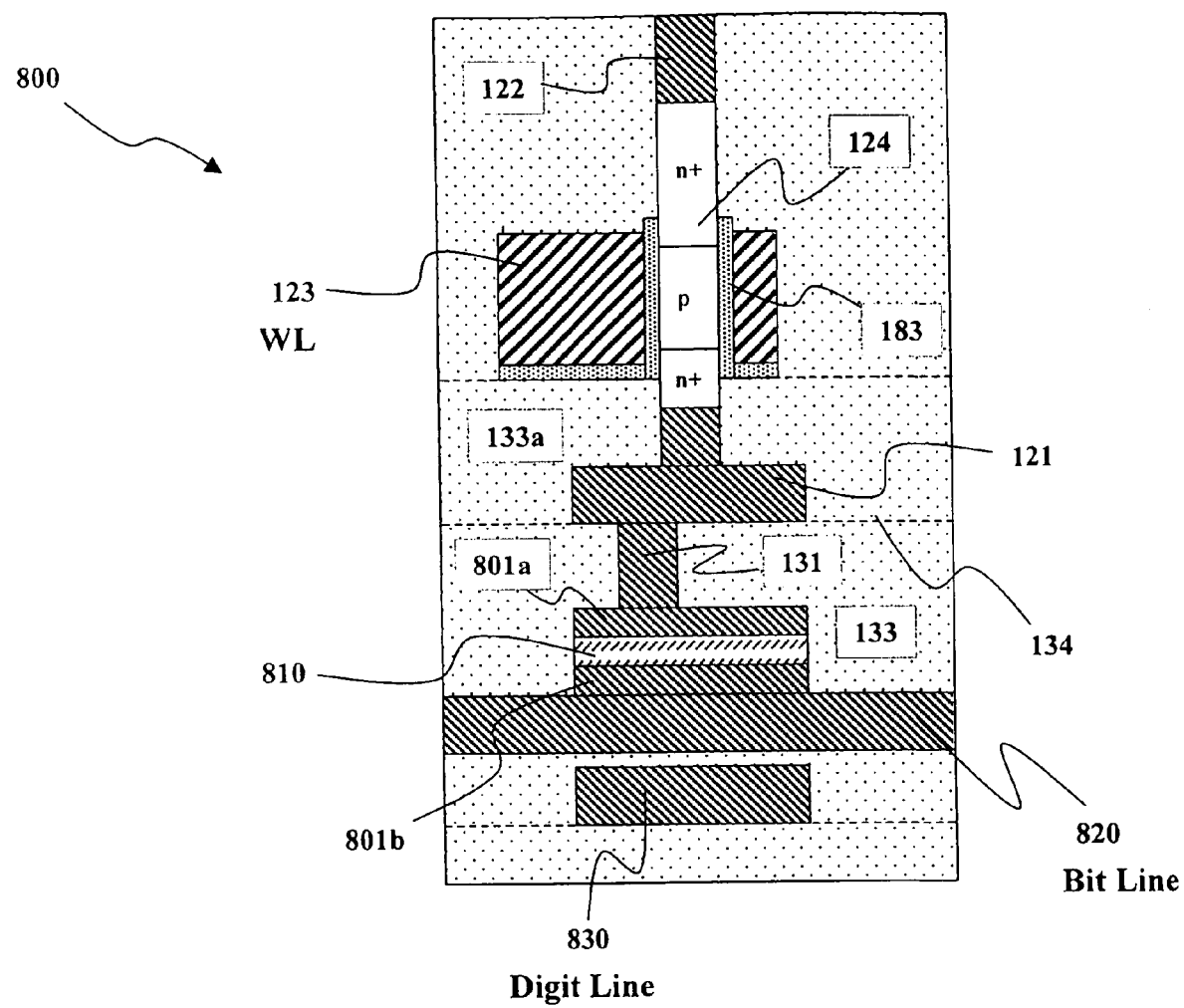
FIG. 23a is a cross-sectional view of an embodiment of the present invention that includes a vertically oriented NVM cell having a MOSFET in the SOI layer serially connected to a ferromagnetic material at the bottom of the MOSFET.

FIG. 23a shows a nonvolatile MRAM Magnetoresistive Random Access Memory, 800 cell structure using VMFLD and serially connected MJT Magnetic Tunnel Junction Stack, 810. In FIG. 23a, MJT 810 is located formed below ILD 133 and FLD 124.

Figure 23B:
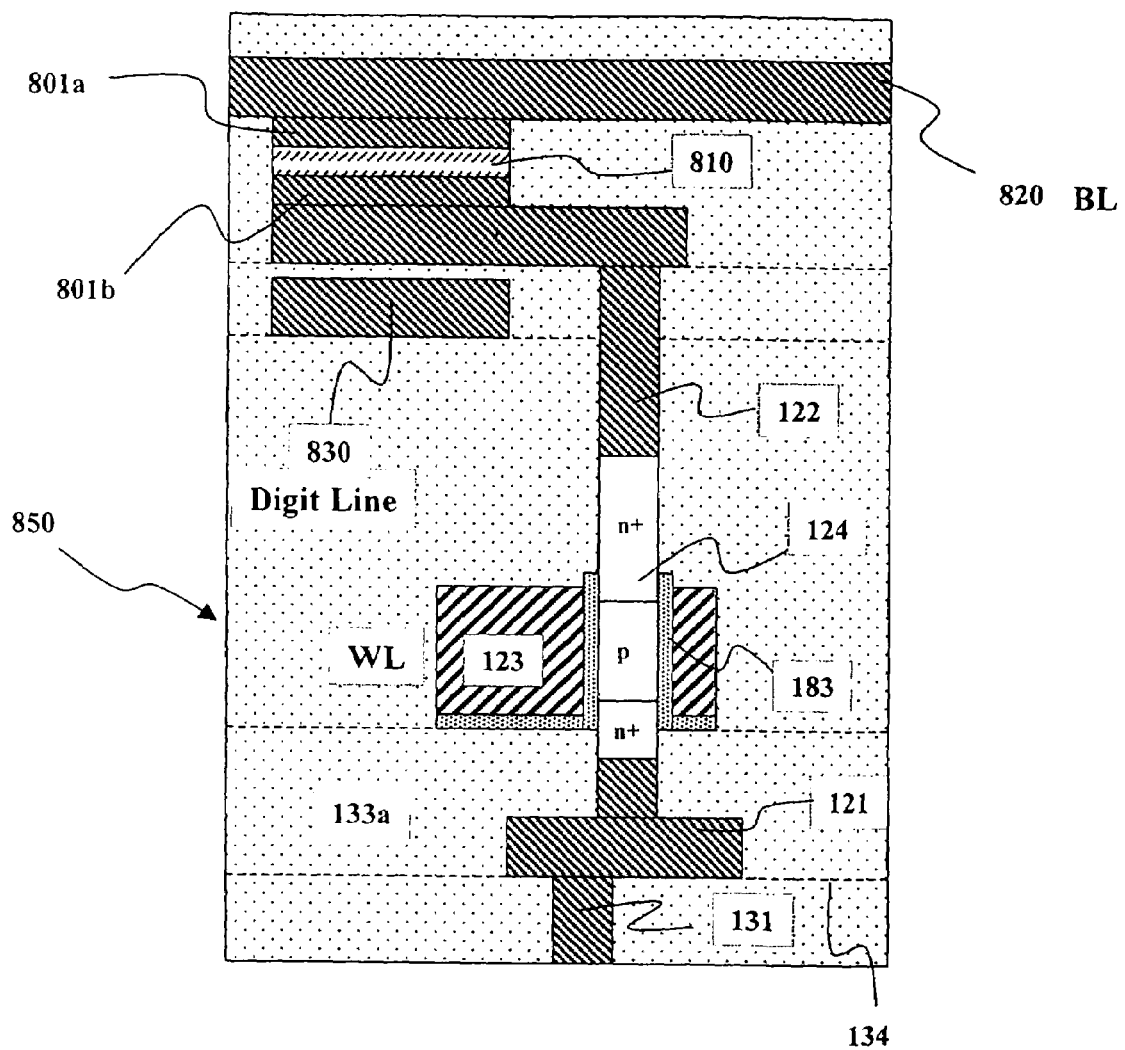
FIG. 23b is a cross-sectional view of an embodiment of the present invention that includes a vertically oriented NVM cell having a MOSFET in the SOI layer serially connected to a ferromagnetic material at the top of the MOSFET.

FIG. 23b also shows an MRAM cell 850 using MJT 810. MJT 810 is located formed above FLD 124.

MJT 810 has property of variable electric resistance depending on applied magnetic field, where the electric resistance changes depending on polarization of MJT 810. MJT 810 consists of multiple thin film layers. In general, one magnetic file is free layer which is polarized by applied magnetic field. The other magnetic film is pinned layer and, in general, used along with exchange layer which is antiferromagnetic layer. The pinned layer is polarized by applied magnetic field. Therefore, the film stack is called a Magnetic Tunnel Junction Stack (MJT). The MJT is not limited to a structure which has two magnetic films and a dielectric film. The MJT could have combinations of different thin layers. The MJT could be classified to two types by the stacked layers; one is Giant Magnetroresistance (GMR) using non-magnetic material, and the other one is Tunneling Magnetoresistance (TMR) using dielectric layer, such as oxide layer. The VFLD shown in FIGS. 23a and 23b could be MOSFET, bipolar, or MESFET.

Figure 24:
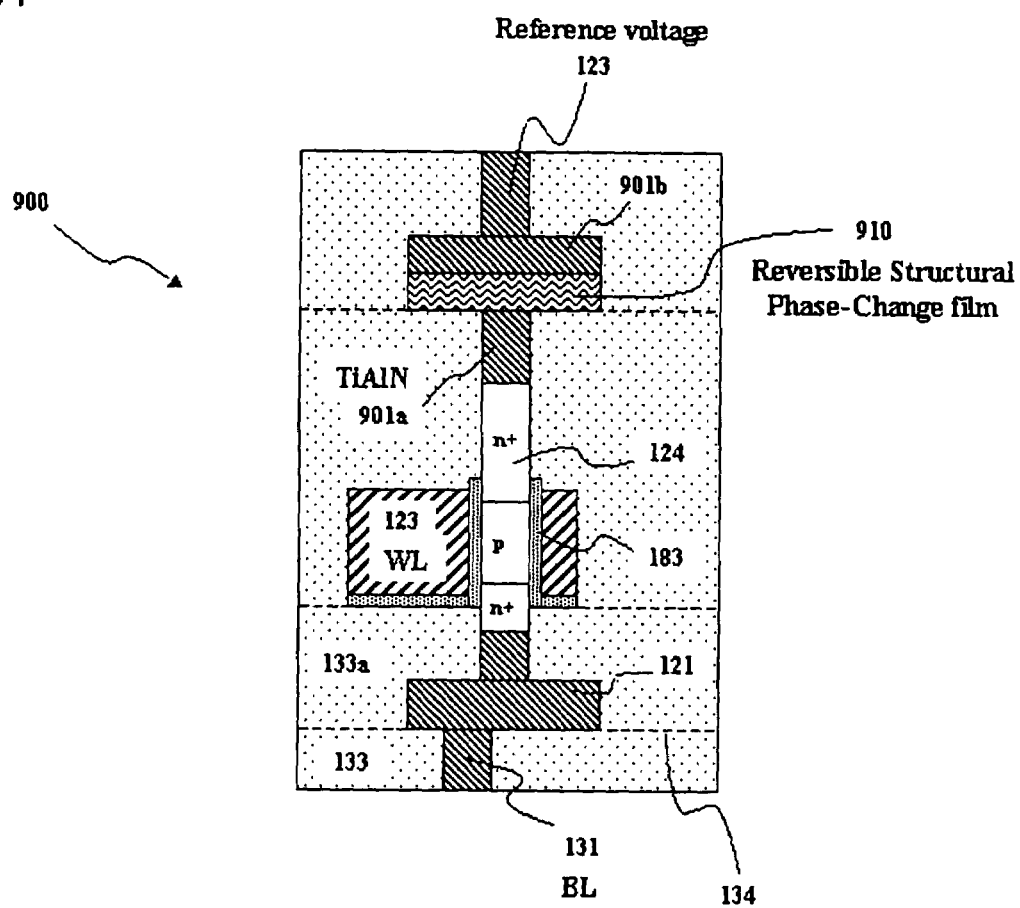
FIG. 24 is a cross-sectional view of an embodiment of the present invention that includes a vertically oriented NVM cell having a MOSFET disposed in the SOI layer that is serially connected to a resistor formed from a chalcogenide material.

FIG. 24 shows an Ovonic Unified Memory (OUM) 900 cell structure using a Reversible Structural Phase-Change Film (RSPCF) 910 and a serially connected VFLD. In FIG. 24, RSPCF 910 is implemented after formation of FLD 124 and placed above FLD 124. Or RSPCF 910 could be implemented before formation of FLD 124 and placed below FLD 124 (not shown). RSPCF 910 could have amorphous or polycrystalline phases depending on the amount of current and time, in other words, the temperature applied to RSPCF, where polycrystalline has lower electric resistance.

RSPCF 910 could be chalcogenides and alloy in VI element of Periodic Table. Therefore, RSPCF 910 could be alloy of Ge—Sb—Te, GaSb, InSb, InSe, $Sb_2Te_3$, GeTe, $Ge_2Sb_2Te_5$, InSbTe, GaSeTe, $SbSb_2Te_4$, InSbGe, AgInSbTe, (GeSn)SbTe, GeSb(SeTe), or $Te_{81}Ge_{15}Sb_2S_2$. Electrode 910a connected to RSPCF 910 could be TiAlN or TiW, which is stable at 650° C. The VFLD shown in FIG. 24 could be a MOSFET, a bipolar device, or a MESFET.

Figure 25:
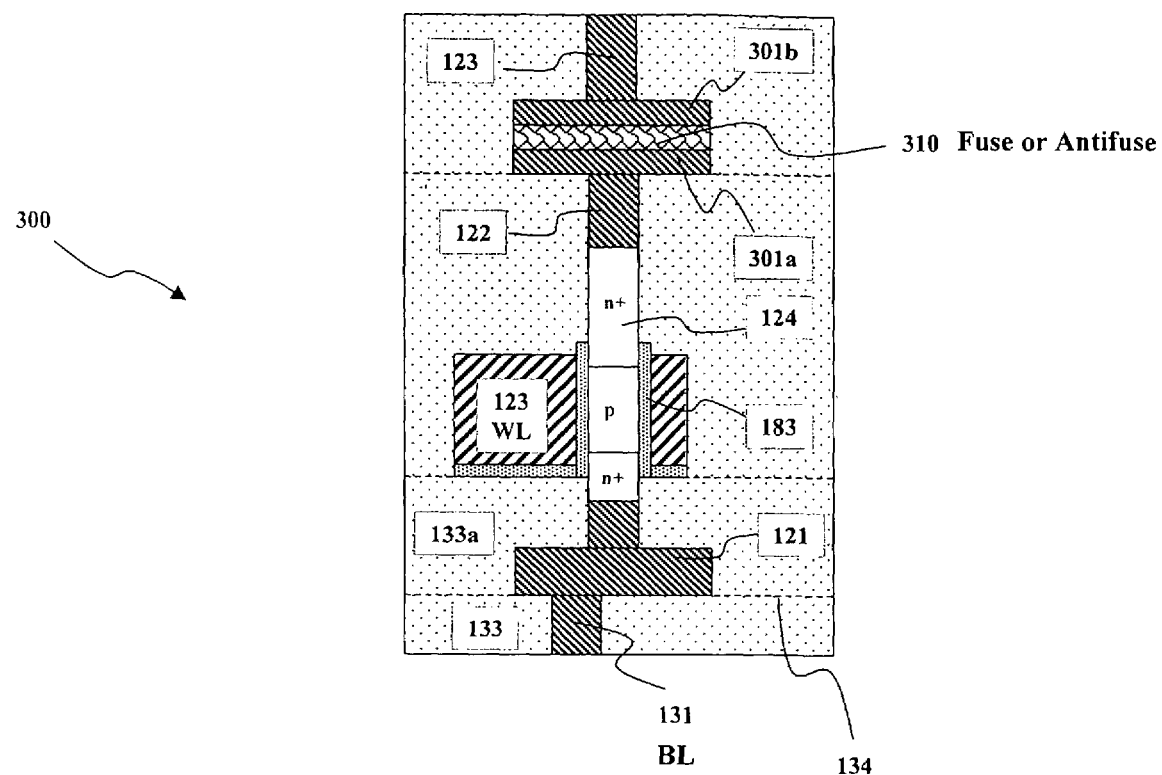
FIG. 25 is a cross-sectional view of an embodiment of the present invention that includes a vertically oriented NVM cell having a MOSFET disposed in the SOI layer that is serially connected a structure that depending on the material used may function either as a fuse or an antifuse.

FIG. 25 shows a Programmable Read-Only Memory (PROM) 300 cell structure using fuse or antifuse) layer 310 and a serially connected VFLD. In FIG. 25, the fuse (or antifuse) layer 310 is formed above FLD 124 after the FLD formation. Or, the fuse (or antifuse) layer 310 is formed below FLD 124 before the FLD formation. Antifuse layer 310 has high electric resistance. However, it could get low electric resistance if a high programming voltage/current is applied to the antifuse layer. The PROM is not reprogrammable in general.

The PROM can be used in an Application-Specific Integrated Circuit (ASIC), a Field Programmable Gate Array (FPGA), or a Programmable Logic Array (PLA).

The antifuse layer may be formed from an ONO layer, a metallic oxide layer, a chalcogenide layer, or an undoped amorphous silicon layer, but is not limited to these materials. The fuse layer may be formed from nichrome or polycrystalline silicon, but is not limited to these materials. Electrodes 301a, 301b for fuse or antifuse may be formed from TiW, which is stable at high temperature.

In FIG. 25, the VFLD may be a MOSFET, a bipolar transistor, a MESFET, or a diode.

Figure 26:
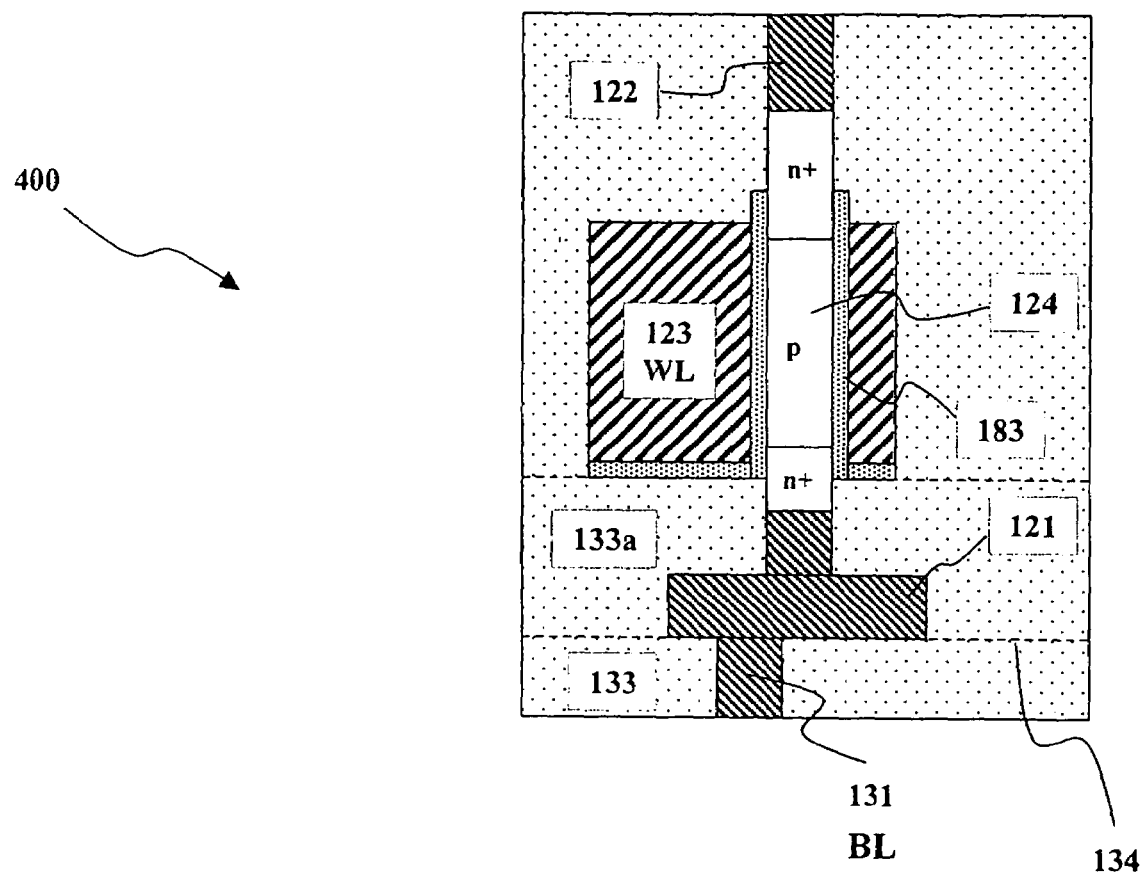
FIG. 26 is a cross-sectional view of an embodiment of the present invention that includes a vertical volatile memory cell having a MOSFET in the SOI layer without body contact.

FIG. 26 shows a DRAM 400 cell having only a VMFLD 124. VMFLD 124 using SOI layer has floating body p-region, as shown in FIG. 26, without applied bias, and charges could be accumulated in the floating body for a short time (i.e., refresh time). The charge becomes readable and writable data.

Figure 27A:
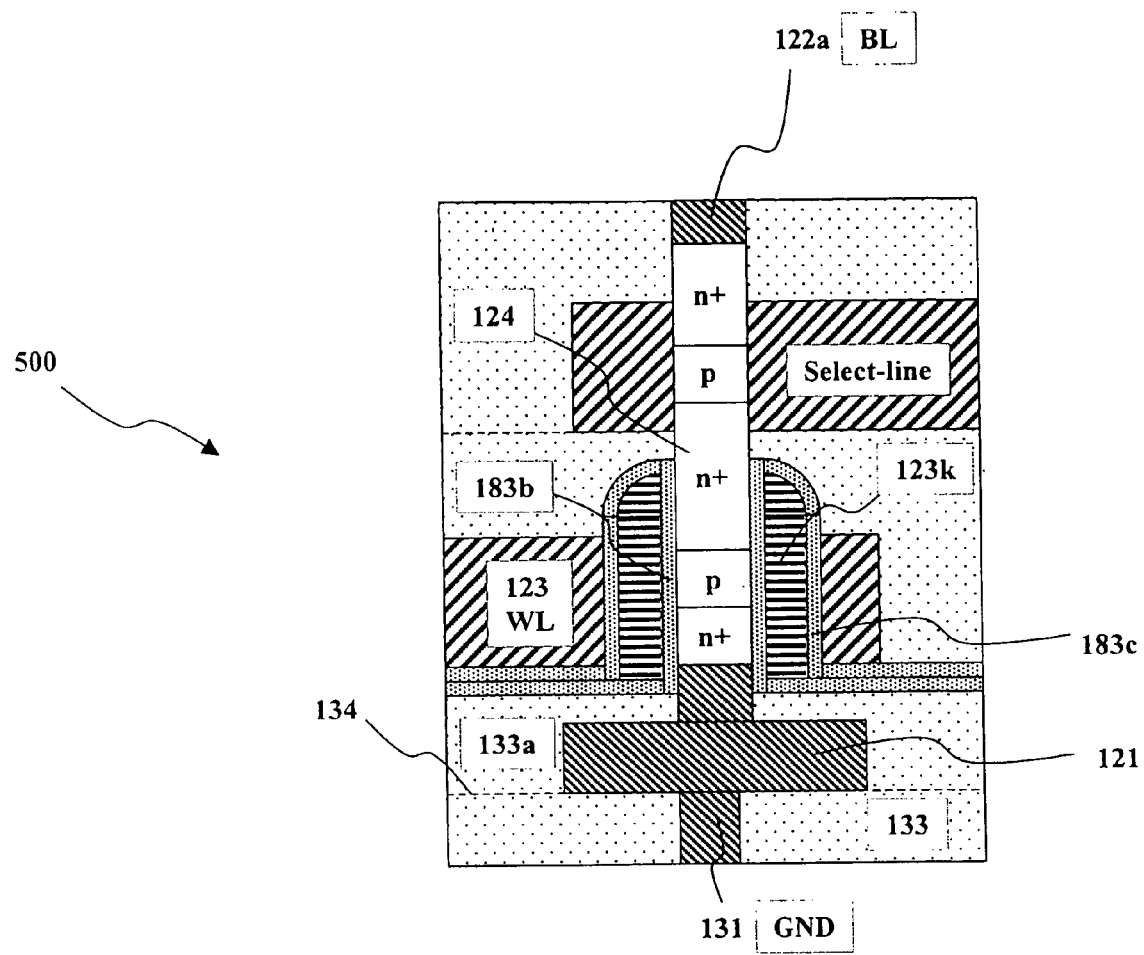

FIG. 27a shows an Electrically Erasable Programmable Read-Only Memory (EEPROM) 500 cell which has a VMFLD and a serially connected nonvolatile VMFLD memory. The nonvolatile memory has dual gates which are a floating gate and a control gate. However, it could be a Silicon Oxide Nitride Oxide Silicon (SONOS) type nonvolatile memory. In FIG. 27a, the MOSFET, which is coupled to the select line as shown, is disposed above the nonvolatile memory. However, the location of these devices could be reversed.

Figure 27B:
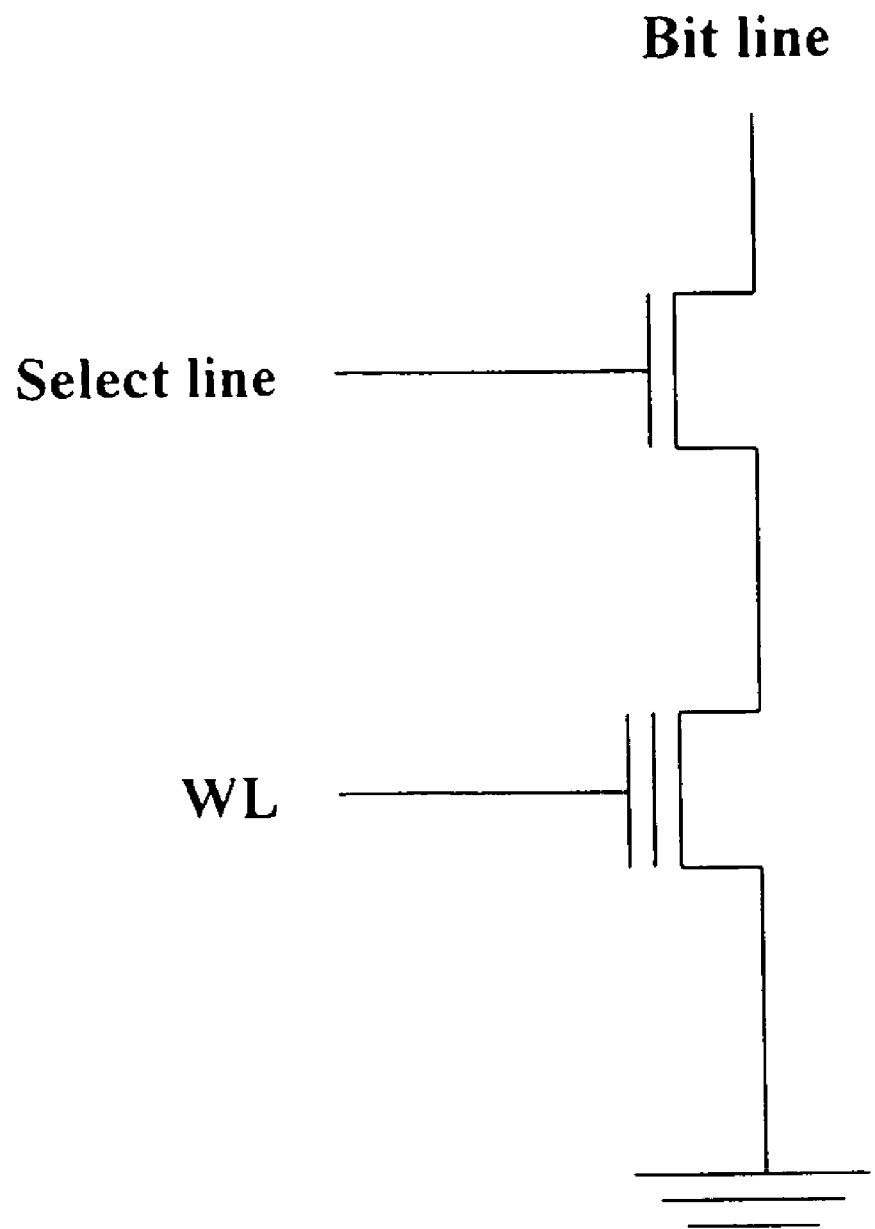

FIG. 27b shows an equivalent circuit of the one EEPROM cell.

Figure 28:
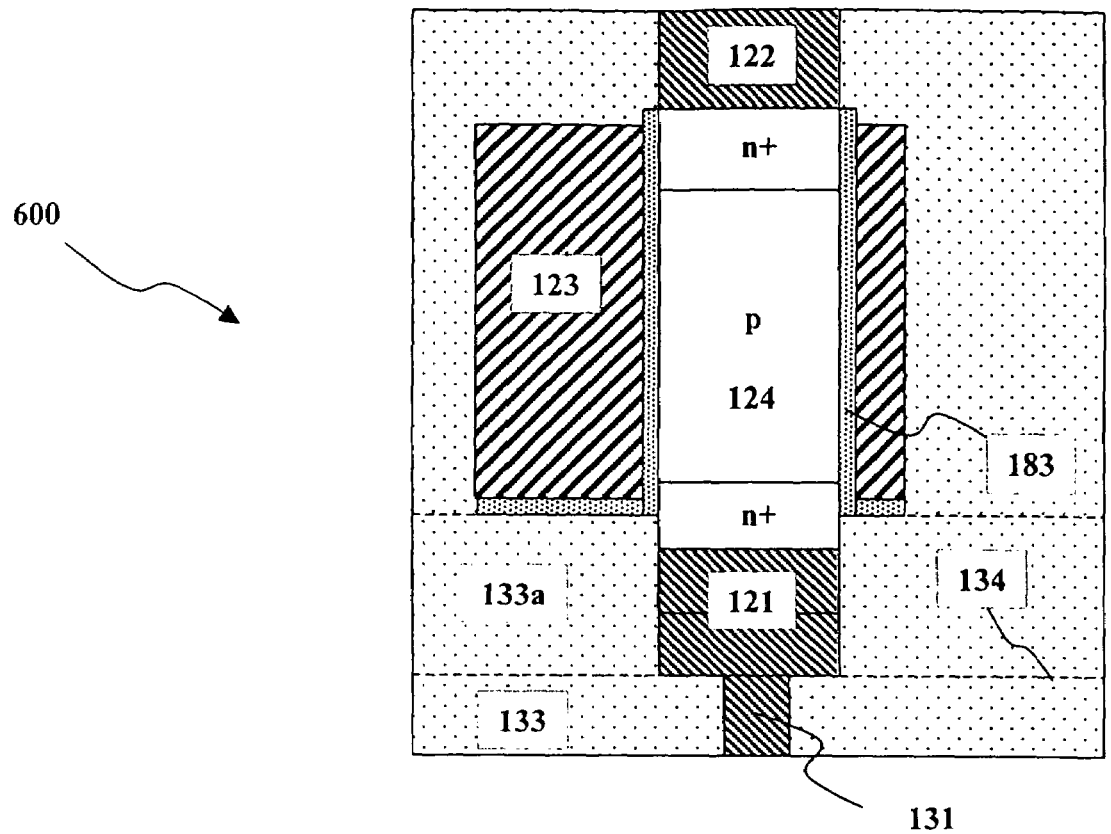
FIG. 28 is a cross-sectional view of an embodiment of the present invention that includes a high voltage MOSFET disposed in the SOI layer.

FIG. 28 is power VMFLD 600 which is operating at high voltage. Compared to conventional low power VMFLD, the power VMFLD could have from few micrometer to few hundred micrometer range SOI layer thickness and gate dielectric layer thickness may have from tenth of nanometer to few thousands nanometer range. Operation voltage could be from 7 volts to 1000 volts range. Also the FLD may have a trapezoidal shape which help extension of depletion region and reduction of electric field, and therefore increasing operation voltage.

Power VMFLD 600 has many advantages over horizontal MOSFET. Conventional horizontal MOSFET needs to have long channel length in order to increase operation voltage. However, it causes high cost due to low integration density. However, channel length of power VMFLD 600 dose not change integration density because channel length is determined by vertical height of the SOI layer. Also, because the power VMFLD has surrounding gate, it has low on resistance and its current driving capability is more than twice of conventional horizontal MOSFET. Therefore, the power VMFLD of FIG. 28 may replace other conventional power devices, such as Lateral Double-Diffused MOS (LDMOS) and Trench MOS. Also, combining low voltage devices in the base substrate and power VMFLD into one chip, we could achieve SmartPower or SmartMOS chips that handle analog and digital signals in a chip.

Figure 29:
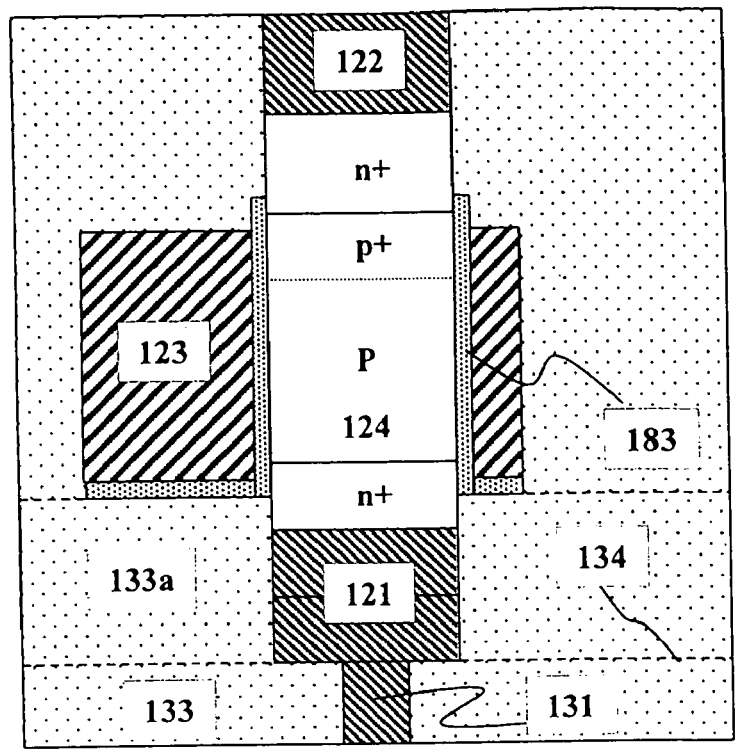
FIG. 29 is a cross-sectional view of an embodiment of the present invention that includes a high voltage MOSFET disposed in the SOI layer, the high voltage MOSFET having a low doped channel region.

If the power VMFLD in FIG. 28 has a double-diffused drain, then it becomes the device shown in FIG. 29. The double-diffused region prevents the expansion of a depletion region to the heavily doped drain region and helps device operate at high voltage.

In FIGS. 28 and 29, if the gate dielectric layer has a combination of "low temperature thermal oxide, high-k dielectric, and CVD dielectric, then device reliability increases, and the interface trap in between semiconductor 124 and gate dielectric layer 183 decreases. Also, current driving capability increases and on-resistance decreases.

Conclusion

It is to be understood that the present invention is not limited to the embodiments described above, but encompasses any and all embodiments within the scope of the subjoined claims.

What is claimed is:

1. A method of forming a semiconductor structure, comprising:
    providing a substrate having electrical devices formed therein, and further having at least one dielectric layer and at least one interconnect layer disposed above the substrate;
    providing a first stackable add-on layer, the first stackable add-on layer including a plurality of vertically oriented semiconductor devices disposed within the first stackable add-on layer, the plurality of vertically oriented semiconductor devices separated from each other by dielectric material; and
    attaching the stackable add-on layer to a layer of the substrate that is the greatest distance from the substrate as measured from the bottom surface of the substrate.

2. The method of claim 1, wherein the plurality of vertically oriented semiconductor devices includes at least one n-p-n stack.

3. The method of claim 2, further comprising forming a gate dielectric on the n-p-n stack, and forming a gate electrode on the gate dielectric.

4. The method of claim 3, wherein the gate electrode is disposed on the gate dielectric such that it is adjacent at least a p region of the n-p-n stack so as to form an n-type MOSFET.

5. The method of claim 1, wherein the plurality of vertically oriented semiconductor devices includes at least one p-n-p stack.

6. The method of claim 5, further comprising forming a gate dielectric on the p-n-p stack, and forming a gate electrode on the gate dielectric.

7. The method of claim 6, wherein the gate electrode is disposed on the gate dielectric such that it is adjacent at least an n region of the p-n-p stack so as to form a p-type MOSFET.

8. The method of claim 1, wherein the plurality of vertically oriented semiconductor devices includes at least one floating gate non-volatile memory device.

9. The method of claim 8, wherein a vertically oriented erase gate is disposed adjacent the at least one floating gate non-volatile memory device.

10. The method of claim 1, further comprising attaching a second stackable add-on layer above the first stackable add-on layer.

* * * * *